(12) United States Patent
Zilkie et al.

(10) Patent No.: US 12,313,878 B2
(45) Date of Patent: May 27, 2025

(54) OPTOELECTRONIC DEVICE AND METHOD OF MANUFACTURE THEREOF

(71) Applicant: ROCKLEY PHOTONICS LIMITED, Altrincham (GB)

(72) Inventors: Aaron John Zilkie, Pasadena, CA (US); Henri Nykänen, Espoo (FI); Frank Peters, Dublin (IE); Charles Su-Chang Tsai, Pasadena, CA (US); Guomin Yu, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 206 days.

(21) Appl. No.: 18/009,084

(22) PCT Filed: Jun. 9, 2021

(86) PCT No.: PCT/EP2021/065463
§ 371 (c)(1),
(2) Date: Dec. 8, 2022

(87) PCT Pub. No.: WO2021/250098
PCT Pub. Date: Dec. 16, 2021

(65) Prior Publication Data
US 2023/0251419 A1    Aug. 10, 2023

Related U.S. Application Data

(60) Provisional application No. 63/094,857, filed on Oct. 21, 2020.

(30) Foreign Application Priority Data

Jun. 9, 2020  (GB) ..................................... 2008698
Jun. 9, 2020  (GB) ..................................... 2008722
(Continued)

(51) Int. Cl.
*G02B 6/12*    (2006.01)
*G02B 6/122*   (2006.01)
*G02B 6/136*   (2006.01)

(52) U.S. Cl.
CPC ......... *G02B 6/12004* (2013.01); *G02B 6/122* (2013.01); *G02B 6/136* (2013.01);
(Continued)

(58) Field of Classification Search
None
See application file for complete search history.

(56) References Cited

U.S. PATENT DOCUMENTS 6,888,989 B1   5/2005   Zhou et al.
10,197,730 B1  2/2019   Ngu et al.
(Continued)

FOREIGN PATENT DOCUMENTS

CN    109560462 A    4/2019
GB    2571269 A      8/2019
(Continued)

OTHER PUBLICATIONS

Duggan, S., "Regrowth-free Monolithic Vertical Integration of Passive and Active Waveguides", Integrated Photonics, PhD Thesis, University College Cork, Ireland, May 2, 2019, 171 pages.
(Continued)

*Primary Examiner* — Jerry Rahll
(74) *Attorney, Agent, or Firm* — Womble Bond Dickinson (US) LLP

(57) ABSTRACT

An optoelectronic device. The device comprises: a silicon-on-insulator platform, including a silicon waveguide, formed in a silicon device layer, a silicon substrate, and a cavity; a III-V semiconductor based device, located within the cavity of the silicon-on-insulator platform and containing a III-V semiconductor based waveguide which is
(Continued)

coupled to the silicon waveguide. A region of a bed of the cavity, located between the III-V semiconductor based device and the substrate, includes a patterned surface, which is configured to interact with an optical signal within the III-V semiconductor based waveguide of the III-V semiconductor based device.

19 Claims, 41 Drawing Sheets

(30) Foreign Application Priority Data

Jun. 9, 2020 (GB) .................................... 2008731
Jan. 29, 2021 (GB) .................................... 2101257

(52) U.S. Cl.
CPC .............. *G02B 2006/12061* (2013.01); *G02B 2006/12107* (2013.01); *G02B 2006/12161* (2013.01)

(56) References Cited

U.S. PATENT DOCUMENTS

| | | |
|---|---|---|
| 10,509,244 B1 | 12/2019 | Shank et al. |
| 2004/0245936 A1 | 12/2004 | Flower |
| 2010/0086255 A1 | 4/2010 | Ishizaka |
| 2011/0150024 A1 | 6/2011 | Dupont et al. |
| 2014/0321488 A1 | 10/2014 | Chen et al. |
| 2016/0211645 A1 | 7/2016 | Padullaparthi |
| 2016/0274319 A1* | 9/2016 | Krasulick .......... G02B 6/12004 |
| 2018/0057079 A1 | 3/2018 | Ono |
| 2018/0241176 A1 | 8/2018 | Abel et al. |
| 2018/0331500 A1 | 11/2018 | Cheung et al. |
| 2019/0140425 A1 | 5/2019 | Hahn et al. |
| 2019/0341744 A1 | 11/2019 | Chae |
| 2020/0041721 A1 | 2/2020 | Yu et al. |
| 2020/0076155 A1 | 3/2020 | Wu et al. |

FOREIGN PATENT DOCUMENTS

| | | |
|---|---|---|
| GB | 2586889 A | 3/2021 |
| GB | 2589092 A | 5/2021 |
| GB | 2589335 A | 6/2021 |
| WO | WO 2017/200620 A2 | 11/2017 |

OTHER PUBLICATIONS

International Search Report and Written Opinion of the International Searching Authority, mailed Sep. 13, 2021, corresponding to PCT/EP2021/065463, 17 pages.
Loi, R. et al., "Edge-Coupling of O-Band InP Etched-Facet Lasers to Polymer Waveguides on SOI by Micro-Transfer-Printing", IEEE Journal of Quantum Electronics, Dec. 9, 2019, 8 pages, vol. 56, No. 1, IEEE.
U.K. Intellectual Property Office Combined Search and Examination Report, dated Nov. 30, 2020, for Patent Application No. GB2008698.9, 7 pages.
U.K. Intellectual Property Office Combined Search and Examination Report, dated Nov. 26, 2020, for Patent Application No. GB2008722.7, 6 pages.
U.K. Intellectual Property Office Combined Search and Examination Report, dated Nov. 27, 2020, for Patent Application No. GB2008731.8, 6 pages.
U.K. Intellectual Property Office Combined Search and Examination Report, dated Jul. 16, 2021, for Patent Application No. GB2101257.0, 5 pages.
U.K. Intellectual Property Office Combined Search and Examination Report, dated Nov. 3, 2021, for Patent Application No. GB2108233.4, 8 pages.
U.K. Intellectual Property Office Examination Report, dated Aug. 30, 2022, for Patent Application No. GB2108233.4, 2 pages.
U.K. Intellectual Property Office Examination Report, dated Sep. 28, 2022, for Patent Application No. GB2008731.8, 3 pages.
U.K. Intellectual Property Office Search Report, dated Feb. 28, 2023, for Patent Application No. GB2008731.8, 3 pages.
U.K. Intellectual Property Office Search Report, dated Sep. 28, 2022, for Patent Application No. GB2008731.8, 3 pages.
Zhang, J. et al., "Micro-transfer-printed III-V-on-silicon C-band Distributed Bragg Reflector Laser", 2019, IEEE 16th International Conference on Group IV Photonics, Aug. 28, 2019, 2 pages, IEEE.
Zhang, J. et al., "Transfer-printing-based integration of a III-V-on-silicon distributed feedback laser", Optics Express, Mar. 27, 2018, pp. 8821-8830, vol. 26, No. 7, Optical Society of America.
International Preliminary Report on Patentability, International Application No. PCT/EP2021/065463, PCT/IB/373, dated Dec. 13, 2022, 9 pages.
Juvert Joan et al: "Integration of III-V light sources on a silicon photonics circuit by transfer printing", 2017 IEEE 14th International Conference On Group IV Photonics (GFP), IEEE, Aug. 23, 2017 (Aug. 23, 2017), pp. 171-172.
International Search Report and Written Opinion, International Application No. PCT/EP2021/065463, PCT/ISA/210, 12 pages.

\* cited by examiner

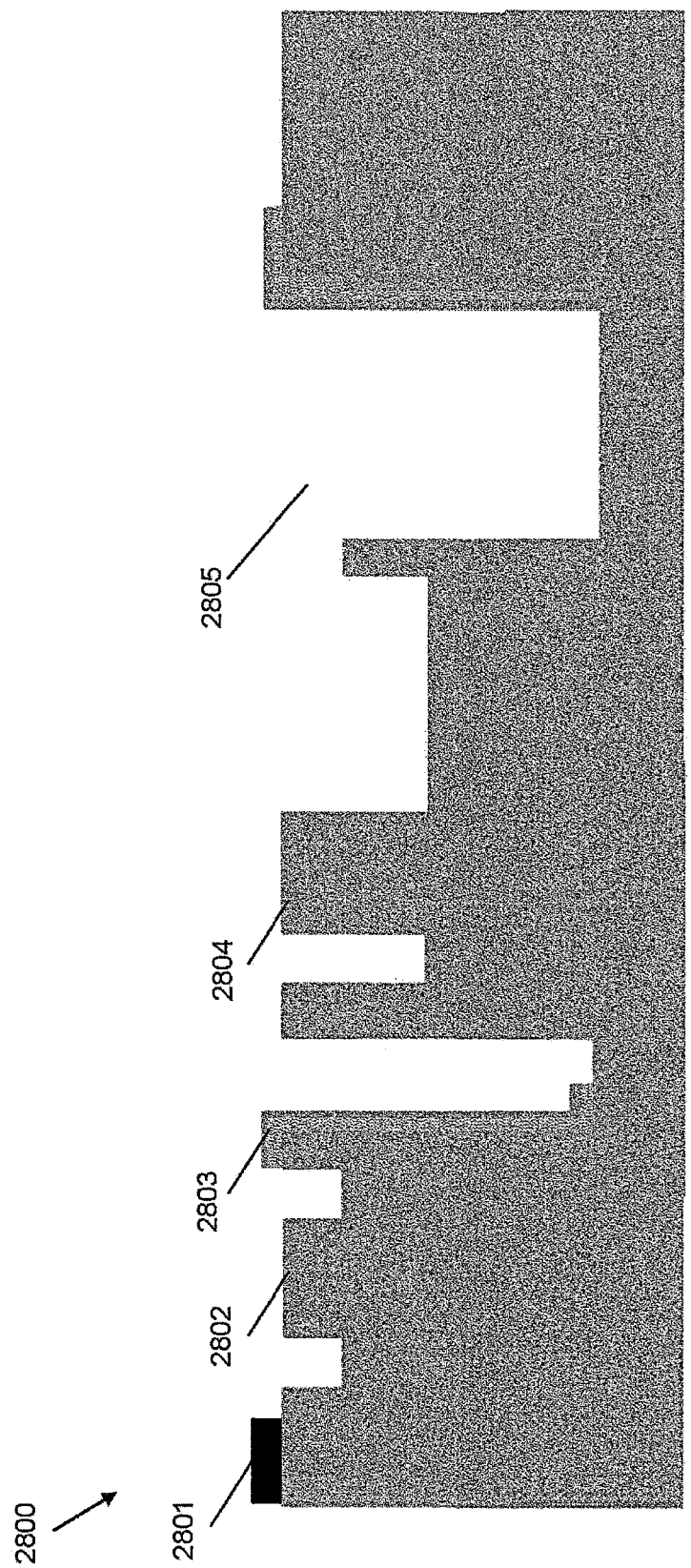

OPTOELECTRONIC DEVICE AND METHOD OF MANUFACTURE THEREOF

RELATED APPLICATIONS

This application is a 35 U.S.C. § 371 national phase application of PCT/EP2021/065463 (WO 2021/250098 A1), filed on Jun. 9, 2021, entitled "OPTOELECTRONIC DEVICE AND METHOD OF MANUFACTURE THEREOF", and claims priority to GB-2008722.7 filed on Jun. 9, 2020, GB-2008731.8 filed on Jun. 9, 2020; GB-2008698.9 filed on Jun. 9, 2020; U.S.-63/094,857 filed on Oct. 21, 2020; and GB-2101257.0 filed on Jan. 29, 2021 which are incorporated herein by reference in their entirety.

FIELD OF THE INVENTION

The present invention relates to an optoelectronic device and method of manufacture thereof.

BACKGROUND

Hybrid integration of III-V semiconductor based electro-optical devices (e.g. lasers, or modulators), with silicon-on-insulator (SOI) platforms confers the advantage of combining the best parts of both material systems.

However, conventional chip bonding processes typically use flip-chip bonding, in which the III-V semiconductor based device is inverted and bonded into a cavity on the SOI platform.

This manufacturing process can be costly and have a low yield, because of the metal bumping requirements for the die bonding and difficulties in accurately controlling the alignment of the respective components.

Micro-transfer printing (MTP) is therefore being investigated as an alternative way to integrate III-V semiconductor based devices within SOI wafer. In these methods, the III-V semiconductor based device can be printed into a cavity on the SOI in the same orientation in which it was manufactured and without the need for metal bumping. The alignment between the III-V semiconductor based waveguide and the SOI waveguide is thereby predetermined in the vertical direction (z direction). The requirements for alignment are therefore reduced from three dimension to two, which can be more easily facilitated.

There is a desire to expand the number of electro-optically active components which are suitable for MTP, and also to decrease the required footprint for these devices.

In particular, it is desired to provide distributed feedback (DFB) lasing devices, as they provide stable and mode-hop free operation. However these can be costly to produce and existing techniques provide a limited yield due to the complicated fabrication processes involved, in particular associated with the need to include a grating in the III-V semiconductor device.

Further, there is a desire to generally increase the optical efficiency of optoelectronic devices fabricated through MTP processes, and include efficient thermal management and control.

SUMMARY

Accordingly, in a first aspect, embodiments of the invention provide an optoelectronic device, comprising:
a silicon-on-insulator platform, including a silicon waveguide formed in a silicon device layer, a silicon substrate, and a cavity;
a III-V semiconductor based device, located within the cavity of the silicon-on-insulator platform, and containing a III-V semiconductor based waveguide which is optically coupled to the silicon waveguide;
wherein a region of a bed of the cavity, located between the III-V semiconductor based device and the substrate, includes a patterned surface, which is configured to interact with an optical signal within the III-V semiconductor based waveguide of the III-V semiconductor based device.

Such an optoelectronic device can be fabricated for a relatively low cost, and at relatively high volumes. Moreover, the optoelectronic device is thinner and more compact than those known previously and can be planar to the wafer surface. Further, coupling losses between the III-V semiconductor based waveguide and the silicon waveguide can be minimised.

Optional features of the invention will now be set out. These are applicable singly or in any combination with any aspect of the invention.

The patterned surface may be formed in the bed of the cavity, i.e. directly into the bed of the cavity. The patterned surface may be adjacent to, and extend along, the III-V semiconductor based waveguide. In some examples, the III-V semiconductor based waveguide may have a surface facing the bed of the cavity and the patterned surface may share the same geometry as the surface of the waveguide facing the bed. In other examples, the patterned surface may be wider than a width of the III-V semiconductor based waveguide, and may have a length either equal to a length of the III-V semiconductor based waveguide, or shorter than the length of the III-V semiconductor based waveguide. Examples where the length is shorter than the length of the III-V semiconductor based waveguide are generally more stable with respect to back reflection.

By III-V semiconductor based device, it may be meant an optically active device which comprises one or more III-V semiconductors, or an optically active device which is entirely formed from III-V semiconductors. By optically coupled, it may be meant that the light contained within the silicon waveguide can transfer to the III-V semiconductor based waveguide.

The patterned surface may be formed within the silicon device layer, which may form the bed of the cavity. In such examples, a portion of a region of the silicon device layer may have been etched away so as to provide the cavity within which the III-V semiconductor based device is located. The remaining silicon device layer may be bounded on one side by a buried oxide layer, which is located between the silicon device layer and the silicon substrate.

The patterned surface may be formed within the silicon substrate, which may form the bed of the cavity. In such examples, the entirety of a region of the silicon device layer may have been etched away, as well as the entirety of a region of a buried oxide layer, so as to provide the cavity within which the III-V semiconductor based device is located. In another example, a region of porous silicon is formed within the silicon substrate in the cavity after the silicon device layer and buried oxide layer are removed, and the patterned surface may be formed within the porous silicon region on which the III-V semiconductor based device is located. In such examples, the porous silicon may function as a bottom cladding layer. The porous silicon region may have a refractive index lower than the silicon substrate. The refractive index may be tuneable by varying the porosity.

The patterned surface may be formed within a liner, which lines the bed of the cavity. The liner may be on top surface of BOX layer. The liner may be formed of a layer of different material to the silicon device layer. The liner may be formed of a nitride, for example silicon nitride. The thickness of the liner is typically chosen such that the optical mode coupling efficiency between the SOI waveguide and III-V semiconductor waveguide is optimal. A typical thickness of the liner is 250 nm+/−100 nm. The index of the liner is 3.2+/−0.1. The silicon nitride liner may be referred to as a high index silicon nitride and may line only the bed of the cavity. Alternatively the liner may be directly adjacent to the silicon substrate of the silicon-on-insulator cavity (when the BOX layer has been at least partially removed), and the liner may comprise multiple layers. For example, the liner may comprise 3 layers from the bottom to the top, the first layer is silicon nitride with a thickness of 180 nm+/−100 nm and index 2.28+/−0.05, the second layer is regular silicon oxide with a thickness of 220 nm+/−100 nm, and the third layer is the high index silicon nitride with a thickness of 250 nm+/−100 nm with index of 3.2+/−0.1. The total thickness of the first layer and the second layer may be equal or substantially equal to the thickness of the BOX layer. The patterned surface may be formed only in the third high index silicon nitride layer with the second silicon oxide layer as an etch stop layer. The first layer silicon nitride extends up sidewalls of the cavity to serve as anti-reflection coating (ARC) layer for the cavity facet, and optionally along an upper surface of the device layer. By providing the patterned surface in such a way, the thickness of the patterned surface can be more tightly controlled resulting in a higher yield.

The region of the bed of the cavity may include an intermediate structure, and the patterned surface may be provided on the intermediate structure. The intermediate structure may be located between the silicon-on-insulator platform and the III-V semiconductor based device. The intermediate structure may project from the region of the bed of the cavity, with the patterned surface contained in a surface distal from the bed of the cavity. The intermediate structure may be a silicon-on-insulator chip which is bonded to the bed of the cavity. Such an intermediate structure containing the patterned surface can avoid issues in patterning the surface of the cavity directly (such as challenges in topography).

The bed of the cavity may be formed of a dielectric, and the patterned surface may be formed within the dielectric. In such examples, either a portion or the entirety of a region of the silicon device layer may have been etched away, and subsequently the dielectric disposed within the resulting cavity. The sidewalls therefore may be provided, at least in part, by the silicon device layer, whilst the bed of the cavity is provided by the dielectric. The dielectric may be benzocyclobutene. By benzocyclobutene, it may be meant a polymer formed from benzocyclobutene. For example, the dielectric may be a BCB-based polymer dielectric.

The optoelectronic device may comprise one or more heaters, located within or on the bed of the cavity, and configured to tune an operating wavelength of the optoelectronic device. The heater may be a doped region of the bed of the cavity. The heater may be a metal strip, disposed on the bed of the cavity. The optoelectronic device may further comprise a heatsink structure, located within the bed of the cavity. The heatsink structure may be an epitaxial crystalline silicon structure. The heatsink structure may extend from the silicon device layer through a buried oxide layer to contact the silicon substrate. The heatsink structure may be formed from silicon, or metal (for example titanium or titanium nitride).

A temperature sensor may be located in the optoelectronic device. The temperature sensor may comprise one or more silicon PN junctions. These may be fabricated, for example, by ion implanting opposite ion species either in a region of the bed of the cavity or around the region of the bed of the cavity. The temperature sensor may be usable to monitor the or each heater's performance by providing close loop feedback.

The patterned surface may be a grating, and the grating and the III-V semiconductor based device may form a distributed feedback (DFB) or distributed Bragg reflector (DBR) laser. By including one or more heaters close to the grating, the III-V semiconductor based laser can be a tuneable distributed feedback or tuneable distributed Bragg reflector laser, or tuneable sampled grating distributed Bragg reflector laser. The grating may be a partial grating which extends only part way along the III-V semiconductor based device, the III-V semiconductor based device being a laser. Such a partial grating can operate to enhance the spectral purity in the laser by blending the best spectral characteristics of a distributed feedback laser and Fabry-Perot laser. A distributed feedback laser, with uniform grating throughout the laser cavity, can provide a single frequency output only under a narrow range of phase conditions at the rear facet. A Fabry-Perot laser provides uniform power output regardless of phase condition at the rear facet. With a partial-grating type distributed feedback laser, the laser cavity portion without a grating allows wide-range of phase conditions at rear facet where the laser will provide single frequency output. The patterned surface may comprise a first grating region and a second grating region, spaced in a guiding direction of the III-V semiconductor based waveguide by a non-grating region. The first grating region may have a depth, into which it extends into the bed of the cavity, which is less than that of a corresponding depth of the second grating region. The first grating region may be adjacent to the silicon waveguide. The second grating region may be at a position in the bed of the cavity which is on an opposing side of the first grating region to the silicon waveguide. The second grating may function as a broadband mirror. The III-V semiconductor based device may include a high reflectively facet on a side of the III-V semiconductor based device proximal to the second grating and distal to the first grating. The III-V semiconductor based device may include an antireflective facet on a side of the III-V semiconductor based device proximal to the first grating and distal to the second grating. In examples where the III-V semiconductor based device is a laser, there may be no oxide between the III-V semiconductor based device and the cavity.

The patterned surface may be a reflective pattern (e.g. highly reflective pattern), so as to confine an optical mode of the III-V semiconductor based waveguide to the III-V semiconductor based waveguide. The reflective pattern may be a grating having a grating period smaller than an operating wavelength of the optoelectronic device. In some examples, the operating wavelength of the optoelectronic device is 1310 nm and so the grating period is less than 1310 nm. The grating period may equal to the operating wavelength divided by twice the waveguide effective refractive index. The grating period may be between 150 nm and 300 nm inclusive.

The patterned surface may be a wave-guiding pattern. The wave-guiding pattern may comprise two regions having a first refractive index, the two regions being separated by a guiding region having a second refractive index, the first refractive index may be lower than the second refractive index. The III-V semiconductor based waveguide may be wider at one end than a width in a central region of the III-V semiconductor based waveguide, such that light travelling in the III-V semiconductor based waveguide towards the end of said waveguide is guided by the wave-guiding pattern.

In a second aspect, embodiments of the present invention provide a silicon-on-insulator platform, suitable for a micro transfer printing process used to fabricate an optoelectronic device, the silicon-on-insulator platform including;
a silicon waveguide; and
a cavity, a sidewall of which forms a connecting optical facet to the silicon waveguide;
wherein a region of a bed of the cavity includes a patterned surface, which is configured to interact with light within a III-V semiconductor based waveguide of a III-V semiconductor based device, when the III-V semiconductor based device is bonded to the cavity.

Integration of the silicon-on-insulator platform and a simpler III-V semiconductor based device without a grating results in an optoelectronic device which can be fabricated for a relatively low cost, and at relatively high volumes. Moreover, the resulting optoelectronic device fabricated with the micro transfer printing process is thinner and more compact than previous examples, allowing for relatively precise placement accuracy allowing for coupling losses between the III-V semiconductor based waveguide and the silicon waveguide can be minimised.

The silicon-on-insulator platform of the second aspect may have any one or, to the extent that they are compatible, any combination of the optional features of the silicon-on-insulator platform of the first aspect.

The patterned surface may be formed within the silicon device layer, which may form the bed of the cavity. In such examples, a portion of a region of the silicon device layer may have been etched away so as to provide the cavity within which the III-V semiconductor based device is located. The remaining silicon device layer may be bounded on one side by a buried oxide layer, which is located between the silicon device layer and the silicon substrate.

The patterned surface may be formed within the silicon substrate, which may form the bed of the cavity. In such example, the entirety of a region of the silicon device layer may have been etched away, as well as the entirety of a region of a buried oxide layer, so as to provide the cavity within which the III-V semiconductor based device is located. A region of porous silicon is formed within silicon substrate in the cavity after the silicon device layer and buried oxide layer are removed, and the patterned surface may be formed within the porous silicon region on which the III-V semiconductor based device is located. In such examples, the porous silicon may function as a bottom cladding layer. The porous silicon region may have a refractive index lower than the silicon substrate. The refractive index may be tuneable by varying the porosity.

The patterned surface may be formed within a liner, which lines the bed of the cavity. The liner may be on top surface of BOX layer. The liner may be formed of a layer of different material to the silicon device layer. The liner may be formed of a nitride, for example silicon nitride. The thickness of the liner is typically chosen such that the optical mode coupling efficiency between the SOI waveguide and III-V semiconductor waveguide is optimal. A typical thickness of the liner is 250 nm+/−100 nm. The index of the liner is 3.2+/−0.1. The silicon nitride liner may be referred to as a high index silicon nitride and may line only the bed of the cavity. Alternatively the liner may be directly adjacent to the silicon substrate of the silicon-on-insulator cavity (when the BOX layer has been at least partially removed), and the liner may comprise multiple layers. For example, the liner may comprise 3 layers from the bottom to the top, the first layer is silicon nitride with a thickness of 180 nm+/−100 nm and index 2.28+/−0.05, the second layer is regular silicon oxide with a thickness of 220 nm+/−100 nm, and the third layer is the high index silicon nitride with a thickness of 250 nm+/−100 nm with index of 3.2+/−0.1. The total thickness of the first layer and the second layer may be equal or substantially equal to the thickness of the BOX layer. The patterned surface may be formed only in the third high index silicon nitride layer with the second silicon oxide layer as an etch stop layer. The first layer silicon nitride extends up sidewalls of the cavity to serve as anti-reflection coating (ARC) layer for the cavity facet, and optionally along an upper surface of the device layer. By providing the patterned surface in such a way, the thickness of the patterned surface can be more tightly controlled resulting in a higher yield.

The region of the bed of the cavity may include an intermediate structure, and the patterned surface may be provided on the intermediate structure. The intermediate structure may be located between the silicon-on-insulator platform and the III-V semiconductor based device. The intermediate structure may project from the region of the bed of the cavity, with the patterned surface contained in a surface distal from the bed of the cavity. The intermediate structure may be a silicon-on-insulator chip which is bonded to the bed of the cavity The bed of the cavity may be formed of a dielectric, and the patterned surface may be formed within the dielectric. In such examples, either a portion or the entirety of a region of the silicon device layer may have been etched away, and subsequently the dielectric disposed within the resulting cavity. The sidewalls therefore may be provided, at least in part, by the silicon device layer, whilst the bed of the cavity is provided by the dielectric. The dielectric may be benzocyclobutene.

The silicon-on-insulator platform may include one or more heaters, located within or on the bed of the cavity, and configured to tune an operating wavelength of the optoelectronic device. The heater may be a doped region of the cavity. The heater may be a metal strip, disposed on the bed of the cavity. The silicon-on-insulator platform may include a heatsink structure, located within the bed of the cavity. The heatsink structure may be an epitaxial crystalline silicon structure. The heatsink structure may extend from the silicon device layer through a buried oxide layer to contact the silicon substrate. The heatsink structure may be formed from silicon, or metal (for example titanium or titanium nitride).

A temperature sensor may be located in the optoelectronic device. The temperature sensor may comprise one or more silicon PN junctions. These may be fabricated, for example, by ion implanting opposite ion species either in a region of the bed of the cavity or around the region of the bed of the cavity. The temperature sensor may be useable to monitor the or each heater's performance by providing close loop feedback.

The patterned surface may be a grating, suitable for use with a III-V semiconductor based distributed feedback or distributed Bragg reflector laser. By including one or more heaters close to the grating, the III-V semiconductor based laser can be a tuneable distributed feedback or tuneable distributed Bragg reflector laser, or tuneable sampled grating distributed Bragg reflector laser. The grating may be a partial grating which extends only part way along the III-V semiconductor based distributed feedback or distributed Bragg reflector laser. Such a partial grating can operate to enhance the spectral purity of the laser. A patterned surface may comprise a first grating region and a second grating region, spaced in a guiding direction of the III-V semiconductor based waveguide by a non-grating region. The first grating region may have a depth, into which it extends into the bed of the cavity, which is less than that of a corresponding depth of the second grating region. The first grating region may be adjacent to the silicon waveguide. The second grating region may be at a position in the bed of the cavity which is on an opposing side of the first grating region to the silicon waveguide.

The patterned surface may be a reflective pattern, so as to confine an optical mode of the III-V semiconductor based waveguide to the III-V semiconductor based waveguide when it is bonded to the cavity. The reflective grating may be a grating having a grating period smaller than an operating wavelength of the optoelectronic device. In some examples, the operating wavelength of the optoelectronic device is 1310 nm and so the grating spacing is less than 1310 nm. The grating period may equal to the operating wavelength divided by twice the wavelength effective refractive index. The grating period may be between 150 nm and 300 nm inclusive.

The patterned surface may be a wave-guiding pattern. The wave-guiding pattern may comprise two regions having a first refractive index, the two regions being separated by a guiding region having a second refractive index, the first refractive index may be lower than the second refractive index.

In a third aspect, embodiments of the invention provide a method of preparing a silicon-on-insulator platform for a micro transfer printing process, the silicon-on-insulator platform including a silicon waveguide and a cavity, adjacent to the silicon waveguide, wherein the method comprises the steps of:

etching a patterned surface into a region of a bed of the cavity, the patterned surface being configured to interact with light within a III-V semiconductor based waveguide of a III-V semiconductor based device when the III-V semiconductor based device is bonded to the cavity.

The resulting silicon-on-insulator platform can be integrated with a III-V semiconductor based device resulting in an optoelectronic device which can be fabricated for a relatively low cost, and at relatively high volumes. Moreover, the resulting optoelectronic device is more compact. Further, coupling losses between the III-V semiconductor based waveguide and the silicon waveguide can be minimised.

The method may have any one or, to the extent that they are compatible, any combination of the following optional features.

The etching step may be performed by either holographic lithography or electron-beam (E-beam) lithography.

The pattern etching step may be performed either before or after the cavity etching step.

The method may include a step of disposing a bonding layer on at least the bed of the cavity, and etching the patterned surface into the bonding layer. The bonding layer may be a dielectric layer. The dielectric layer may be formed of benzocyclobutene.

The method may include a step of disposing a liner, which lines the bed of the cavity, into the cavity, and etching the patterned surface into the liner. The liner may be a nitride. The liner may be formed of silicon nitride. The method may include a prior step of etching away a portion of the silicon-on-insulator platform to expose an insulator layer (e.g. buried oxide). The liner may be disposed on the exposed insulator layer. The liner may have a thickness of 250 nm+/−100 nm. By providing the patterned surface in such a way, the thickness of the patterned surface can be more tightly controlled resulting in a higher yield. The liner may comprise multiple layers, for example, the liner may comprise three layers from the bottom to the top, the first layer is silicon nitride with a thickness of 180 nm+/−100 nm and index 2.28+/−0.05, the second layer is regular silicon oxide with a thickness of 220 nm+/−100 nm, and the third layer is the high index silicon nitride with a thickness of 250 nm+/−100 nm with index of 3.2+/−0.1. The total thickness of the first layer and the second layer may be equal or substantially equal to the thickness of the BOX layer. The patterned surface may be formed only in the third high index silicon nitride layer with the second silicon oxide layer as an etch stop layer. The method may include a prior step of etching away a portion of the silicon-on-insulator platform to expose the substrate layer (e.g. silicon substrate). The liner may be disposed on the exposed silicon substrate. By providing the patterned surface in such a way, the thickness of the patterned surface can be more tightly controlled resulting in a higher yield.

In a fourth aspect, embodiments of the present invention provide a method of fabricating an optoelectronic device, comprising the steps of:

providing a silicon-on-insulator platform according to the second aspect;

providing a III-V semiconductor based device, including a III-V semiconductor based waveguide; and transfer printing the III-V semiconductor based device into the cavity of the silicon-on-insulator platform.

In a fifth aspect, embodiments of the present invention provide an optoelectronic device fabricated according to the method of the fourth aspect.

In a sixth aspect, embodiments of the present invention provide a silicon-on-insulator platform, suitable for a micro transfer printing process used to fabricate an optoelectronic device, the silicon-on-insulator platform including:

a silicon waveguide; and
a cavity, a sidewall of which forms a connecting optical facet to the silicon waveguide;
wherein a region of a bed of the cavity includes a heatsink structure.

The heatsink structure may extend from the region of the bed of the cavity, through an insulation layer of the silicon-on-insulator platform so as to contact a silicon substrate.

The heatsink structure may be formed from epitaxial crystalline silicon. The heatsink structure may be formed from titanium or titanium nitride.

The heatsink structure may be a via extending through the region of the bed of the cavity.

The silicon-on-insulator platform may comprise two heatsink structures, located on opposing sides of a bonding region in the bed of the cavity.

A bonding region in the bed of the cavity may include a patterned surface, which is configured to interact with light within a III-V semiconductor based waveguide of a III-V semiconductor based device, when the III-V semiconductor based device is bonded to the cavity.

The silicon-on-insulator platform may further comprise one or more heaters, on a region of the bed of the cavity.

A temperature sensor may be located in the optoelectronic device. The temperature sensor may comprise one or more silicon PN junctions. These may be fabricated, for example, by ion implanting opposite ion species either in a region of the bed of the cavity or around the region of the bed of the cavity. The temperature sensor may be usable to monitor the or each heater's performance by providing close loop feedback.

The one or more heaters may be located between the or each heatsink structure and a bonding region in the bed of the cavity to which a III-V semiconductor based device is to be bonded.

In a seventh aspect, embodiments of the invention provide an optoelectronic device comprising the silicon-on-insulator platform of the sixth aspect, and a III-V semiconductor based device bonded to the bed of the cavity.

In an eighth aspect, embodiments of the present invention provide a method of preparing a silicon-on-insulator platform for a micro transfer printing process, the silicon-on-insulator platform including a silicon waveguide and a cavity adjacent to the silicon waveguide, wherein the method comprises the step of:
  providing a heatsink structure in a bed of the cavity.

Providing the heatsink structure may include etching a portion of the bed, and growing the heatsink structure into the etched portion.

The etch may be performed to remove both a silicon-on-insulator layer and an insulating layer of the silicon-on-insulator platform, and the heatsink structure may be grown from a substrate of the silicon-on-insulator platform.

In a ninth aspect, embodiments of the invention provide a silicon-on-insulator platform, suitable for a micro transfer printing process used to fabricate an optoelectronic device, the silicon-on-insulator platform including:
  a silicon waveguide; and
  a cavity, a sidewall of which forms a connecting optical facet to the silicon waveguide;
  wherein one or more sidewalls of the cavity contain a thermally isolating cavity which extends from an upper surface of the silicon-on-insulator platform at least partially through the platform.

The or each cavity may extend through an insulator layer of the platform. The or each cavity may extend partially into a substrate of the platform.

Two opposing sidewalls of the cavity may contain thermally isolating cavities. Neither opposing sidewall of the cavity may contain a connecting optical facet.

The cavity may be rectangular, and the opposing sidewalls may be those on the longer side of the rectangular cavity.

Three of four sidewalls of the cavity may contain thermally isolating cavities.

The thermally isolating cavities may extend along a longitudinal axis of the cavity.

In a tenth aspect, embodiments of the invention provide an optoelectronic device, comprising the silicon-on-insulator platform of the ninth aspect, and a III-V semiconductor based device coupon bonded to the bed of the cavity.

In an eleventh aspect, embodiments of the invention provide a method of preparing a silicon-on-insulator platform for a micro transfer printing process, the silicon-on-insulator platform including a silicon waveguide and a cavity, adjacent to the silicon waveguide, wherein the method comprises the step of:
  providing one or more thermally isolating cavities in one or more sidewalls of the cavity.

Providing the one or more thermally isolating cavities in the one or more sidewalls of the cavity may include performing an etching step which extends at least through a silicon-on-insulator layer of the silicon-on-insulator platform. The etch may extend through an insulating layer of the silicon-on-insulator platform.

In an twelfth aspect, embodiments of the invention provide a silicon-on-insulator platform, suitable for a micro transfer printing process used to fabricate an optoelectronic device, the silicon-on-insulator platform including:
  a silicon waveguide; and
  a cavity, a sidewall of which forms a connecting optical facet to the silicon waveguide;
  wherein a region of a bed of the cavity includes one or more heaters.

The heater may be a doped portion of the bed of the cavity. The heater may be located within a bonding region of the bed of the cavity, to which a III-V semiconductor based device coupon can be bonded.

A temperature sensor may be located in the optoelectronic device. The temperature sensor may comprise one or more silicon PN junctions. These may be fabricated, for example, by ion implanting opposite ion species either in a region of the bed of the cavity or around the region of the bed of the cavity. The temperature sensor may be usable to monitor the or each heater's performance by providing close loop feedback.

The silicon-on-insulator platform may comprise a first heater and a second heater, located on respectively opposing sides of a bonding region of the bed of the cavity. The or each heater may be a metal strip located atop the bed of the cavity.

In a thirteenth aspect, embodiments of the present invention provide an optoelectronic device comprising the silicon-on-insulator of the twelfth aspect and a III-V semiconductor based device coupon bonded to the bed of the cavity.

In a fourteenth aspect, embodiments of the present invention provide a method of preparing silicon-on-insulator platform for a micro transfer printing process, the silicon-on-insulator platform including a silicon waveguide and a cavity adjacent to the silicon waveguide, wherein the method comprises the step of:
  providing a heater in a region of a bed of the cavity.

Providing the heater may include a step of doping the region of the bed of the cavity. The heater may be provided in a bonding region of the bed of the cavity.

Providing the heater may include a step of depositing a metal on the region of the bed of the cavity. The heater may be provided between a bonding region of the cavity and a sidewall of the cavity.

A temperature sensor may be located in the optoelectronic device. The temperature sensor may comprise one or more silicon PN junctions. These may be fabricated, for example, by ion implanting opposite ion species either in a region of the bed of the cavity or around the region of the bed of the cavity. The temperature sensor may be usable to monitor the heater's performance by providing close loop feedback.

In a fifteenth aspect, embodiments of the invention provide a III-V semiconductor based device coupon, suitable for use in a micro transfer printing process used to fabricate an optoelectronic device, the device coupon comprising a III-V semiconductor based waveguide, wherein
  the III-V semiconductor based waveguide has a width measured transversal to a guiding direction of the waveguide, the width of the III-V semiconductor based waveguide in a central region being smaller than the width of the III-V semiconductor based waveguide in one or both end regions of the waveguide.

Both end regions of the III-V semiconductor based waveguide may be wider than the central region of the III-V semiconductor based waveguide. The central region of the III-V semiconductor based waveguide may be zero, i.e. the end regions of the waveguide taper to nothing in a central region.

A position of an optical mode within the III-V semiconductor based waveguide may vary along its guiding direction. The optical mode of the III-V semiconductor based waveguide in the central region may be offset relative to the optical mode in one or both end regions of the waveguide. The optical mode of the III-V semiconductor based waveguide in the central region may be closer to a base of the coupon than the optical mode in one or both end regions of the waveguide.

The III-V semiconductor based waveguide may comprise an active upper waveguide and a passive lower waveguide, the active upper waveguide being formed in at least one of the end regions of the waveguide and the passive lower waveguide being formed in at least the central region.

The III-V semiconductor based waveguide may comprise a passive upper waveguide and an active lower waveguide, the passive upper waveguide being formed in at least one of the end regions of the waveguide and the active lower waveguide being formed in at least the central region.

By active waveguide, it may be meant a waveguide comprising at least one electro-optically active region (e.g. a doped region, junction, etc.). By passive waveguide, it may be meant a waveguide comprising no electro-optically active region (e.g. formed in bulk from a single material, with no electrical contacts).

In a sixteenth aspect, embodiments of the present invention provide an optoelectronic device comprising:
- a silicon-on-insulator platform, including a silicon waveguide formed in a silicon device layer, a silicon substrate, and a cavity; and
- a III-V semiconductor based device, located within the cavity of the silicon-on-insulator platform and containing a III-V semiconductor based waveguide which is optically coupled to the silicon waveguide;
- wherein the III-V semiconductor based waveguide has a width measured transversal to a guiding direction of the waveguide, the width of the III-V semiconductor based waveguide in a central region being smaller than the width of the III-V semiconductor based waveguide in one or both end regions of the waveguide.

Advantageously, this can allow the degree of coupling between the optical mode in the III-V semiconductor based waveguide and the silicon substrate to be controlled. For example when the cavity contains a patterned surface, the degree of interaction between the patterned surface and the optical signal in the III-V semiconductor based waveguide can be controlled. Further, the optical mode in the III-V semiconductor based waveguide relative to the silicon waveguide can be optimised for coupling.

The silicon-on-insulator platform may include an upper and lower silicon device layer, separated by a buried oxide layer. The lower silicon device layer may be closer to the silicon substrate than the upper silicon device layer. The silicon waveguide may be formed in the upper silicon device layer. The cavity may be formed in the lower silicon device layer, and may extend through the buried oxide layer and upper silicon device layer.

Both end regions of the III-V semiconductor based waveguide may be wider than the central region of the III-V semiconductor based waveguide.

A position of an optical mode within the III-V semiconductor based waveguide may vary along its guiding direction. The optical mode of the III-V semiconductor based waveguide in the central region may be offset relative to the optical mode in one or both end regions of the waveguide. The optical mode of the III-V semiconductor based waveguide in the central region may be closer to the silicon substrate than the optical mode in one or both end regions of the waveguide.

The III-V semiconductor based waveguide may comprise an active upper waveguide and a passive lower waveguide, the active upper waveguide being formed in at least one of the end regions of the waveguide, and the passive lower waveguide being formed in at least the central region.

The III-V semiconductor based waveguide may comprise a passive upper waveguide and an active lower waveguide, the passive upper waveguide being formed in at least one of the end regions of the waveguide and the active lower waveguide being formed in at least the central region.

The optoelectronic device may further comprise a bridge-waveguide, located between the silicon waveguide and the III-V semiconductor based waveguide. The bridge-waveguide may comprise one or more anti-reflective coatings. The bridge-waveguide may be formed of either a dielectric, e.g. benzocyclobutene, or amorphous silicon, and the anti-reflective coatings may be formed of silicon nitride.

A region of a bed of the cavity may include a patterned surface, which is configured to interact with light within the III-V semiconductor based waveguide.

The patterned surface may be a wave-guiding pattern. The wave-guiding pattern may comprise two regions having a first index, the two regions being separated by a guiding region having a second refractive index, the first refractive index being lower than the second refractive index.

In a seventeenth aspect, embodiments of the present invention provide a method of fabrication of an optoelectronic device, comprising the step of bonding the silicon-on-insulator platform of any of the above aspects with a III-V semiconductor based device coupon or the III-V semiconductor based device coupon of any of the above aspects.

In an eighteenth aspect, embodiments of the present invention provide a method of preparing a silicon-on-insulator platform for a micro transfer printing process, the silicon-on-insulator platform including a silicon waveguide and a cavity, adjacent to the silicon waveguide, wherein the method comprises the step of:
- depositing an intermediate structure onto a region of a bed of the cavity, the intermediate structure including a patterned surface, the patterned surface being configured to interact with an optical signal within a III-V semiconductor based waveguide of a III-V semiconductor based device when the III-V semiconductor based device is bonded to the cavity.

The optional features set out herein with reference to the aspects of the invention are applicable to any other aspect where such a combination is not obviously incompatible or has been expressly forbidden.

Further aspects of the present invention provide: a computer program comprising code which, when run on a computer, causes the computer to perform the method of any one of the third, fourth, eighth, fourteenth, seventeenth, and eighteenth aspect; a computer readable medium storing a computer program comprising code which, when run on a computer, causes the computer to perform the method of any one of the third, fourth, eighth, fourteenth, seventeenth, and eighteenth aspect; and a computer system programmed to perform the method of any one of the third, fourth, eighth, fourteenth, seventeenth, and eighteenth aspect.

BRIEF DESCRIPTION OF THE DRAWINGS

Embodiments of the invention will now be described by way of example with reference to the accompanying drawings in which:

FIGS. 28A-28C are cross-sectional views of a variant method resulting in a variant silicon-on-insulator platform being integrated with a III-V device coupon;

DETAILED DESCRIPTION AND FURTHER OPTIONAL FEATURES

Aspects and embodiments of the present invention will now be discussed with reference to the accompanying figures. Further aspects and embodiments will be apparent to those skilled in the art.

Figure 1A:
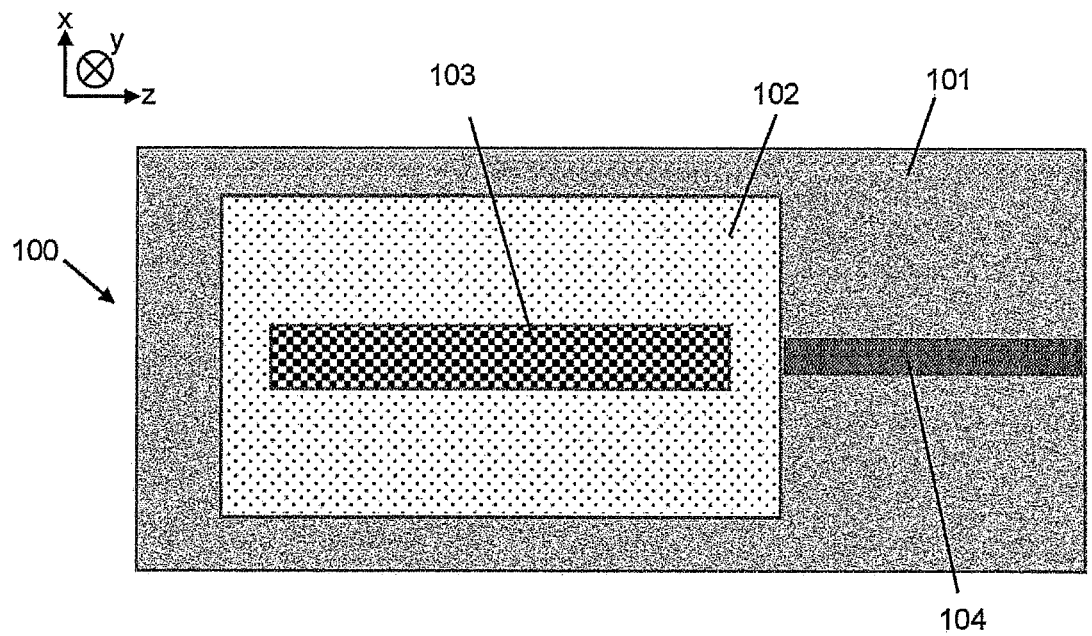
FIG. 1A shows a top-down view of a silicon-on-insulator platform.

FIG. 1A shows a top-down view of a silicon-on-insulator platform 100. The platform includes a silicon device layer 101, and a cavity 102 formed in the silicon device layer. A patterned surface 103 is provided in a bed of the cavity. A silicon waveguide 104, formed from or positioned atop the silicon device layer 101 is coupled to the cavity. A connecting facet of the silicon waveguide may form a portion of a sidewall of the cavity.

Figure 1B:
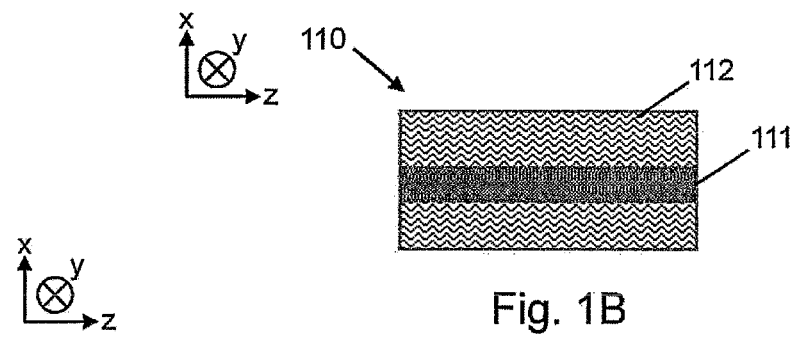
FIG. 1B shows a top-down view of a III-V device coupon.

FIG. 1B shows a top-down view of a III-V device coupon 110. Broadly, the device coupon comprises a waveguide rib or ridge, 111 and a waveguide slab 112 which together with the epitaxially defined active region of separate confinement heterostructure, SCH, region and other ancillary structures (not shown) provide the III-V semiconductor based waveguide. The waveguide slab 112 and SCH layer in some examples has a height, as measured from the patterned surface 103 to the rib or ridge 111 which is less than 1 µm. The bottom surface of the slab region is provided for bonding to the bed of the cavity. The device coupon may include further features, such as doped regions to provide p-n or p-i-n junctions which may extend vertically or horizontally across the waveguide. In some examples, electrodes which electrically contact to the n or p doped regions of the p-n or p-i-n junctions are provided in the device coupon 110. In other examples, the electrodes are provided in the silicon-on-insulator platform, and traces are used to connect the doped regions to the electrodes.

Figure 1C:
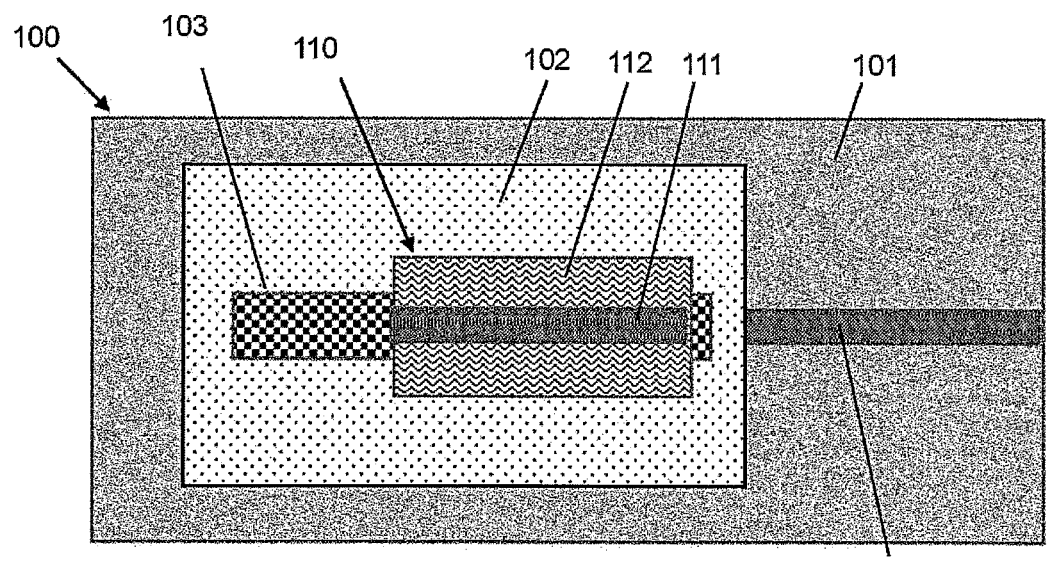
FIG. 1C shows a top-down view of the III-V device coupon of FIG. 1B integrated with the silicon-on-insulator platform of FIG. 1B.

FIG. 1C shows a top-down view of the III-V device coupon of FIG. 1B integrated with the silicon-on-insulator platform of FIG. 1B. The device coupon 110 sits atop at least a portion of the patterned surface 103, within the cavity 102. The rib or ridge 111 is aligned with the silicon waveguide 104. Whilst a gap is shown between the rib or ridge 111 of the III-V semiconductor based waveguide and the silicon waveguide 104, in some examples there is no or substantially no gap. In yet further examples, a gap is present which is subsequently filled by a bridge-waveguide (for example formed from amorphous silicon) or a bridge material (for example a dielectric such as benzocyclobutene).

Figure 2A:
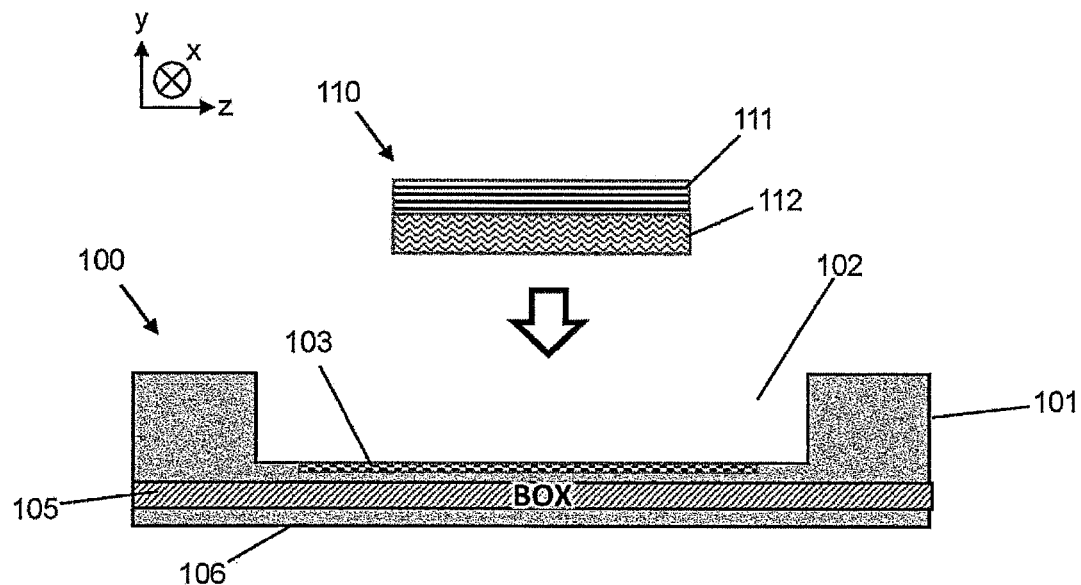
FIG. 2A shows a side-on cross-sectional view of the III-V device coupon of FIG. 1B being integrated with the silicon-on-insulator platform of FIG. 1A.
Figure 2B:
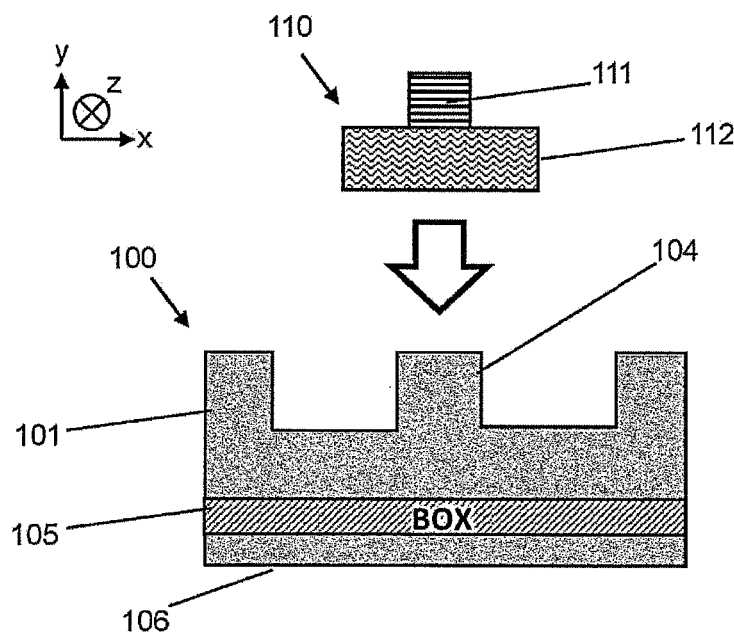
FIG. 2B shows an end-on cross-sectional view of the III-V device coupon of FIG. 1B being integrated with the silicon-on-insulator platform of FIG. 1A.

FIG. 2A shows a side-on view of the device coupon 110 of FIG. 1B being integrated with the silicon-on-insulator platform 100 of FIG. 1A. The coupon is positioned above the patterned surface 103 which, in this example, is formed in the silicon device layer. FIG. 2B shows an end-on view of the device coupon 110 of FIG. 1B being integrated with the silicon-on-insulator platform 100 of FIG. 1A. Of note, is the alignment between the waveguide rib or ridge 111 of the III-V semiconductor based waveguide which is or forms a part of the device coupon and the silicon waveguide 104 at one end of the cavity. FIGS. 2A and 2B also depict the detailed structure of the silicon-on-insulator platform 100. Notably, the platform comprises a silicon substrate 106, atop which is a buried oxide (BOX) layer 105. The buried oxide layer is, in this example, formed from silicon dioxide or silica. The silicon device layer is positioned on top of the buried oxide layer.

Figure 3A:
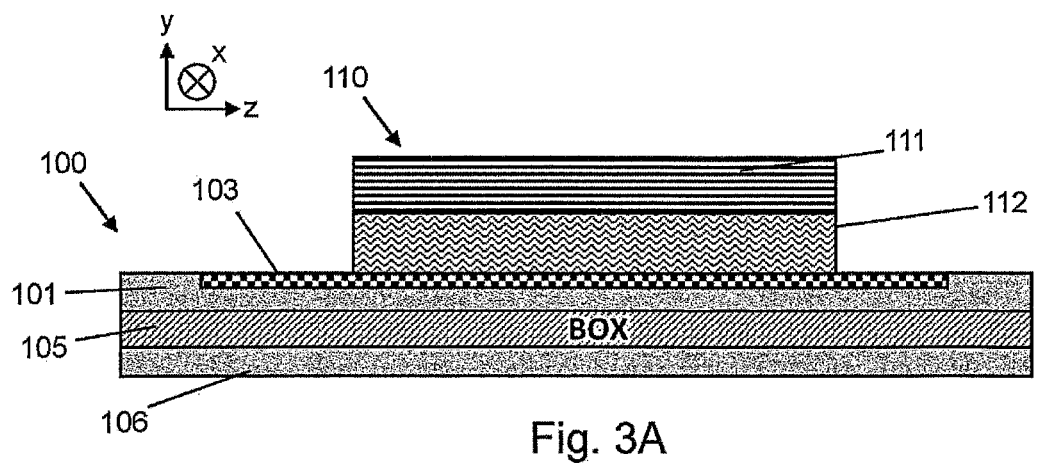
FIG. 3A shows a partial side-on cross-sectional view of the III-V device coupon of FIG. 1B after integration with the silicon-on-insulator platform of FIG. 1A.
Figure 3B:
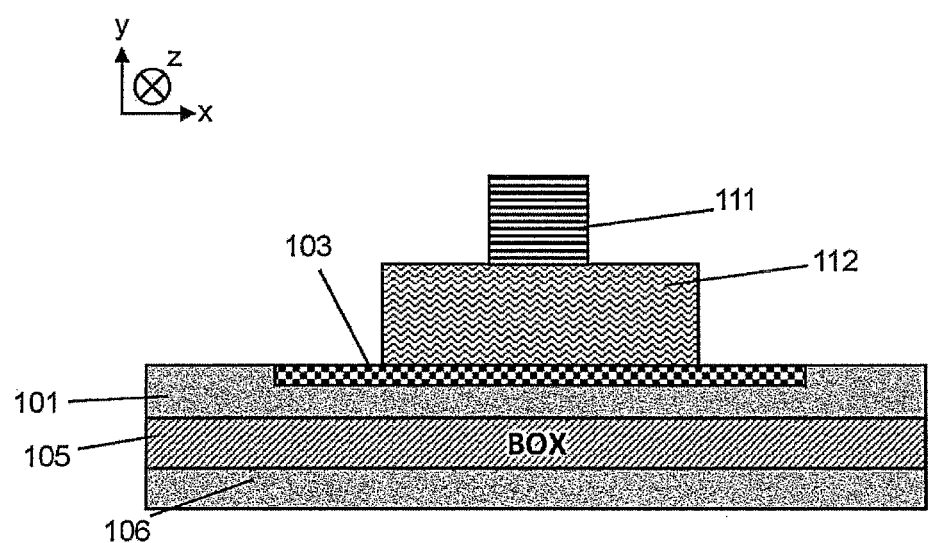
FIG. 3B shows a partial end-on cross-sectional view of the III-V device coupon of FIG. 1B after integration with the silicon-on-insulator platform of FIG. 1A.

FIG. 3A shows a partial side-on view of the device coupon 110 of FIG. 1B after integration with the silicon-on-insulator platform 100 of FIG. 1A. Notably, a bottom surface of the waveguide slab 112 is adjacent and bonded to the patterned surface 103. FIG. 3B shows a partial end-on view of the device coupon of FIG. 1B after integration with the silicon-on-insulator platform of FIG. 1A.

Figure 3C:
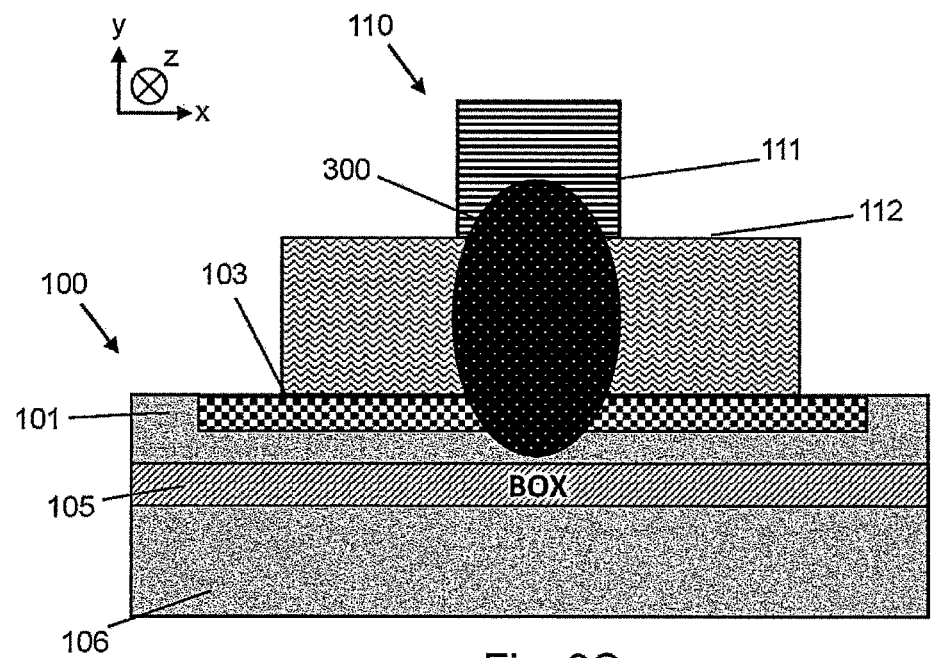
FIG. 3C shows a partial end-on cross-sectional view of the III-V device coupon of FIG. 1B after integration with the silicon-on-insulator platform of FIG. 1A including an optical mode supported by the III-V semiconductor based waveguide.

FIG. 3C shows a partial end-on cross-sectional view of the device coupon 110 of FIG. 1B after integration with the silicon-on-insulator platform 100 of FIG. 1A including an optical mode 300 supported by the III-V semiconductor based waveguide. The optical mode 300 exists chiefly within the waveguide slab 112. The waveguide rib or ridge 111 acts to provide lateral localization of the optical mode. Notably, in this example, the optical mode 300 extends into and interacts with the patterned surface 103.

Figure 4A:
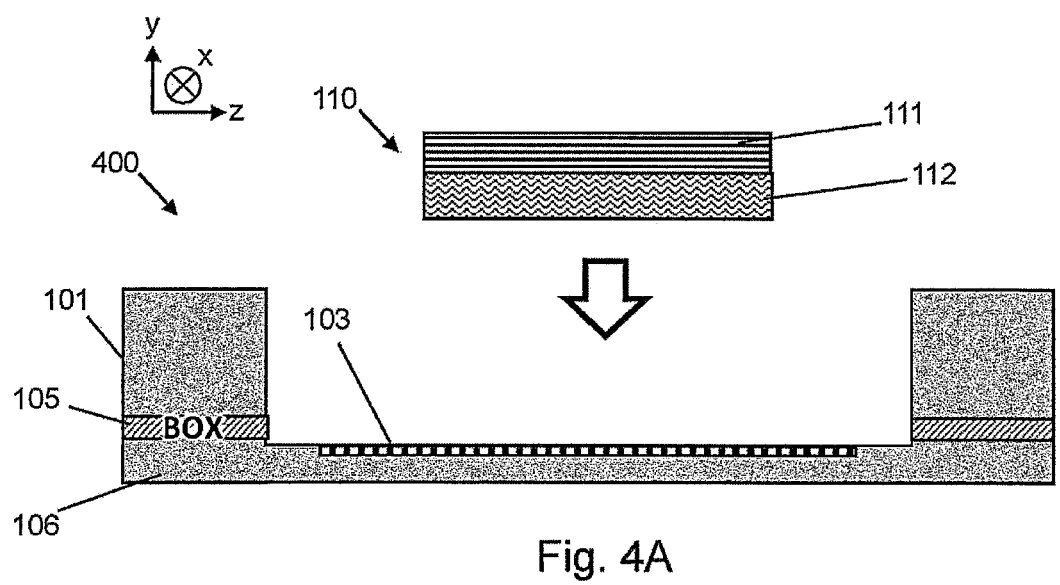
FIG. 4A shows a side-on cross-sectional view of the III-V device coupon of FIG. 1B being integrated with a variant silicon-on-insulator platform.
Figure 4B:
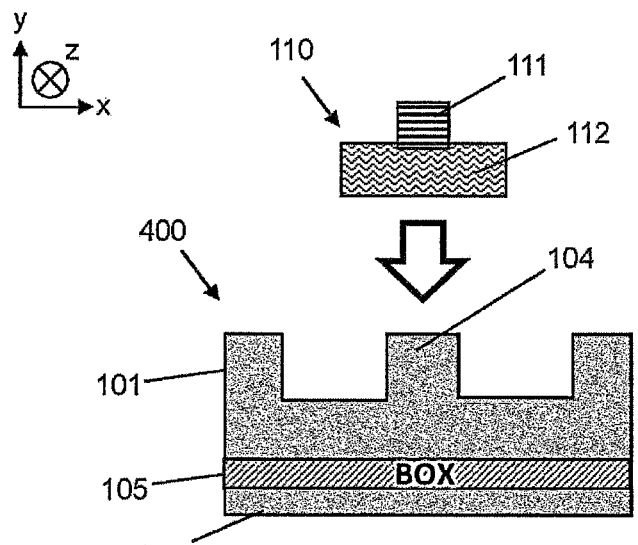
FIG. 4B shows an end-on cross-sectional view of the III-V device coupon of FIG. 1B being integrated with a variant silicon-on-insulator platform.
Figure 4C:
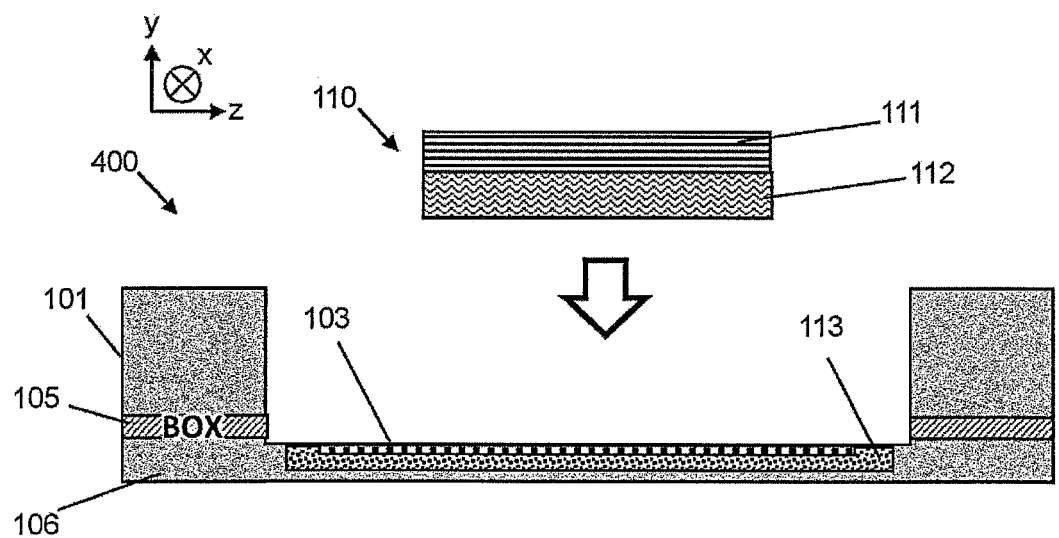
FIG. 4C shows a side-on cross-sectional view of the III-V device coupon of FIG. 1B being integrated with a variant silicon-on-insulator platform which includes porous silicon.

FIG. 4A shows a side-on cross-sectional view of the device coupon 110 of FIG. 1B being integrated with a variant silicon-on-insulator platform 400. Where the coupon and platform share features with the examples discussed previously, like features are shown by like reference numerals. The variant silicon-on-insulator platform 400 differs from the platform 100 shown previously in that the patterned surface 103 is provided within the silicon substrate 106. In this example, the entirety of a region of the silicon device layer defining the cavity is etched away. Subsequently, the entirety of the buried oxide layer now exposed is also etched away, leaving the silicon substrate exposed. FIG. 4B shows an end-on cross-sectional view of the device coupon 110 of FIG. 1B being integrated with the variant silicon-on-insulator platform 400. FIG. 4C shows a side-on cross-sectional view of the device coupon 110 of FIG. 1B being integrated with a variant silicon-on-insulator platform 400 with porous silicon whose refractive index depends on its porosity and is less than that of silicon, therefore, the porous silicon behaviours like a bottom cladding layer for the patterned surface 103.

Figure 5A:
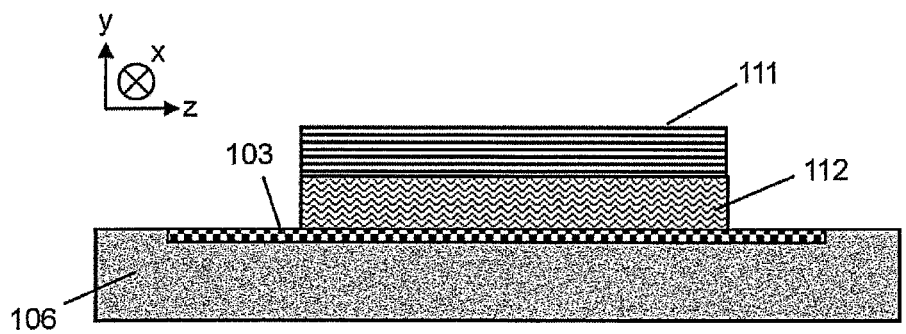
FIG. 5A shows a partial side-on cross-sectional view of the III-V device coupon of FIG. 1B after integration with the variant silicon-on-insulator platform of FIG. 4A.
Figure 5B:
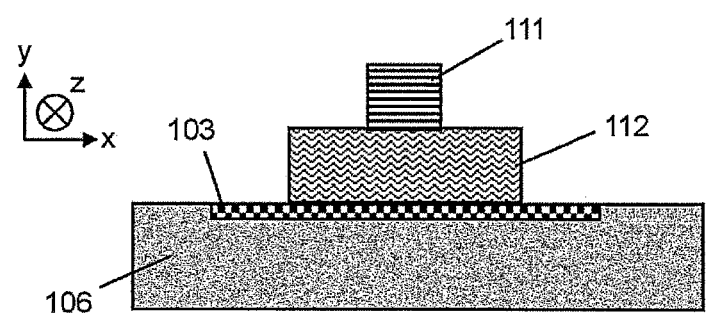
FIG. 5B shows a partial end-on cross-sectional view of the III-V device coupon of FIG. 1B after integration with the variant silicon-on-insulator platform of FIG. 4A.
Figure 5C:
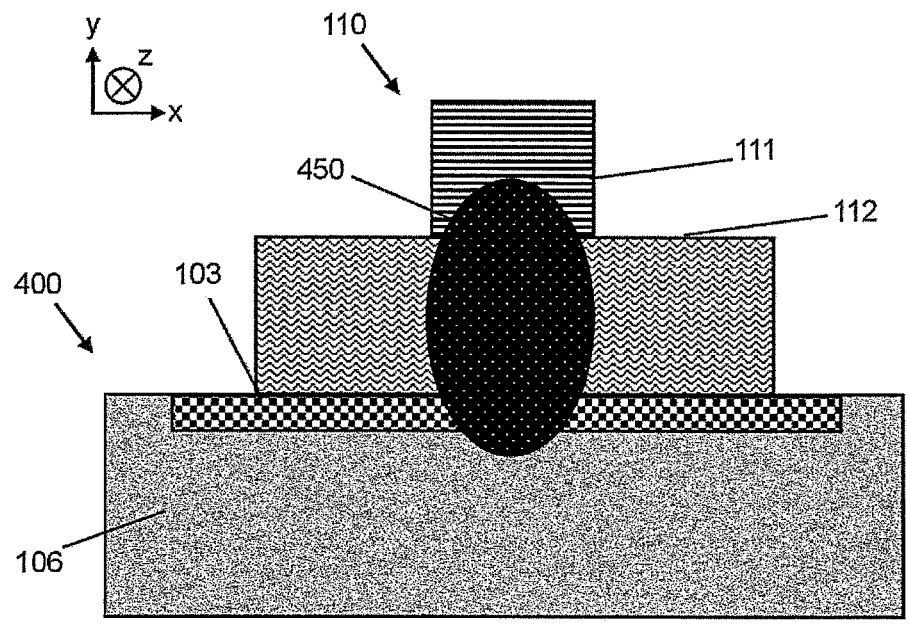
FIG. 5C shows a partial end-on cross-sectional view of the III-V device coupon of FIG. 1B after integration with the variant silicon-on-insulator platform of FIG. 4A including an optical mode supported by the III-V semiconductor based waveguide.
Figure 5D:
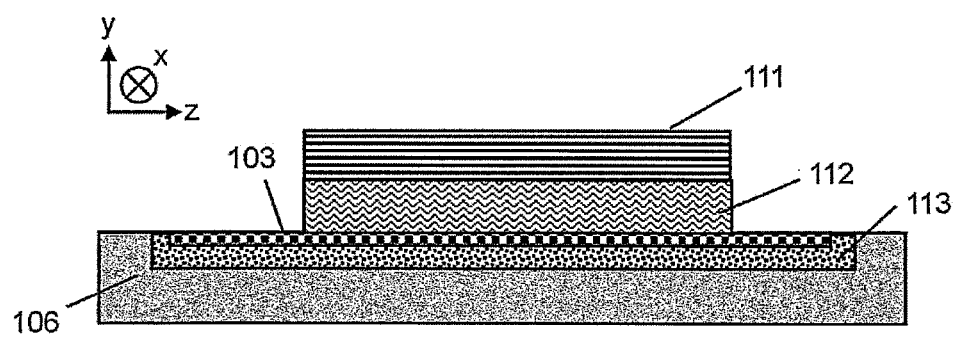
FIG. 5D shows a partial side-on cross-sectional view of the III-V device coupon of FIG. 1B after integration with the variant silicon-on-insulator platform of FIG. 4C.

FIG. 5A shows a partial side-on cross-sectional view of the device coupon of FIG. 1B after integration with the variant silicon-on-insulator platform of FIG. 4A. FIG. 5B shows a partial end-on cross-sectional view of the device coupon of FIG. 1B after integration with the variant silicon-on-insulator platform of FIG. 4A. As can be seen, the bottommost surface of the waveguide slab 112 is adjacent and bonded to the silicon substrate 106 which contains the patterned surface 103. FIG. 5C shows a partial end-on cross-sectional view of the III-V device coupon 110 of FIG. 1B after integration with the variant silicon-on-insulator platform 400 of FIG. 4A including an optical mode 450 supported by the III-V semiconductor based waveguide. The optical mode 400 exists chiefly within the waveguide slab 112. The waveguide rib or ridge 111 acts to provide lateral localization of the optical mode. Notably, in this example, the optical mode 400 extends into and interacts with the patterned surface 103. FIG. 5D shows a partial side-on cross-sectional view of the device coupon of FIG. 1B after integration with the variant silicon-on-insulator platform of FIG. 4C.

Figure 6A:
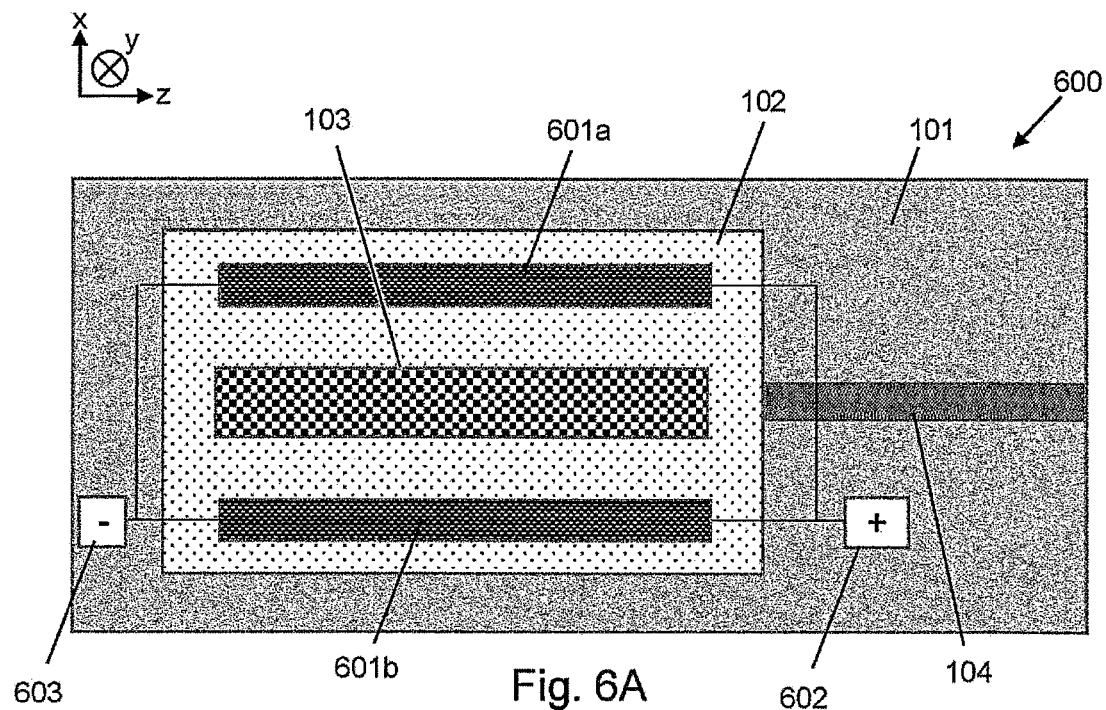
FIG. 6A shows a top-down view of a variant silicon-on-insulator platform.
Figure 6B:
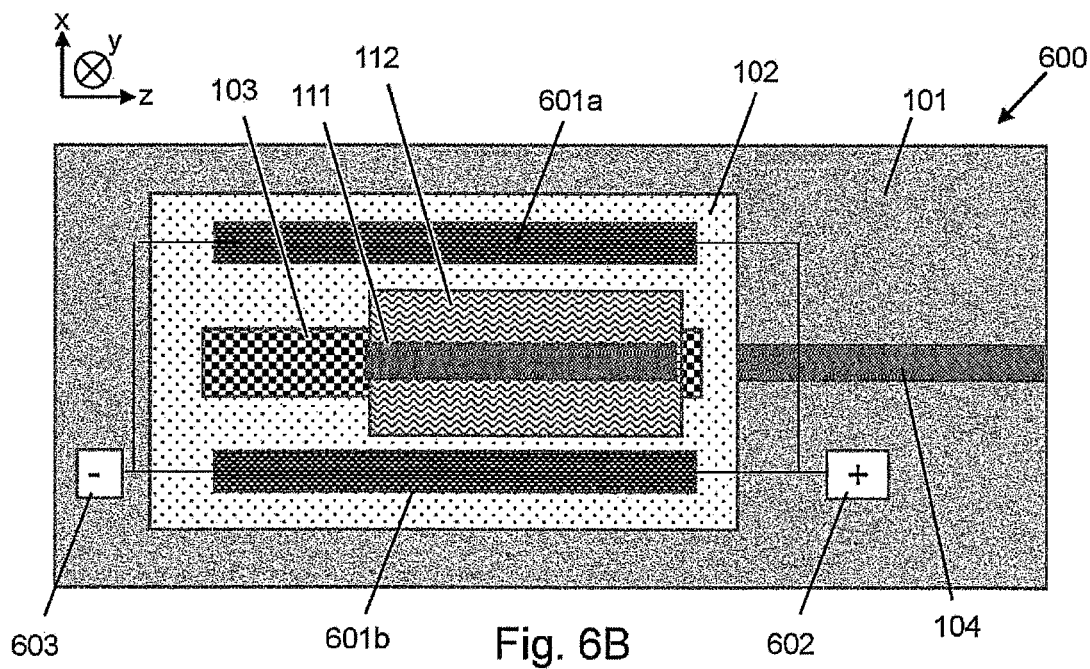
FIG. 6B shows a top-down view of the variant silicon-on-insulator platform of FIG. 6A after the III-V device coupon of FIG. 1B has been integrated.

FIG. 6A shows a top-down view of a variant silicon-on-insulator platform 600 and FIG. 6B shows a top-down view of the variant silicon-on-insulator platform of FIG. 6A after the device coupon of FIG. 1B has been integrated. Where the coupon and platform share features with the examples discussed previously, like features are shown by like reference numerals. The silicon-on-insulator platform 600 differs from those shown previously by the inclusion of a first 601a and second 601b heater. The heaters are provided as longitudinal strips, which are coextensive with the patterned surface 103. Each heater is connected to a positive electrode 602 and negative electrode 603. The heaters are configured, during operation of the optoelectronic device, to heat the III-V semiconductor based device so as to tune an operating wavelength thereof.

Figure 7A:
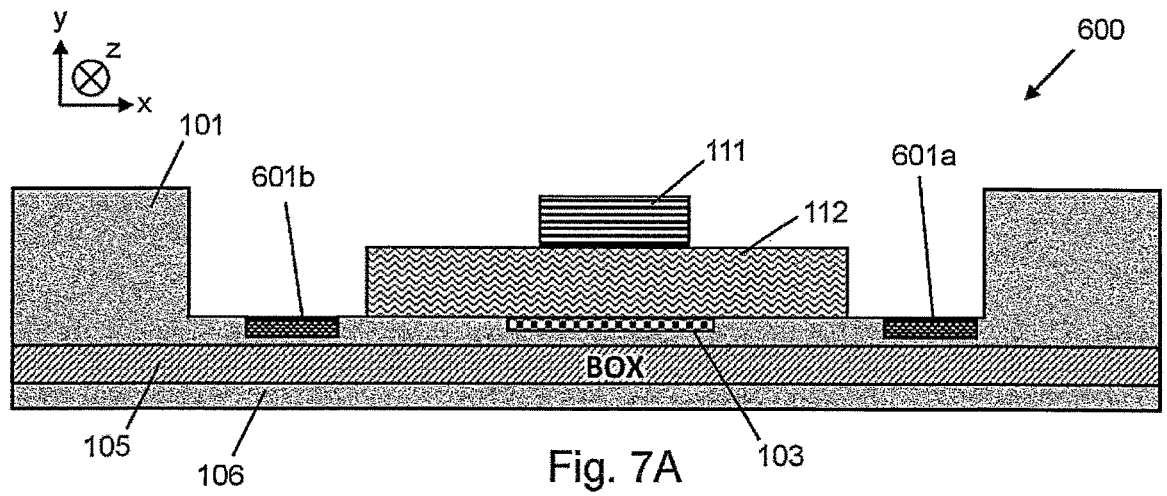
FIG. 7A shows an end-on cross-sectional view of the III-V device coupon and variant silicon-on-insulator platform of FIG. 6B.

FIG. 7A shows an end-on cross-sectional view of the device coupon and variant silicon-on-insulator platform of FIG. 6B. As can be seen, the heaters 601a and 601b are provided as doped regions of the silicon device layer 101. Preferably, the heaters are formed by the provision of an n-type species of dopant.

Figure 7B:
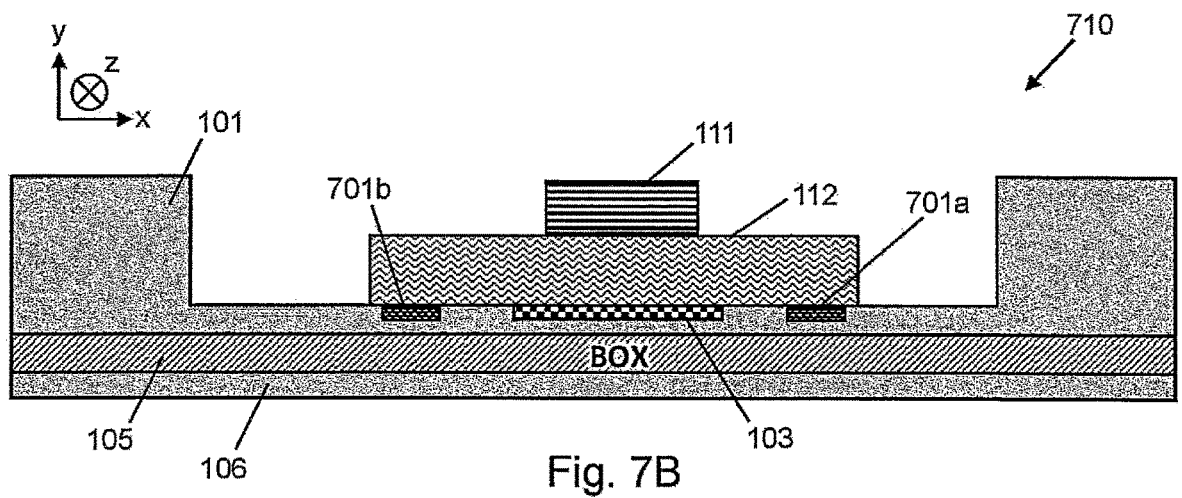
FIG. 7B shows an end-on cross-sectional view of the III-V device coupon and a further variant silicon-on-insulator platform.

FIG. 7B shows an end-on cross-sectional view of the device coupon and a further variant silicon-on-insulator platform 710. Where the coupon and platform share features with the examples discussed previously, like features are shown by like reference numerals. The silicon-on-insulator platform 710 differs from the platform 600 in that the heaters 701a and 701b, still provided as doped regions, are in this example located between the waveguide slab 112 and the buried oxide layer 105. The doped regions are still laterally spaced from the patterned surface 103.

Figure 7C:
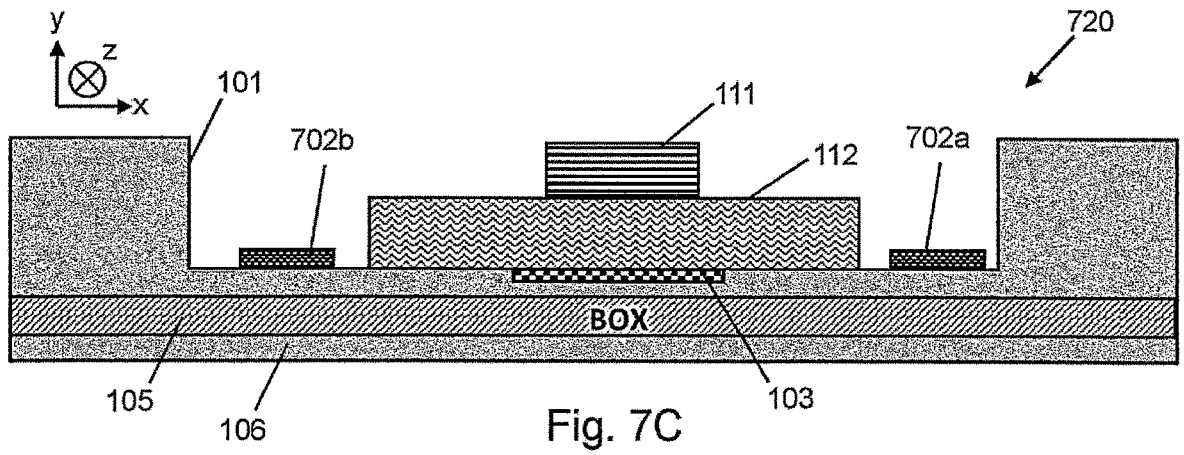
FIG. 7C shows an end-on cross-sectional view of the III-V device coupon and a further variant silicon-on-insulator platform.

FIG. 7C shows an end-on cross-sectional view of the device coupon and a further variant silicon-on-insulator platform 720. Where the coupon and platform share features with the examples discussed previously, like features are shown by like reference numerals. The silicon-on-insulator platform 720 differs from the platforms shown previously in that the heaters 702a and 702b are provided as metal strips, disposed on the silicon device layer 101. The metal may be any one of: titanium, titanium nitride, chromium, or nickel. In further variants, not shown, the silicon-on-insulator platform 600 shown in FIGS. 6A-7C do not contain the patterned surface 603 discussed above but does contain the heaters.

Figure 8:
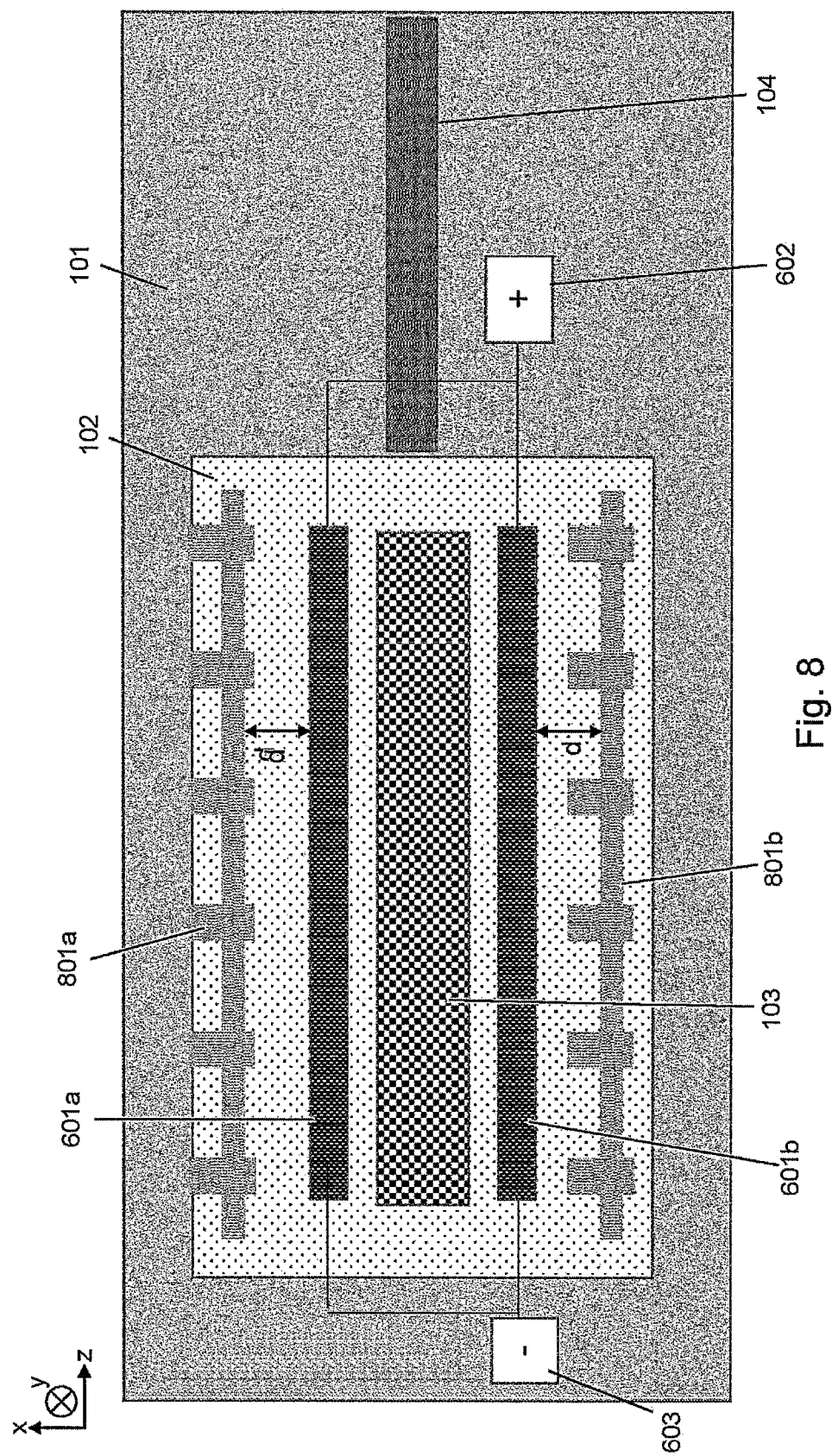
FIG. 8 shows a top-down view of a variant silicon-on-insulator platform.
Figure 9:
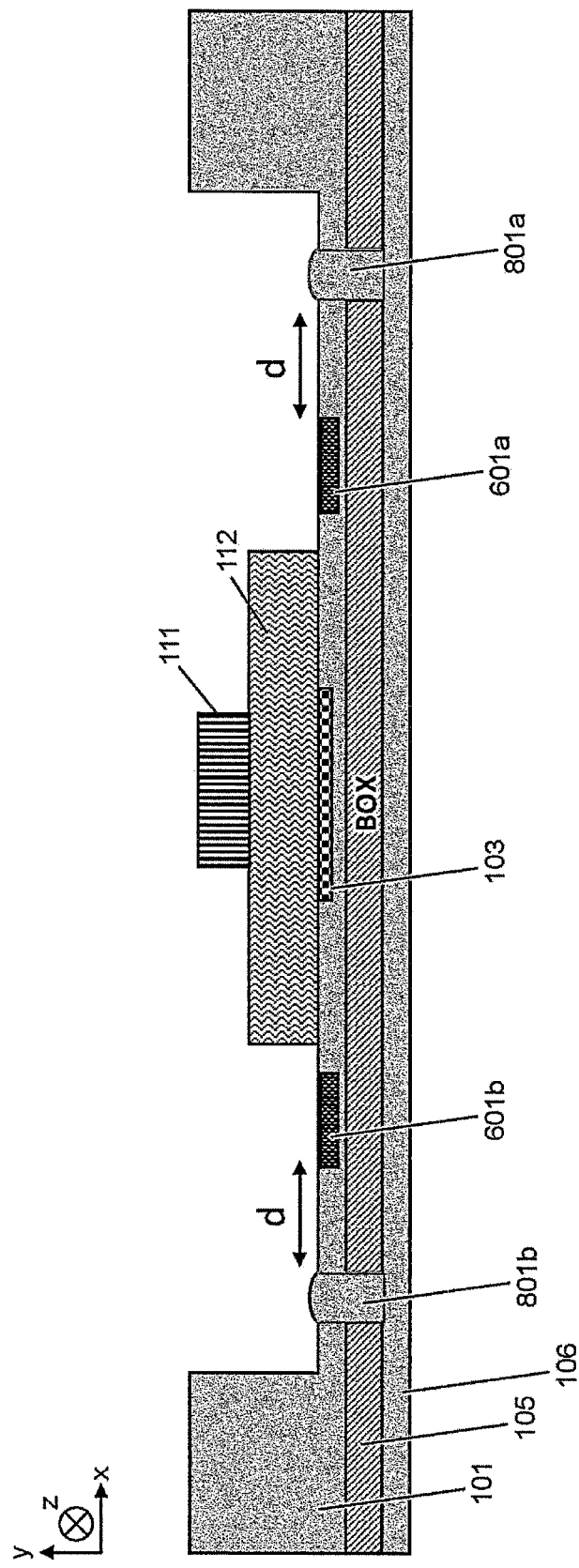
FIG. 9 shows an end-on cross-sectional view of the variant silicon-on-insulator platform of FIG. 8 after the III-V device coupon of FIG. 1B has been integrated.

FIG. 8 shows a top-down view of a variant silicon-on-insulator platform 800 and FIG. 9 shows an end-on cross-sectional view of the variant silicon-on-insulator platform of FIG. 8 after the device coupon of FIG. 1B has been integrated. Where the platform shares features with the examples discussed previously, like features are shown by like reference numerals. The platform 800 differs from platform 600 shown previously is by the inclusion of a silicon heat sink via structure 801a and 801b. The silicon heat sink structure vias are provided by the steps of: lithographically defining the via pattern; etching through the silicon device layer 101 and buried oxide layer 105 to create vias to expose the silicon substrate 106. The heat sink material is then epitaxially grown from the silicon substrate or deposited into the vias to fill the vias. The heat sink structure allows for improved heat sinking when the III-V semiconductor based device is a laser when the device is bonded to the silicon device layer (rather than examples where the buried oxide has been removed, and the device is bonded to either a dielectric or the silicon substrate). The distance 'd' is chosen so as to provide a heat flow path from the III-V semiconductor based device to the silicon substrate with a relatively low resistance, whilst also allowing the heaters to heat the III-V semiconductor based device more efficiently than if no buried oxide at all was present. This provides a good level of heat sinking whilst also allowing thermal tuning of the patterned surface 103 (when, for example, it is a grating). In a further variant, not shown, the silicon-on-insulator platform 800 does not contain the heaters or the patterned surface 103, but does include the heat sink via structure.

Figure 10A:
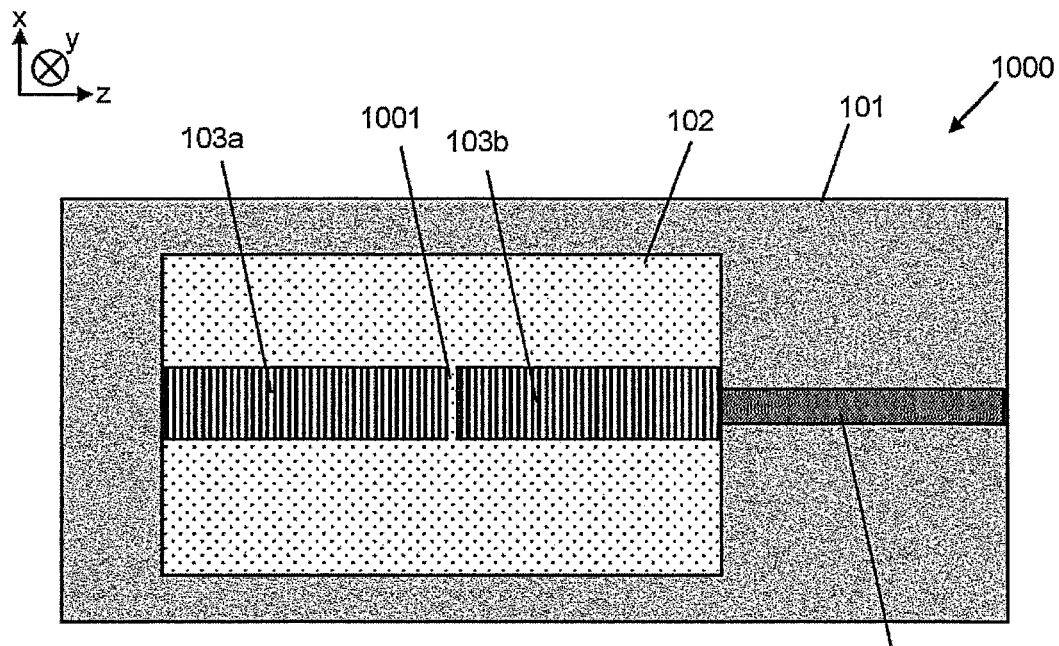
FIG. 10A shows a top-down view of a further variant silicon-on-insulator platform.
Figure 10B:
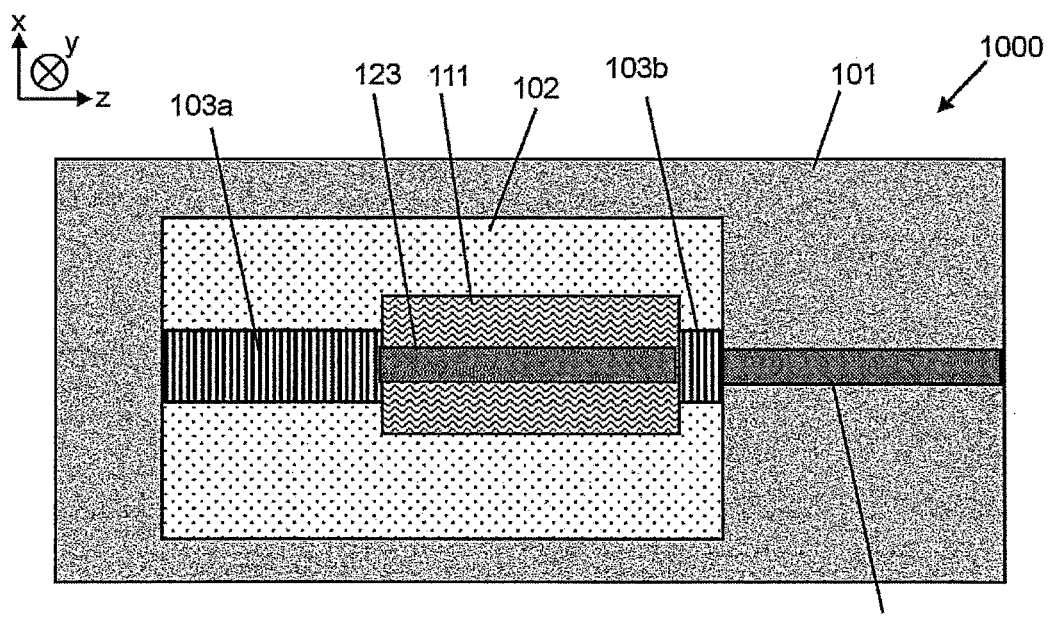
FIG. 10B shows the further variant silicon-on-insulator platform of FIG. 10A after the III-V device coupon of FIG. 1B has been integrated.

FIG. 10A shows a top-down view of a further variant silicon-on-insulator platform 1000, and FIG. 10B shows the further variant silicon-on-insulator platform of FIG. 10A after the device coupon of FIG. 1B has been integrated. Where the platform shares features with the examples discussed previously, like features are shown by like reference numerals. The patterned surface in platform 1000 differs from those shown previously, in that it comprises two gratings 103a and 103b separated by a grating phase shift region 1001. The strength of the grating, i.e. the degree to which it interacts with the optical mode in the III-V semiconductor based waveguide, can be controlled by varying the depth of the etch into the bed of the cavity as well as varying the thickness of a lower optical cladding layer in the device coupon.

Figure 11A:
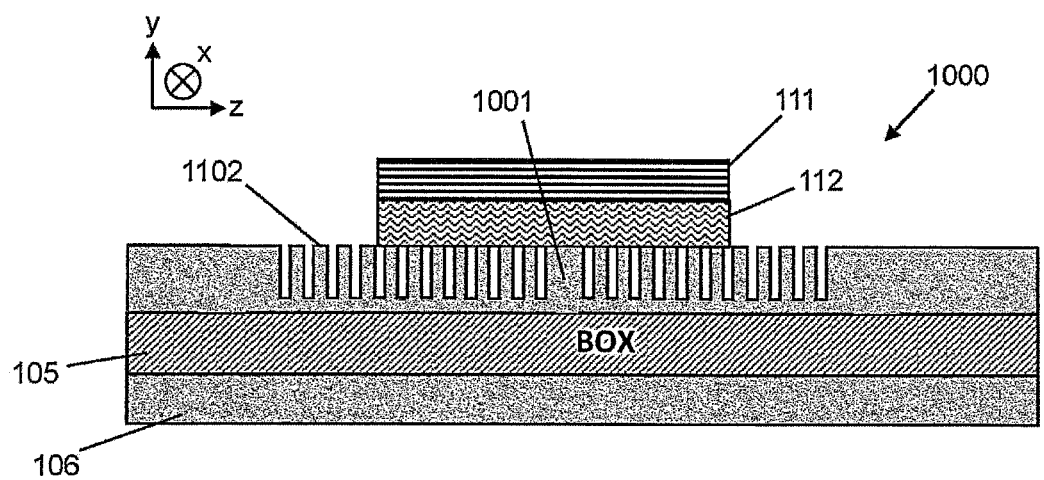
FIG. 11A shows a side-on cross-sectional view of a variant silicon-on-insulator platform after the III-V device coupon of FIG. 1B has been integrated.
Figure 11B:
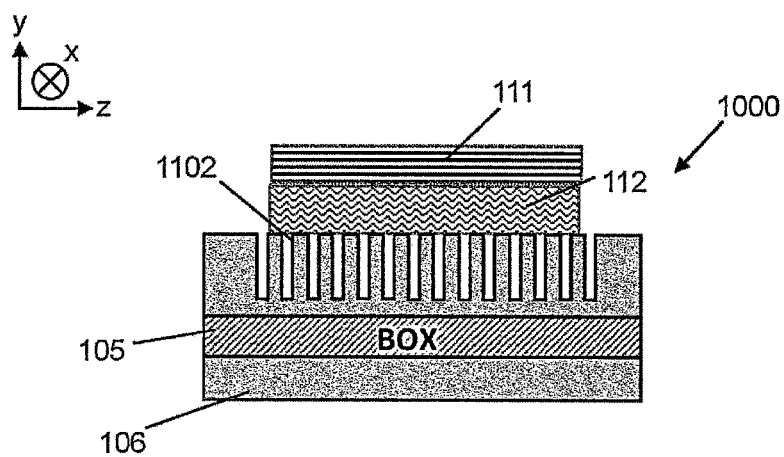
FIG. 11B shows an end-on cross-sectional view of the variant silicon-on-insulator platform and III-V device coupon of FIG. 11A.

FIG. 11A shows a side-on cross-sectional view of the silicon-on-insulator platform 1000 after the device coupon of FIG. 1B has been integrated and FIG. 11B shows an end-on cross-sectional view of the variant silicon-on-insulator platform and device coupon of FIG. 11A.

Figure 11C:
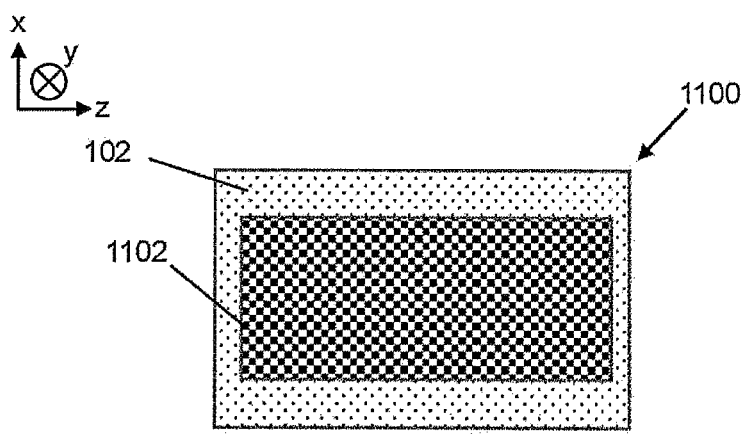
FIG. 11O shows a top-down view of the variant silicon-on-insulator platform of FIG. 11A before the III-V device coupon has been integrated.

FIG. 11C shows a top-down view of a variant silicon-on-insulator platform 1100, before the device coupon has been integrated. Where the platform shares features with the examples discussed previously, like features are shown by like reference numerals. In this example, the patterned surface is a penetration reducing pattern 1102 in that it provides a region having a lower refractive index than the waveguide slab 112. This lower refractive index reduces or eliminates the degree to which an optical mode in the waveguide rib and slab penetrates into the silicon-on-insulator platform and optionally removes the need for a BOX layer between the silicon device layer and the silicon substrate. Notably, the patterned surface 1102 provides a checkerboard type view, due to the intersecting gratings which extend both in the 'x' and 'z' direction. In a further example, the penetration reducing pattern 1102 is provided as a sub-wavelength grating which acts as a high reflection layer.

Figure 12A:
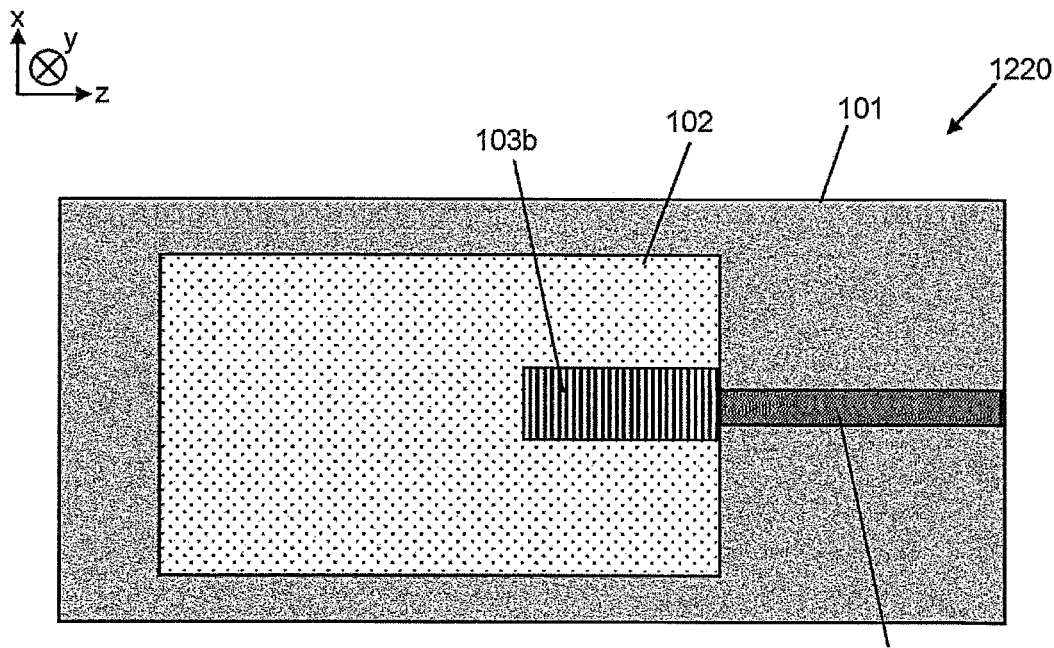
FIGS. 12A-12L show various views of two variant silicon-on-insulator platforms before and after the III-V device coupon has been integrated.
Figure 12B:
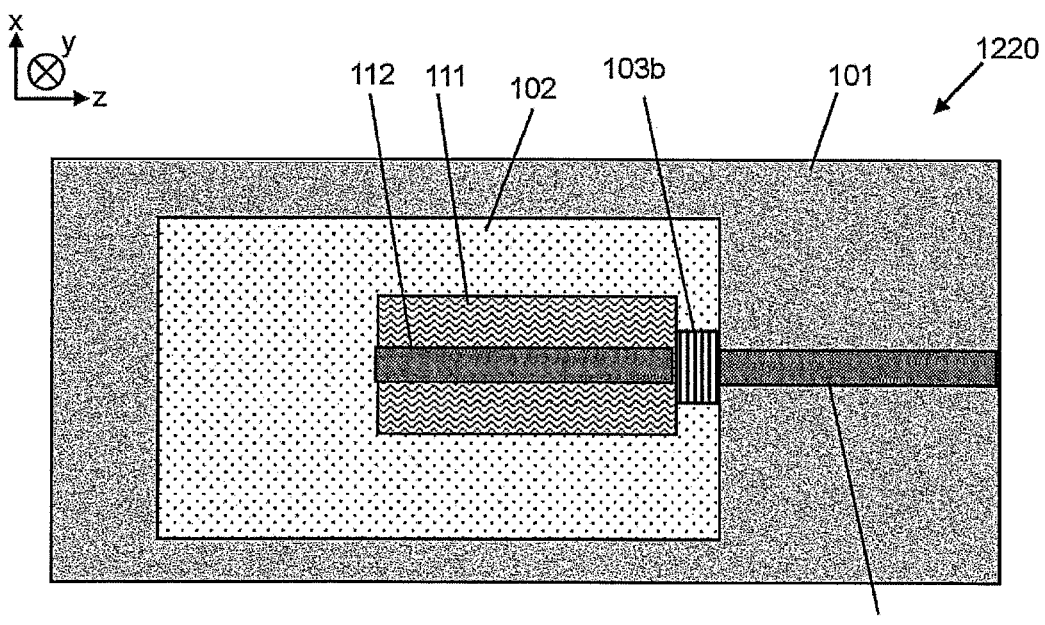
Figure 12C:
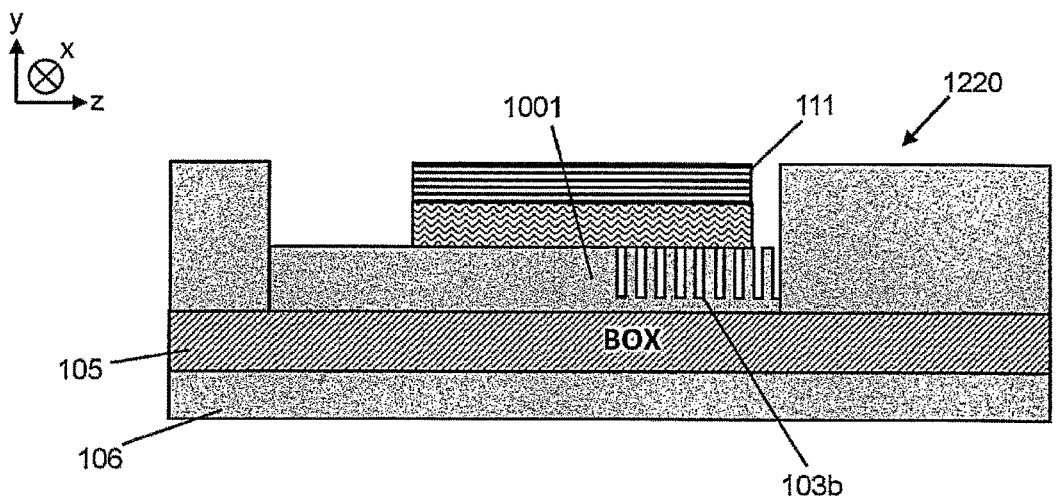
Figure 12D:
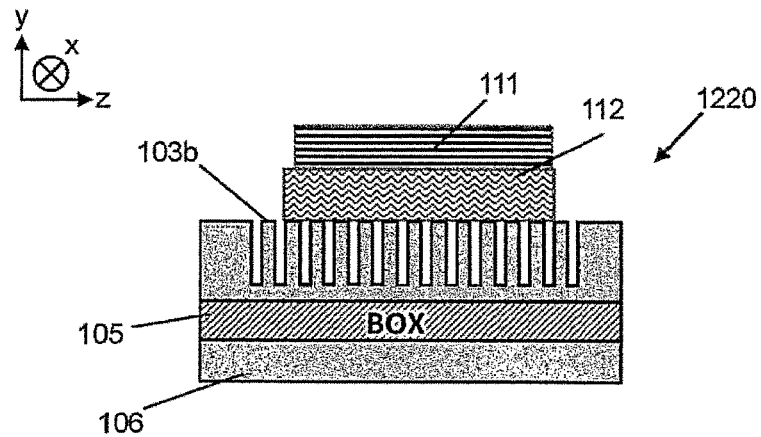
Figure 12E:
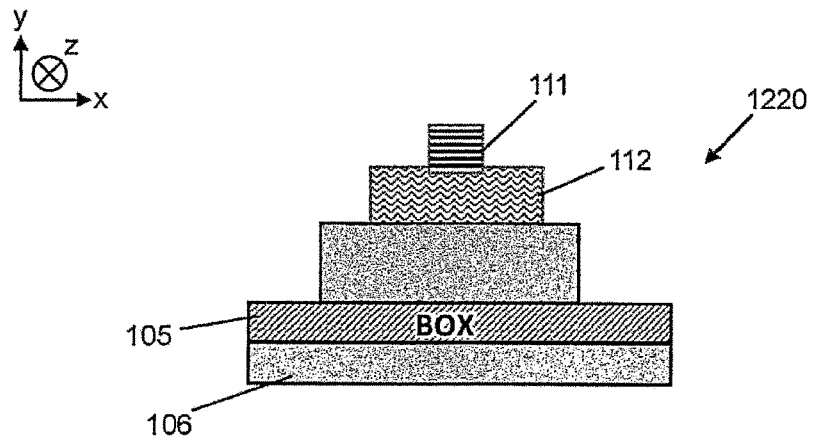

FIGS. 12A-12L show various views of two variant silicon-on-insulator platforms before and after the III-V device coupon has been integrated. The SOI platform 1220 shown in a top-down view in FIG. 12A contains a partial grating 103b, i.e. one which has a length (measured in the z direction, which is parallel or substantially parallel to the guiding direction of waveguide 104) which is less than that of the waveguide rib 112 and slab 111 in the device coupon 110. In some examples, the length measured in the z direction of the partial grating 103b that is directly underneath waveguide rib is approximately 50% of the length of the waveguide rib 112. This may enhance the spectral purity in subsequent lasing. Once the device coupon 110 is bonded to the cavity 102, as shown in FIG. 12B, it is substantially aligned with the grating 103b. In this example, the device coupon contains a laser (preferably a III-V semiconductor based laser), the partial grating 103b is provided along the output portion of the laser. This arrangement is shown in cross-section in FIGS. 12C-12E, with FIG. 12D being a cross-section through the partial grating, and FIG. 12E being a cross-section through a region of the cavity not containing the partial grating. The device coupon 110 with partial grating 103b is provided with an antireflective facet on the output facet near the partial grating 103b and a high-reflectivity facet on the rear facet, furthest from the partial grating 103b, to enhance lasing characteristic of output power.

Figure 12F:
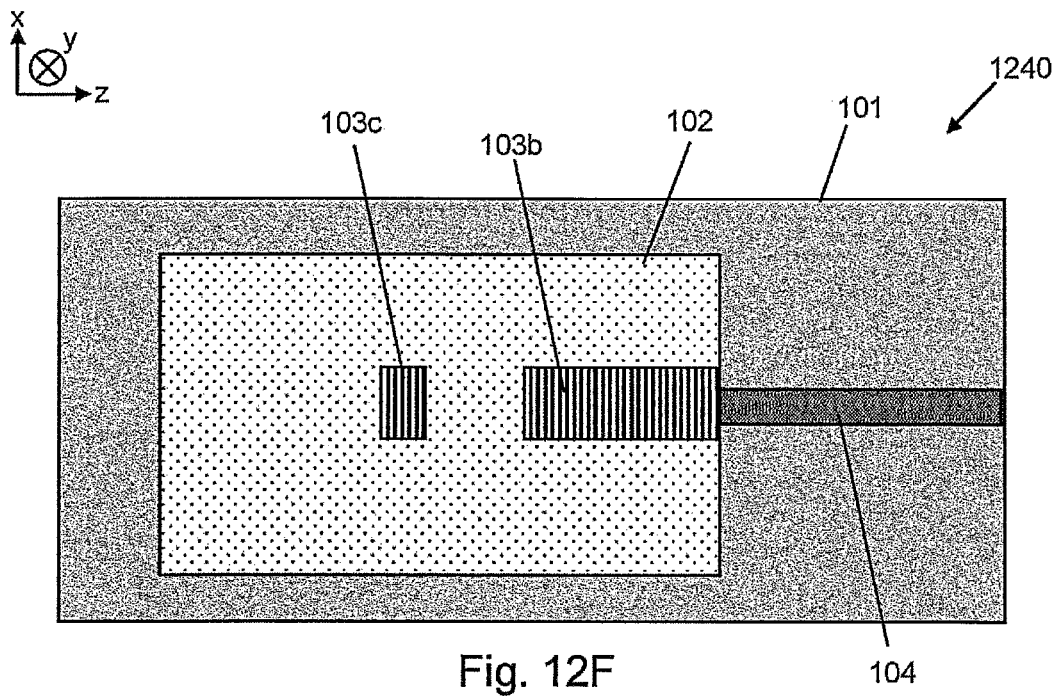
Figure 12G:
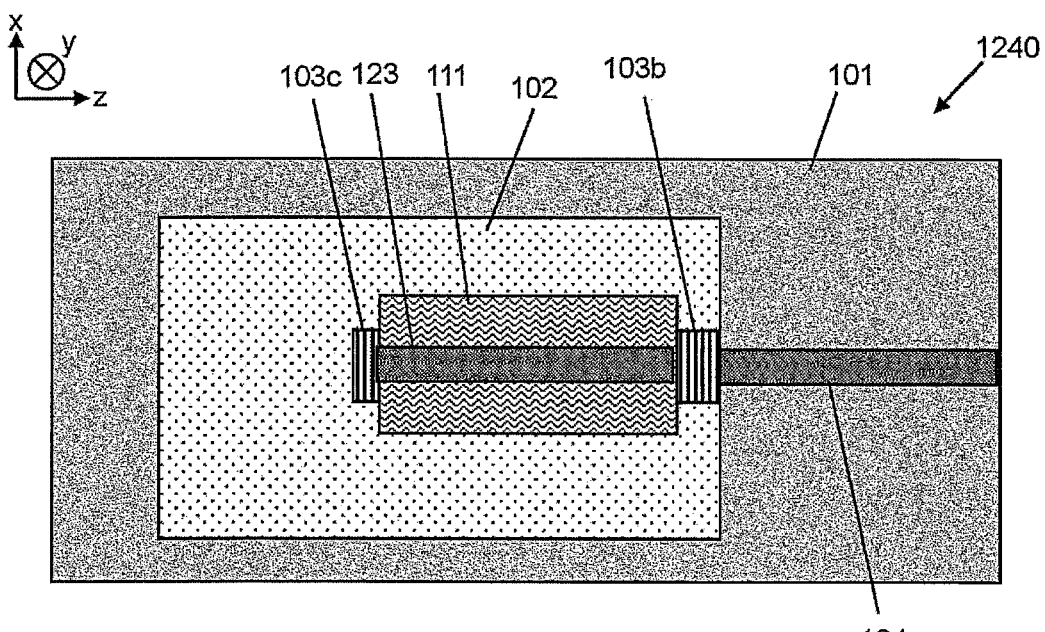
Figure 12H:
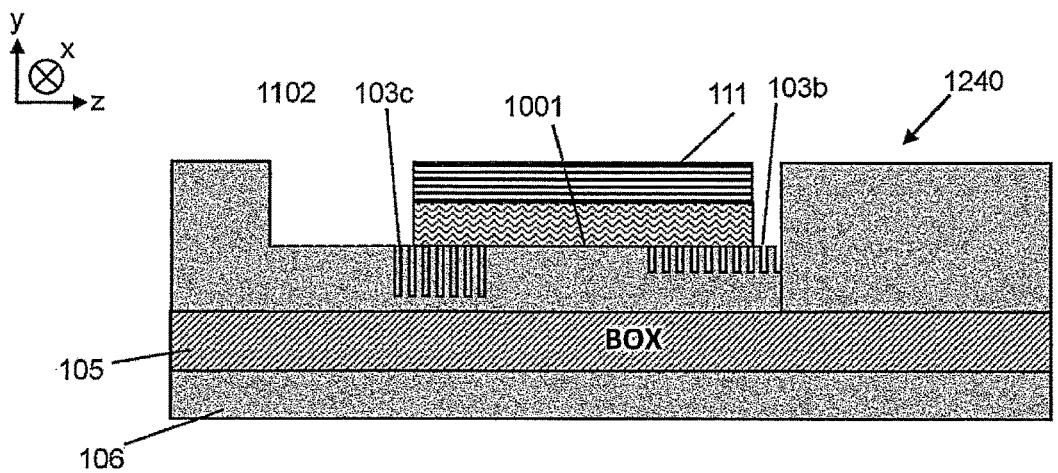
Figure 12I:
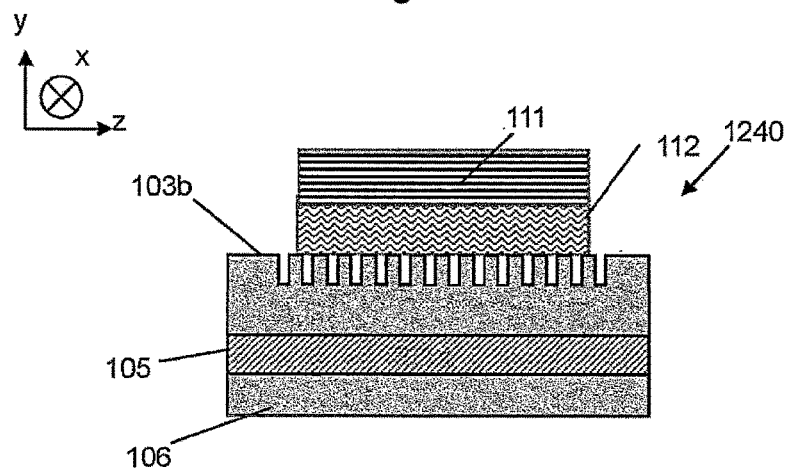
Figure 12J:
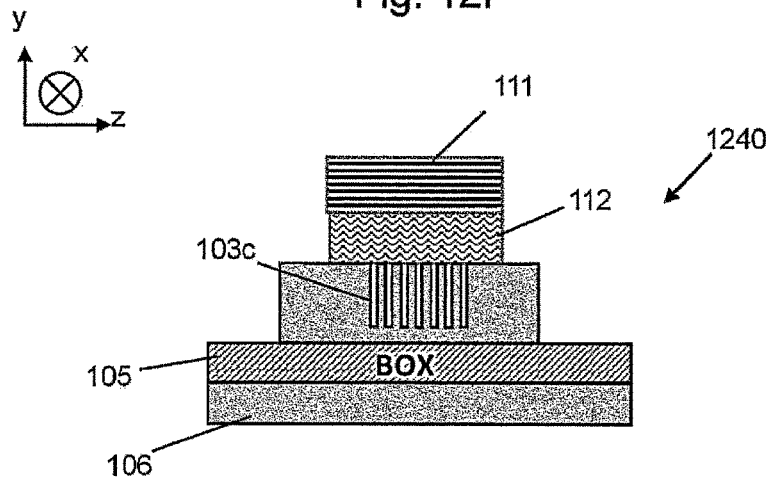

The SOI platform 1240 shown in a top-down view in FIG. 12F contains a first partial grating 103b and a second partial grating 103c. The first partial grating 103b is the same as that shown in FIGS. 12A-12E, and has the same properties. The second partial grating 103c is a broadband grating mirror located at the end of the device coupon distal to the silicon waveguide 104. That is, it is located on an opposing side of the first partial grating 103b to the silicon waveguide 104, and with a gap between the first and second partial gratings. The second partial grating 103c provides a highly reflective facet at an opposing end of the laser (within the device coupon) to the antireflective facet adjacent to the silicon waveguide 104. This provides a DFB laser with an accurate wavelength, since the rear facet can include an antireflective facet to eliminate any interaction with a highly reflective facet. In this embodiment, the resonator cavity does not suffer any phase errors, which would otherwise have been introduced due to the fabrication tolerances typically involved in forming a HR facet. FIGS. 12H-12J show various cross-sections through the SOI platform 1240 and device coupon. Notably, it can be seen that the first partial grating 103b is shallower (i.e. extends into the silicon on insulator layer for a smaller distance) than the second partial grating 103c. The first partial grating may extend no more than 50% into the silicon on insulator layer, whereas the second partial grating may extend at least 50% into the silicon on insulator layer. FIG. 12I shows a cross-section through the first partial grating 103b, and FIG. 12J shows a cross-section through the second partial grating 103c.

In one example of the SOI platforms 1220 and 1240 discussed above, there is no oxide between the cavity and the device coupon. This allows the higher refractive index of the silicon on insulator layer to attract the optical mode within the device coupon to interact with the gratings.

Figure 12K:
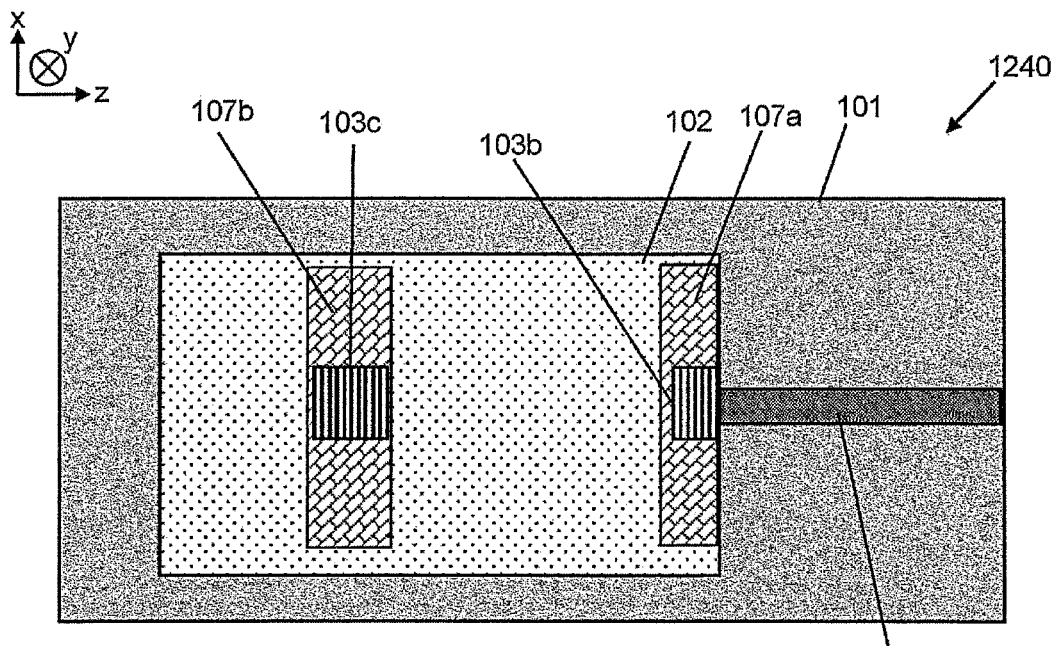
Figure 12L:
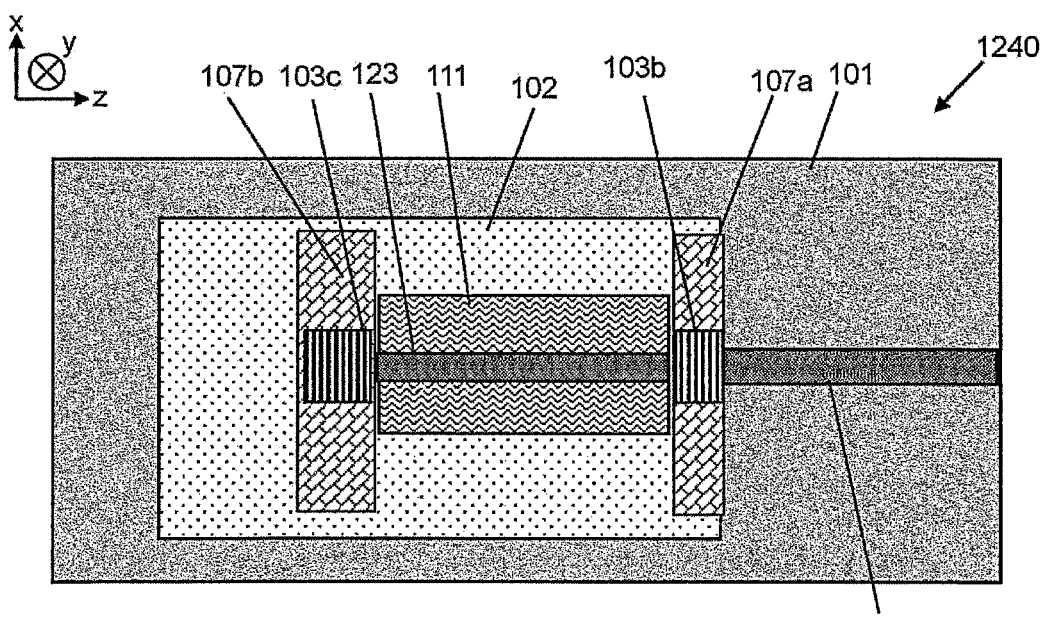

FIGS. 12K-12L show a variant silicon-on-insulator platforms before and after the III-V device coupon has been integrated. In FIG. 12K, there are heaters 107a and 107b made by ion implantation under the grating 103b and 103c. The wavelengths of the gratings can be tuned by the heaters and the two gratings together form a filter providing a Vernier tuning effect, so as to have a very broad wavelength tuning range. FIG. 12L shows a top view of device coupon integrated with FIG. 12K to form a tuneable sampled grating DBR laser (SG-DBR) with wide wavelength tuning range.

Figure 13A:
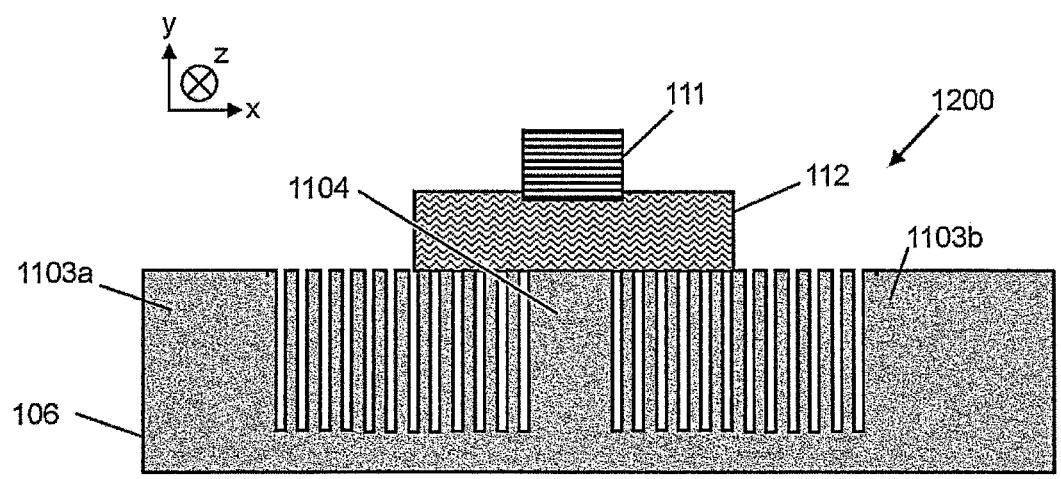
FIG. 13A shows an end-on cross-sectional view of a variant silicon-on-insulator platform after the III-V device coupon of FIG. 1B has been integrated.
Figure 13B:
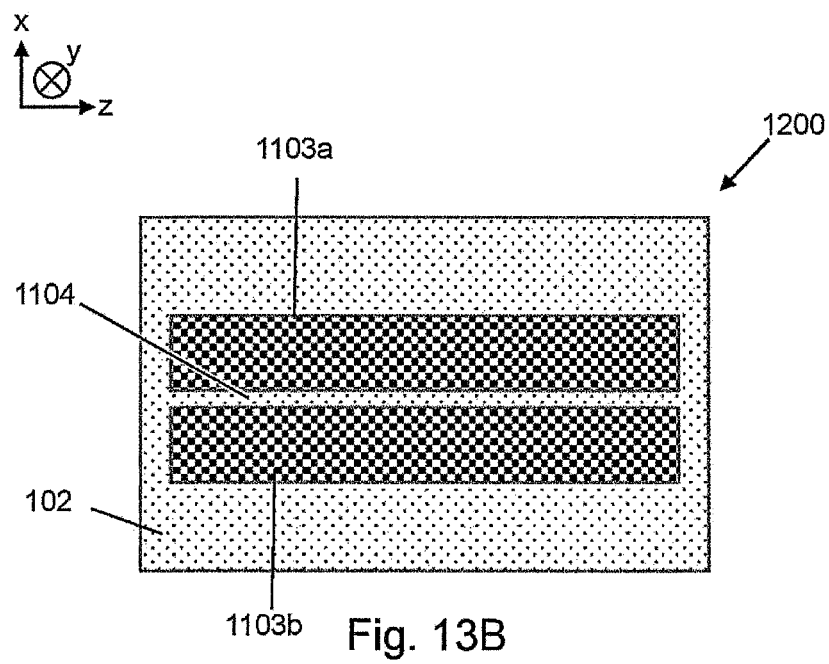
FIG. 13B shows a top-down view of the variant silicon-on-insulator platform before the III-V device coupon has been integrated.

FIG. 13A shows an end-on cross-sectional view of a variant silicon-on-insulator platform 1200 after the device coupon of FIG. 1B has been integrated and FIG. 13B shows a top-down view of the variant silicon-on-insulator platform before the device coupon has been integrated. Where the platform shares features with the examples discussed previously, like features are shown by like reference numerals. In this example, the patterned surface is divided into two low refractive index regions 1103a and 1103b (their refractive index having been lowered by etching) and a high refractive index region 1104 located between the two low refractive index regions. This patterned surface provides additional wave-guiding, and so can be used to aid alignment of the optical modes, and optionally removes the need for a BOX layer between the silicon device layer and the silicon substrate.

Figure 14A:
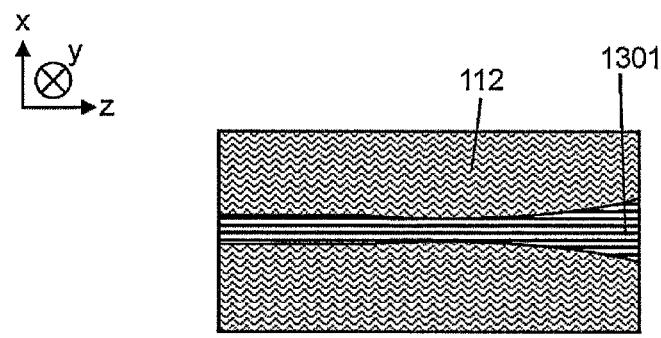
FIG. 14A shows a top-down view of a variant III-V device coupon.
Figure 14B:
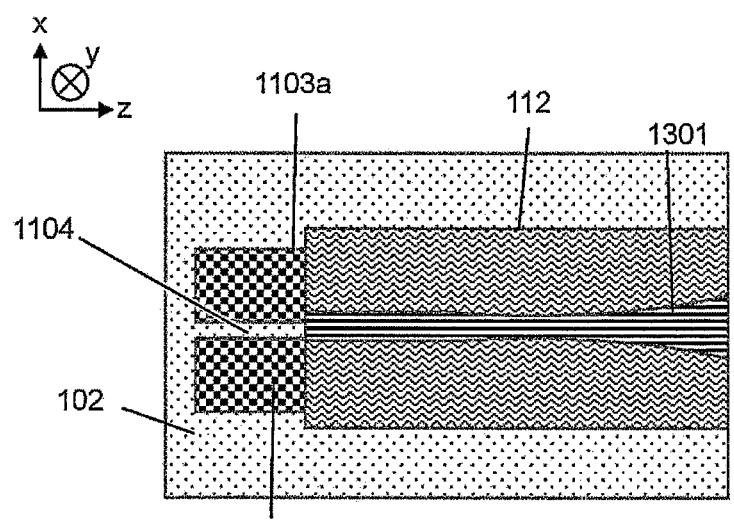
FIG. 14B shows a top-down view of the variant silicon-on-insulator platform of FIG. 13B after the variant III-V device coupon of FIG. 14A has been integrated

FIG. 14A shows a top-down view of a variant device coupon and FIG. 14B shows a top-down view of the variant silicon-on-insulator platform of FIG. 13B after the variant device coupon of FIG. 14A has been integrated. Where the platform shares features with the examples discussed previously, like features are shown by like reference numerals. The variant device coupon of FIG. 14A differs from those shown previously in that the waveguide rib widens at one end. This allows the wave guiding in the III-V semiconductor based device to be controlled by the patterned surface 1103a and 1103b in the silicon-on-insulator platform instead of by the III-V semiconductor based device waveguide, relaxing or eliminating the need for precise alignment between the III-V semiconductor based device waveguide and the Si waveguide. In a further example, not shown, the waveguide rib 1301 is wider at both ends than in the central region (between the two ends).

Figure 15:
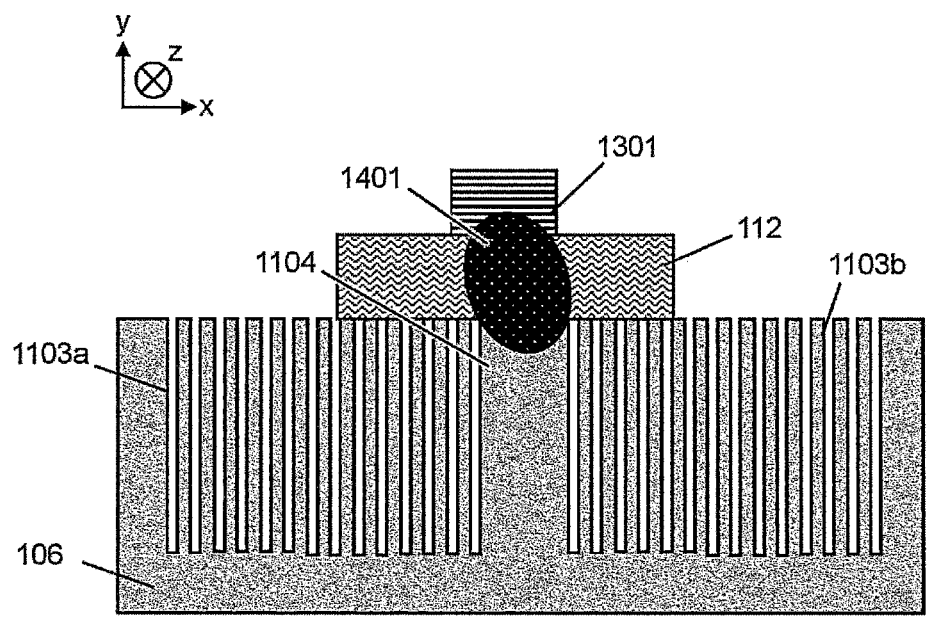
FIG. 15 shows an end-on cross-sectional view of the variant silicon-on-insulator platform of FIG. 14B at a first point along a length of the waveguide.
Figure 16:
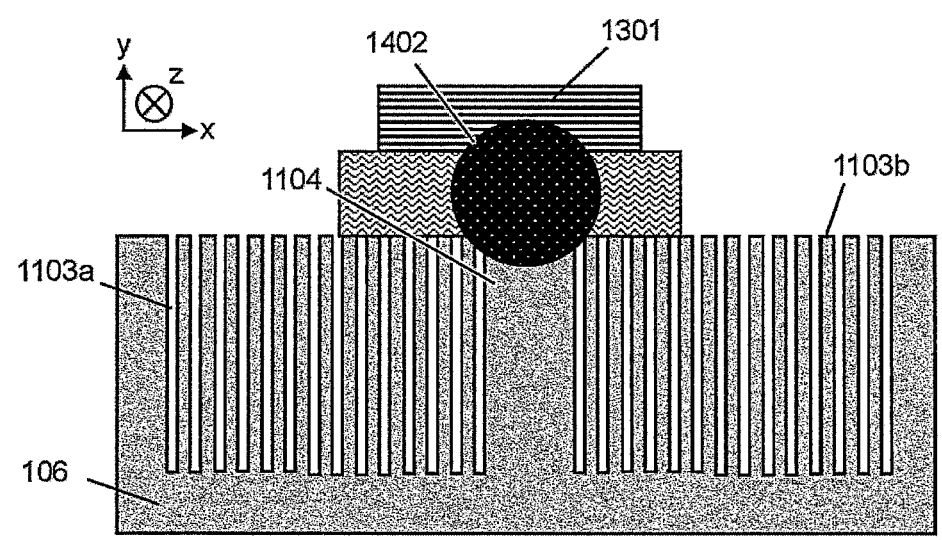
FIG. 16 shows an end-on cross-sectional view of the variant silicon-on-insulator platform of FIG. 14B at a second point along a length of the waveguide.

FIG. 15 shows an end-on cross-sectional view of the variant silicon-on-insulator platform of FIG. 14B at a first point along a length of the waveguide and FIG. 16 shows an end-on cross-sectional view of the variant silicon-on-insulator platform of FIG. 14B at a second point along a length of the waveguide. As can be seen in FIG. 15, a degree of misalignment between the waveguide ridge 1301 and the high refractive index region 1104 causes the optical mode to be slightly misaligned. Whereas, in the wider section of the waveguide rib 1301, the misalignment is corrected as the wave guiding is now being performed or aided by the low refractive index regions 1103a and 1103b. The low refractive index regions can be self-aligned with the silicon waveguide 104 during fabrication, and so alignment between the optical mode in the III-V semiconductor based waveguide and the silicon waveguide can be achieved without the need for accurate alignment of the III-V semiconductor based device to the Si waveguide. The alignment can be improved beyond that which is possible conventionally due to the alignment tolerances during bonding.

Figure 17A:
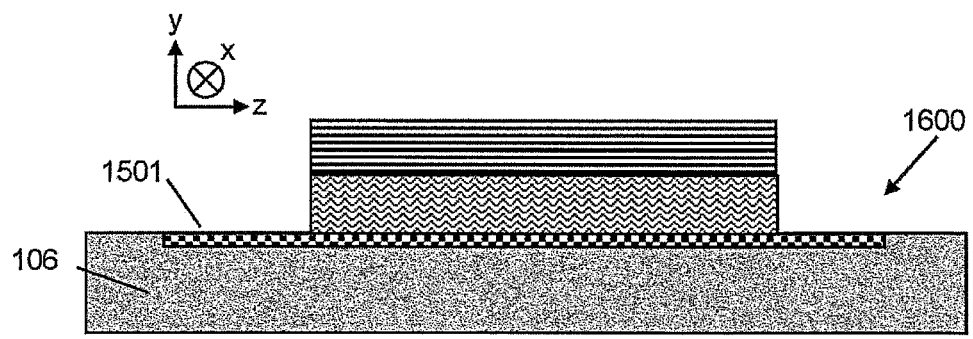
FIG. 17A is a side-on cross-sectional view of a variant silicon-on-insulator platform after the III-V device coupon of FIG. 1B has been integrated.
Figure 17B:
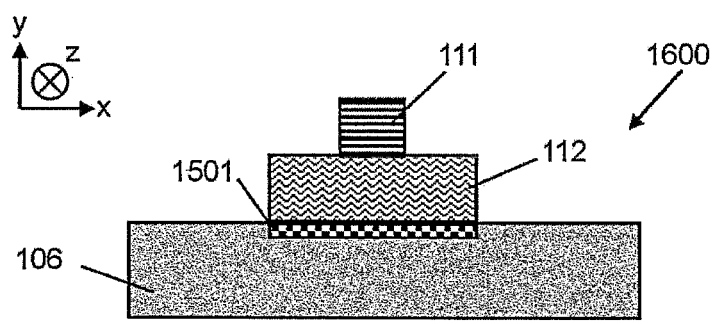
FIG. 17B is an end-on cross-sectional view of the variant silicon-on-insulator platform of FIG. 17A.

FIG. 17A is a side-on cross-sectional view of a variant silicon-on-insulator platform 1600 after the device coupon of FIG. 1B has been integrated and FIG. 17B is an end-on cross-sectional view of the variant silicon-on-insulator platform of FIG. 17A. Where the platform shares features with the examples discussed previously, like features are shown by like reference numerals. In this example, the patterned surface is a reflective grating. The reflective grating has a grating spacing smaller than an operating wavelength of the optoelectronic device. For example, if the operating wavelength is 1310 nm, the grating spacing may be smaller than this.

Figure 18:
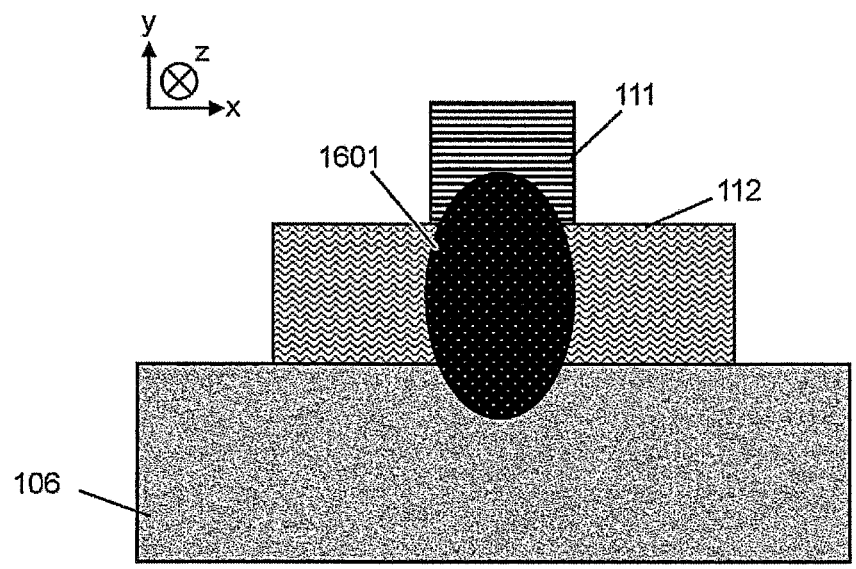
FIG. 18 is an end-on cross-sectional view of a silicon-on-insulator platform without a reflective pattern.
Figure 19:
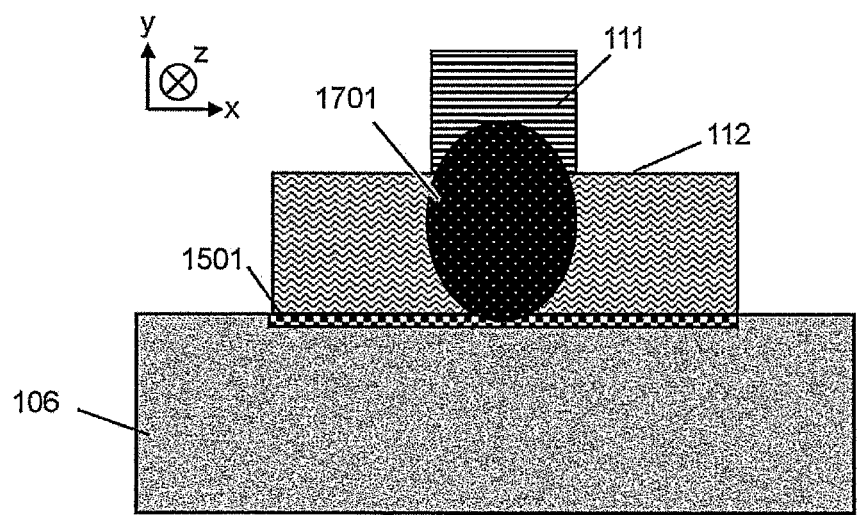
FIG. 19 is an end-on cross-sectional view of the variant silicon-on-insulator platform of FIG. 17A.

FIG. 18 is an end-on cross-sectional view of a silicon-on-insulator platform without a reflective pattern; FIG. 19 is an end-on cross-sectional view of the variant silicon-on-insulator platform of FIG. 17A. As can be seen in FIG. 18, without the patterned surface the optical mode 1601 extends at least partially into the bed of the cavity. Whereas, the provision of the patterned surface 1501 as shown in FIG. 19 confines the optical mode 1701 to being within the rib 111 and slab 112. This can aid coupling from the III-V semiconductor based waveguide to the silicon waveguide, and so decrease the optical losses in the optoelectronic device, and also optionally removes the need for a BOX layer between the silicon device layer and the silicon substrate.

Figure 20A:
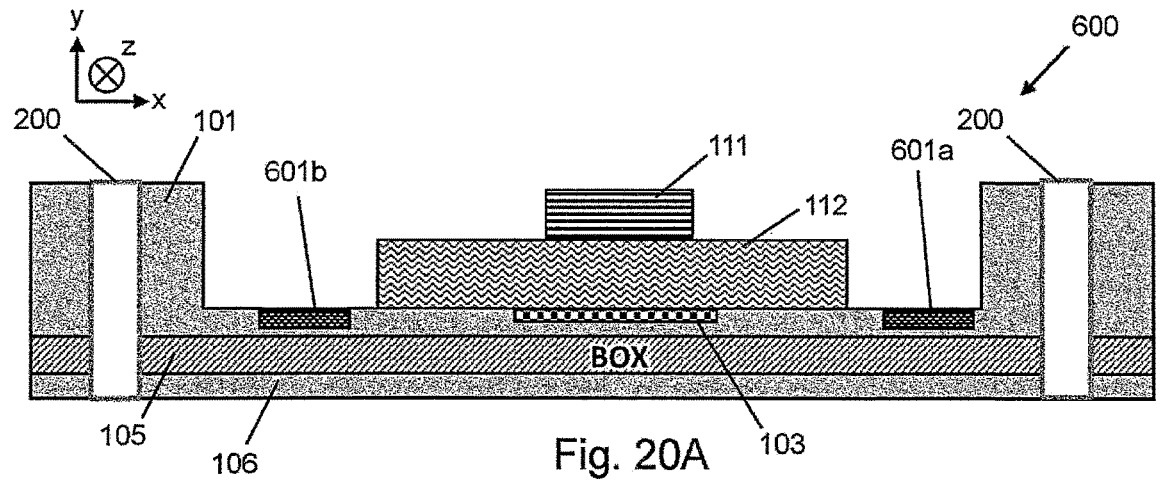
FIGS. 20A-20C are variations of the examples shown in FIGS. 7A-7C.
Figure 20B:
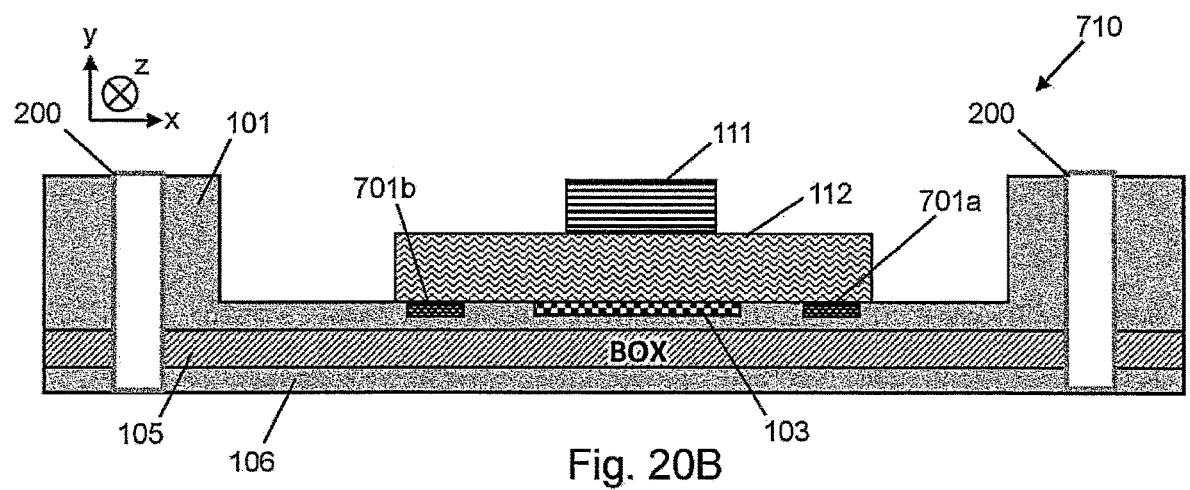
Figure 20C:
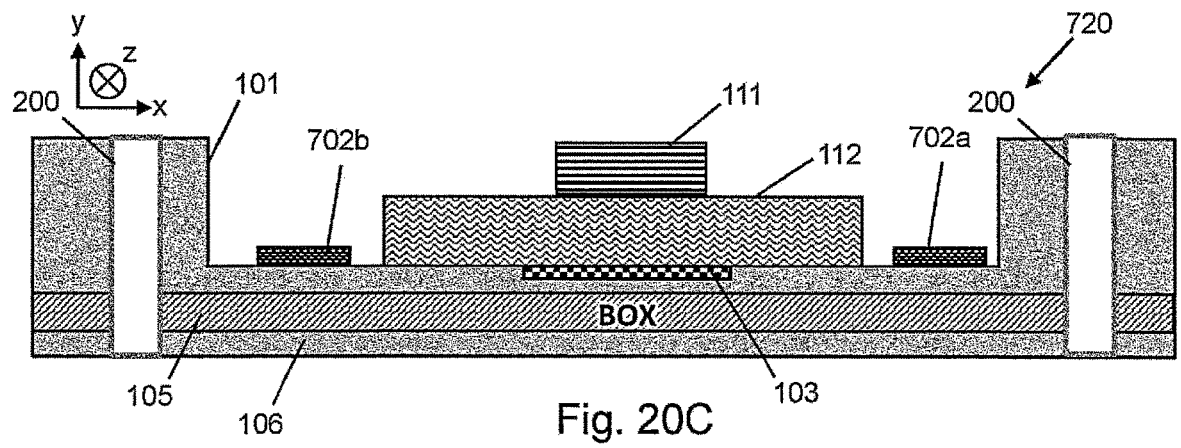

FIGS. 20A-20C show variations of the coupons and platforms shown in FIGS. 7A-7C. Where the variations share features with the examples shown in FIGS. 7A-7C, like features are indicated by like reference numerals. The variations in FIGS. 20A-20C differ from the examples shown in FIGS. 7A-7C by their inclusion of one or more thermally isolating trenches 200. In some examples, there may be a single trench present on one lateral side of the platform. In the examples shown in FIGS. 20A-20C, a pair of trenches are shown on opposing lateral sides of the platform. These trenches, in some examples, surround the cavity around its perimeter i.e. define a single trench when viewed from above. The trenches increase the thermal efficiency of the resulting devices. In further variations, the platforms do not contain the patterned surface, heaters, or heat sink via structure discussed previously, but do contain the thermally isolating trenches 200.

Figure 21:
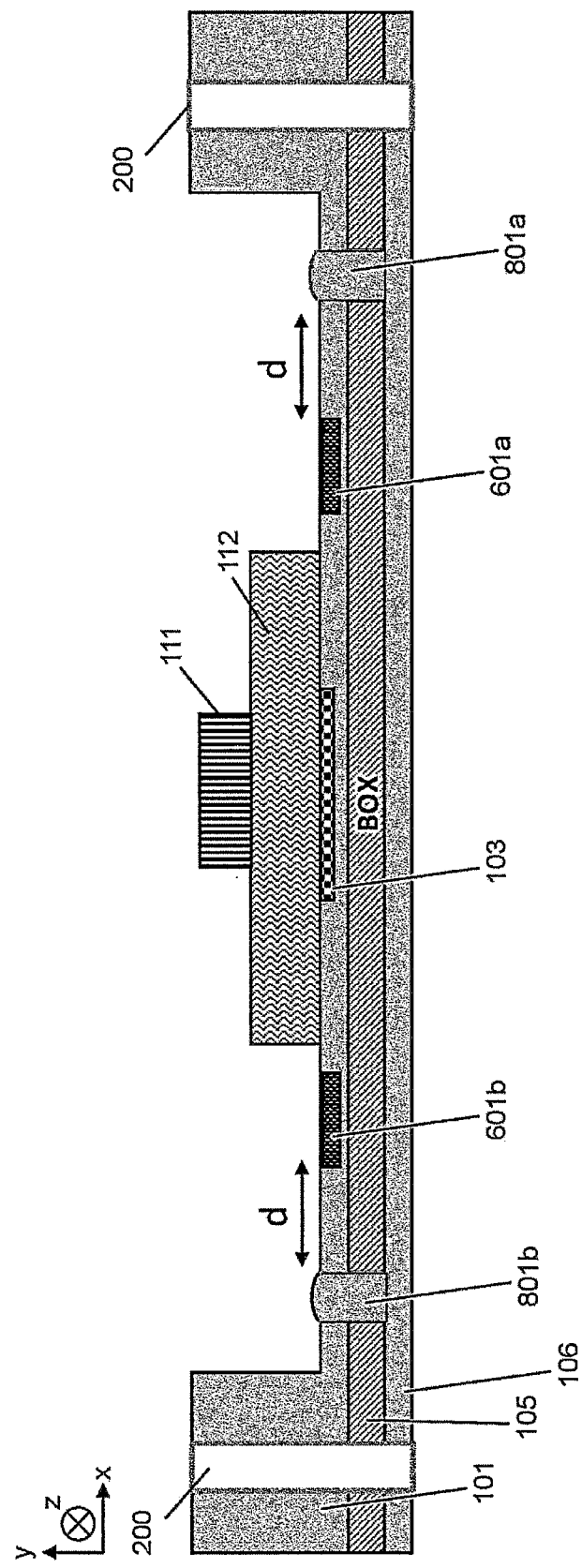
FIG. 21 is a variation of the example shown in FIG. 9.

FIG. 21 is a variation of the example shown in FIG. 9. Where it shares features with the example shown in FIG. 9, like features are indicated by like reference numerals. The variation in FIG. 21 differs from the example shown in FIG. 9 by its inclusion of one or more thermally isolating trenches 200. In some examples, there may be a single trench present on one lateral side of the platform. In the example shown in FIG. 21, a pair of trenches are shown on opposing lateral sides of the platform. These trenches, in some examples, surround the cavity around its perimeter i.e. define a single trench when viewed from above. The trenches increase the thermal efficiency of the resulting devices.

Figure 22A:
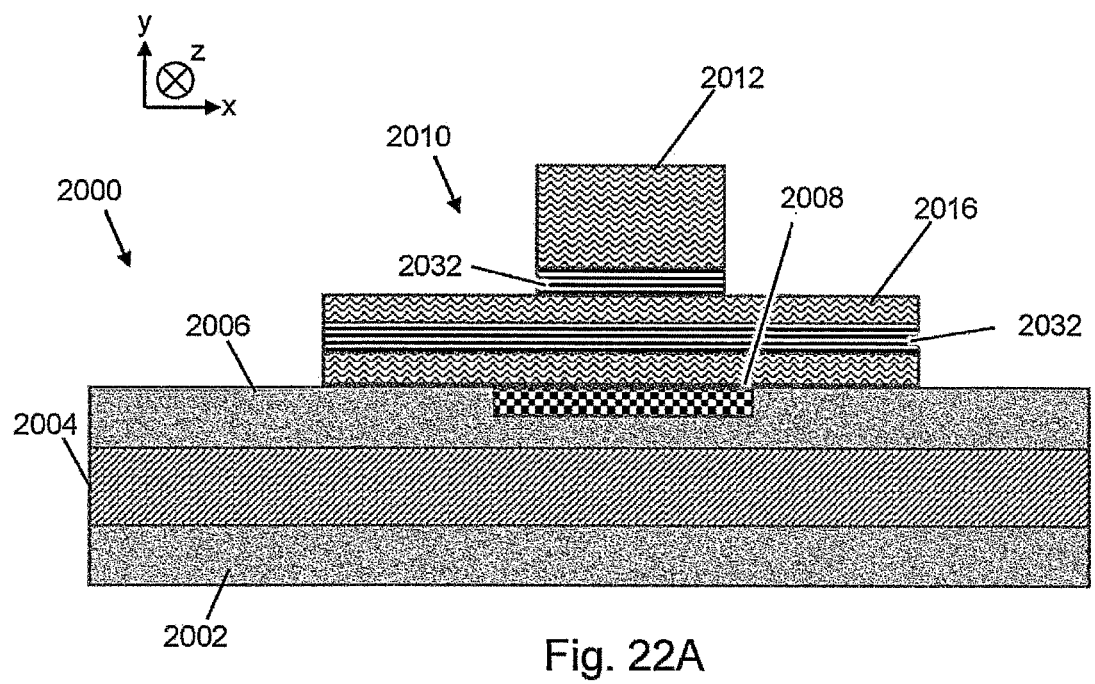
FIGS. 22A and 22B are cross-sectional views of a variant silicon-on-insulator platform at a first and second point along a length of the waveguide.
Figure 22B:
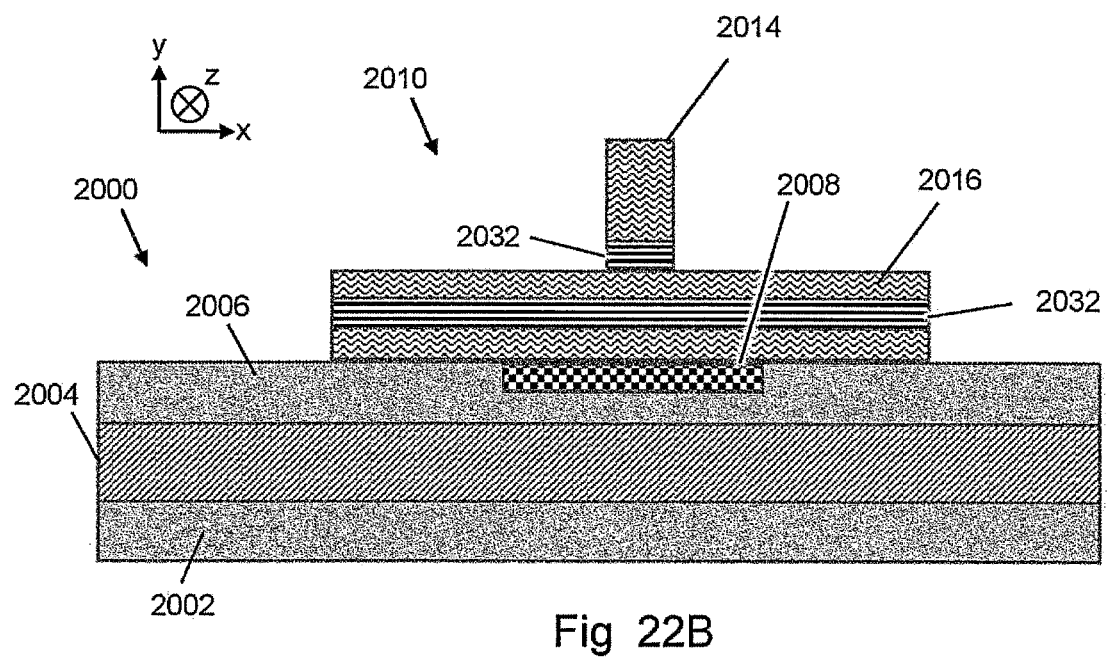

FIGS. 22A and 22B are cross-sectional views of a variant silicon-on-insulator platform 2000 at a first and second point respectively along a length of the waveguide. The platform includes a silicon substrate 2002, a buried oxide layer 2004, and a silicon device layer 2006 as discussed previously. The silicon device layer includes a patterned region 2008. The variant silicon-on-insulator platform differs from the example shown in FIGS. 15 and 16 in that the III-V semiconductor based waveguide is wider at both a first and second end (as shown in detail in FIG. 24A). Moreover, the III-V semiconductor based waveguide comprises an active upper waveguide region 2012/2014 and a passive lower waveguide region 2016. The width of the active upper waveguide region tapers from a first width in first waveguide region 2012 to a second width in a second waveguide region 2014, and then back to the first width or a width wider than the second width (i.e. the waveguide may be symmetric or may not be symmetric). In a further example, not shown, III-V semiconductor based waveguide comprises a passive upper waveguide region and an active lower waveguide region. The III-V semiconductor based waveguide includes two high index guiding layers 2032. The high index guiding layers have a higher index than the surrounding layers 2016. The index of the high index layers are not identical with the upper high index layer (furthest form the substrate) being higher than the lower. IN this way, when the upper waveguide is sufficiently wide the mode is confined in the upper high index wave guiding layer (see e.g. FIG. 23A). However when the upper waveguide is narrow, the light is confined into the lower high-index wave guiding layer.

The lower passive waveguide can be used to extend the mode into the silicon substrate, but also to allow a thicker lower n-doped region of the device coupon. This simplifies the process for fabricating the device coupon. In examples where the device coupon provides a DFB or DBR laser, the upper waveguide region should be suitably narrow. This then lowers the confinement factor for the optical gain, which can benefit or hinder depending on the laser design.

As the upper waveguide region is wider, the mode no longer penetrates into the silicon substrate and so is better confined. This, as discussed above, leads to better mode matching into the adjacent silicon waveguide. This additional flexibility also enables new types of DFB type lasers, where the coupling strength is varied along the length of the laser cavity. For example, a high kappa, high reflectivity DBR mirror could be added to the end of a laser.

In examples where the upper waveguide region is passive (and so the lower waveguide region is active) the n-contact layer should be very thin, so as to ensure coupling into the patterned surface (which may be a grating). Further, if the active layer is the lower waveguide region, the light will be predominantly confined to the upper waveguide region and so the confinement factor in the active waveguide is lower. This is a good semiconductor optical amplifier (SOA) structure.

Figure 23A:
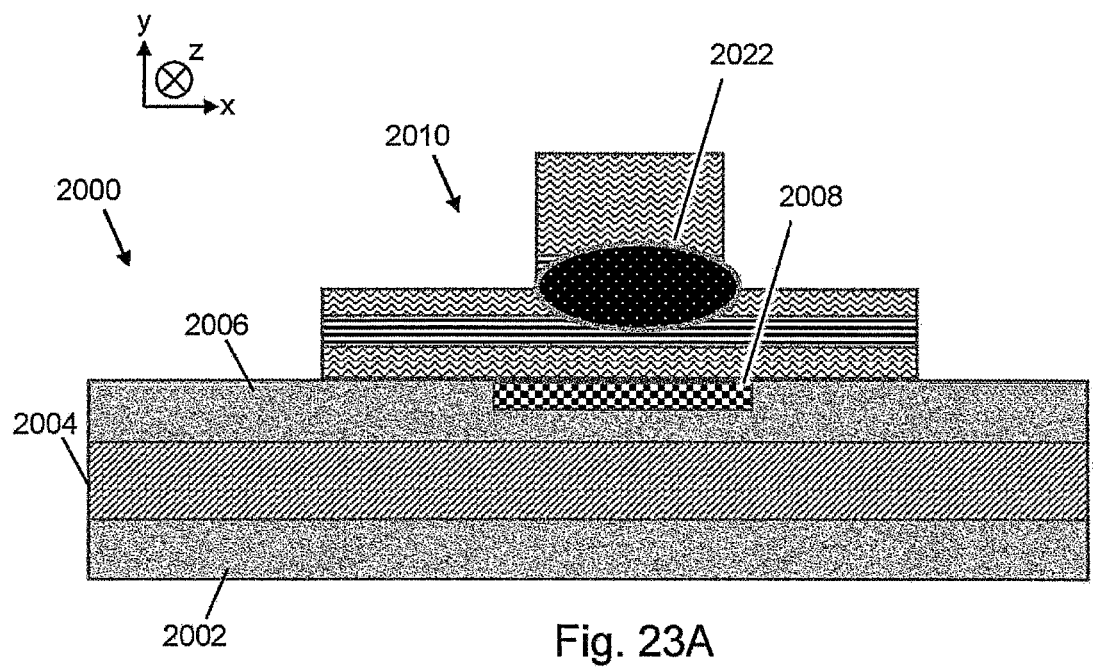
FIGS. 23A and 23B illustrate the optical mode in the variant silicon-on-insulator platform of FIGS. 22A and 22B.
Figure 23B:
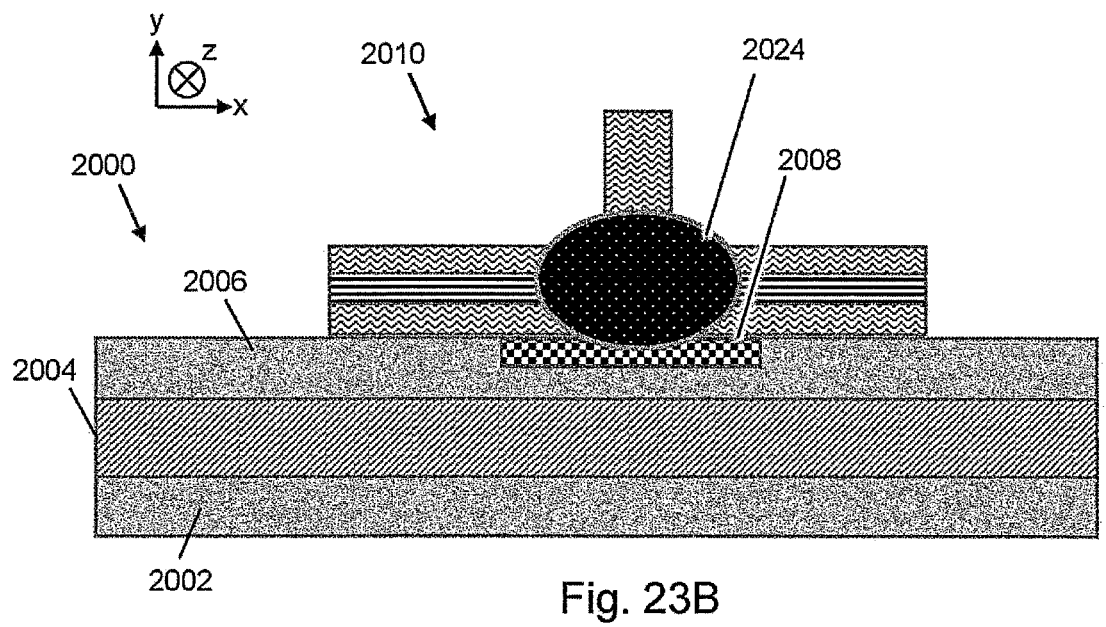

FIGS. 23A and 23B illustrate the optical mode in the variant silicon-on-insulator platform of FIGS. 22A and 22B. As can be see, when the optical signal is located in the wider upper waveguide region, the optical mode is raised from the patterned surface 2008 and so does not interact with it. That is, the optical mode is mostly confined to the upper waveguide and does not penetrate into the host substrate. This can provide the best coupling to a large core silicon waveguide adjacent to the device coupon.

Whereas, as illustrated in FIG. 23B, when the optical signal is located in the narrower upper waveguide region, the optical mode is lowered and so interacts with the patterned surface 2008. The optical mode is mostly confined to the lower waveguide, as well as penetrating into the host substrate.

In examples where a silicon waveguide is coupled to the III-V semiconductor based waveguide, the optical mode in the wider upper waveguide region is aligned with the optical mode supported by the silicon waveguide.

Figure 24A:
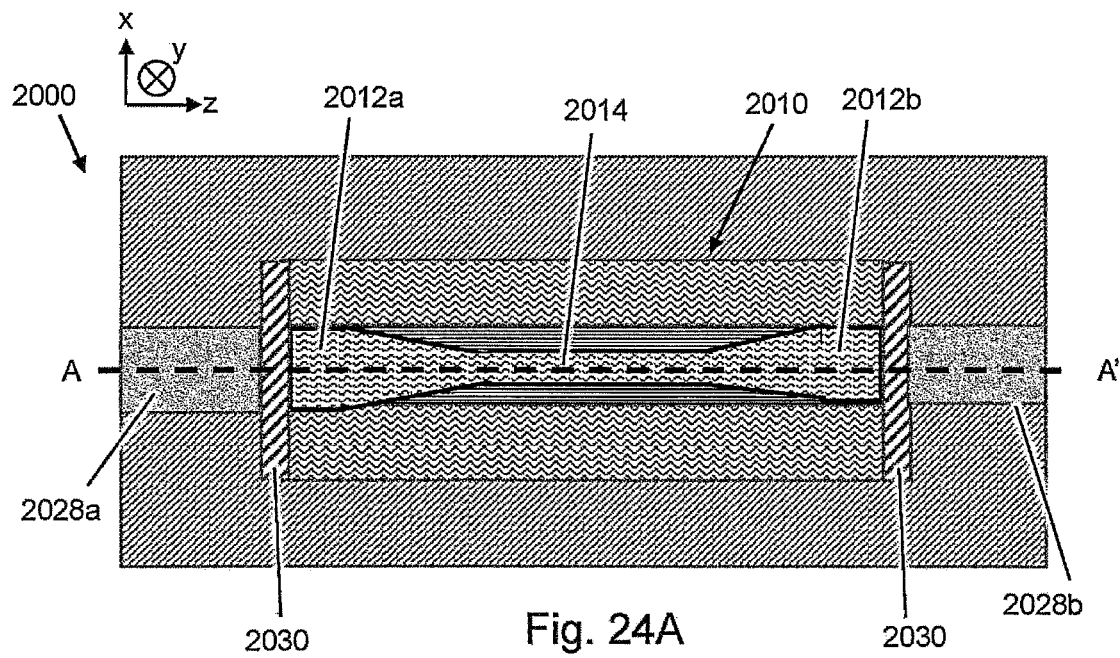
FIGS. 24A and 24B are, respectively, top-down and cross-sectional views of the variant silicon-on-insulator platform of FIGS. 22A and 22B.
Figure 24B:
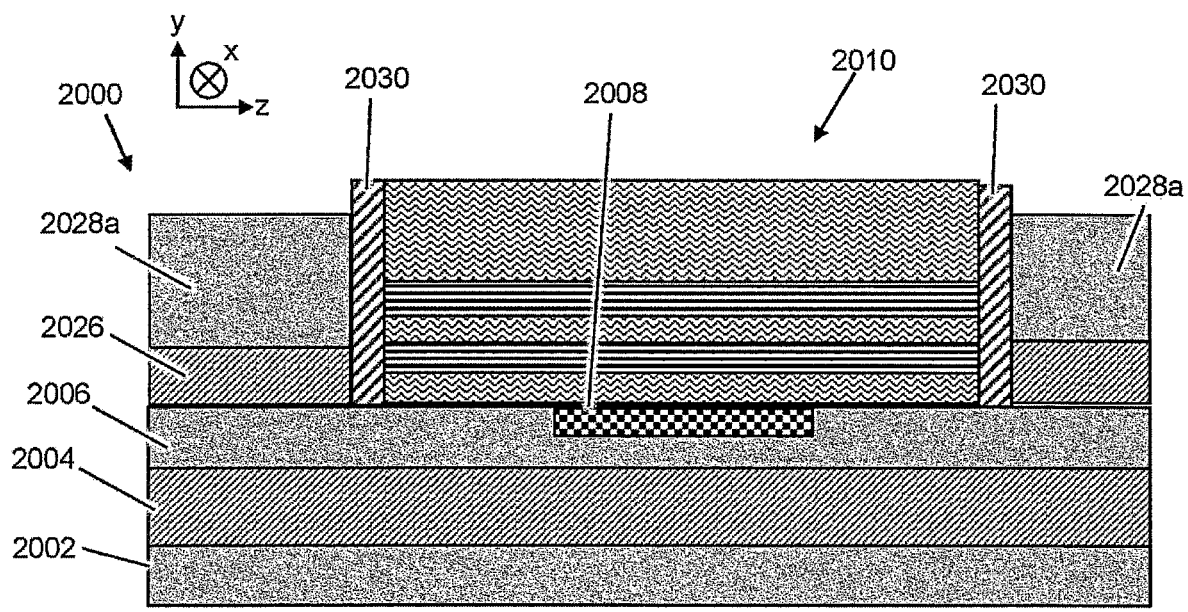
Figure 25A:
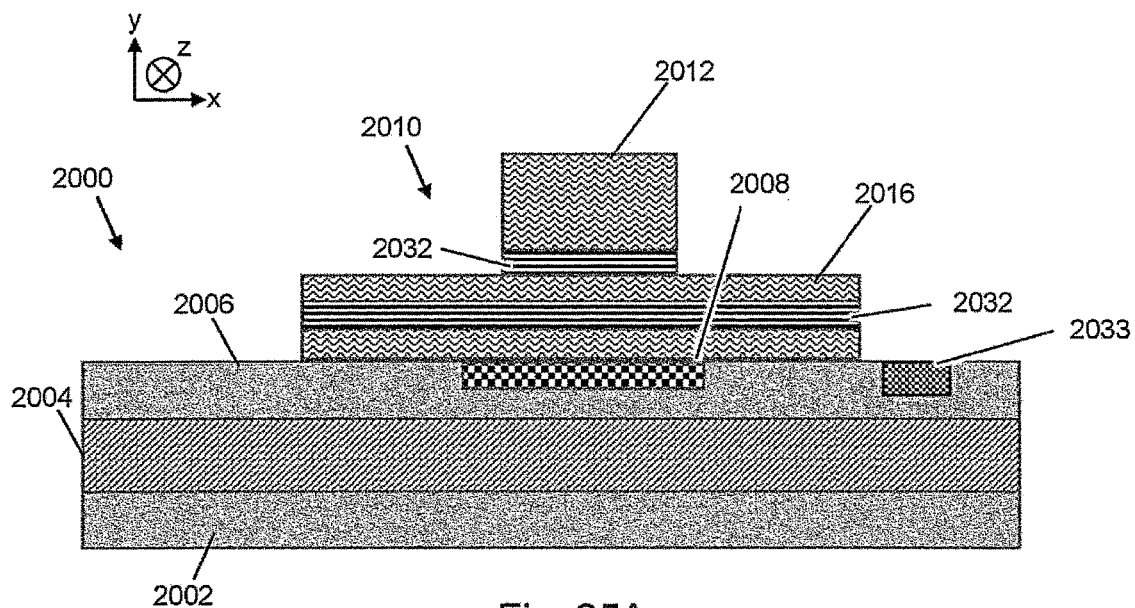
FIGS. 25A and 25B are cross-sectional views (end-on and side-on) of a variant of the silicon-on-insulator platform shown in FIGS. 22A and 22B including PN junction temperature sensors.
Figure 25B:
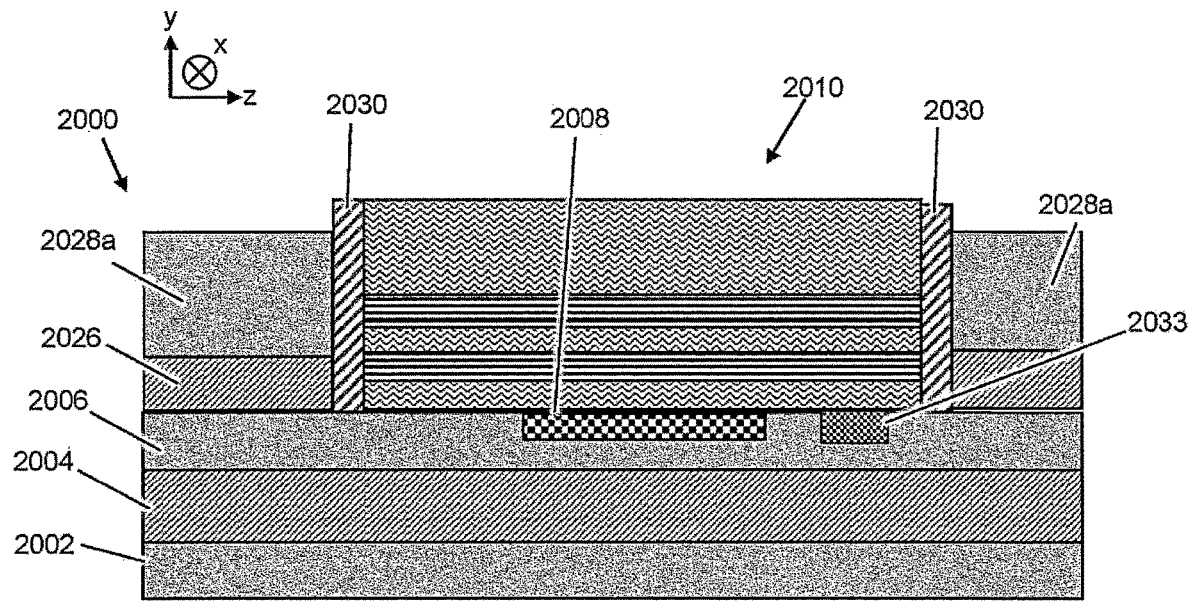

FIGS. 24A and 24B are, respectively, top-down and cross-sectional views of the variant silicon-on-insulator platform of FIGS. 22A and 22B. FIG. 24B is a cross-sectional view along the line A-A' of FIG. 24A. Input silicon waveguide 2028, located in an upper device layer (which is separated from the device layer 2006 by an upper buried oxide layer 2026), is coupled into the III-V semiconductor based waveguide in device coupon 2010 via bridge-waveguide 2030. The bridge-waveguide is formed of one or more anti-reflective coatings (e.g. made from silicon nitride) and a fill, which may be made of a dielectric (e.g. benzocyclobutene) or amorphous silicon. The device coupon 2010, as shown, comprises two first waveguide regions 2012a and 2012b having a first width one at either end of the coupon and a second waveguide region 2014 having a second width which is located in a centre region of the coupon. In some examples, the second width is zero, i.e. the first width tapers to zero, before broadening out to provide the other first waveguide region.

In this example, the waveguide region 2012a adjacent the input silicon waveguide 2028 is passive whilst the waveguide region 2012b is active and forms an electro-absorption modulator. In further examples, both 2012a and 2012b are passive. The second waveguide region 2014 in this example provides a laser waveguide in that the optical mode interacts with a grating 2008 located in the bed of the cavity.

FIGS. 24C and 24D are, respectively, cross-sectional views of the variant silicon-on-insulator platform of FIGS. 22A and 24B, in which silicon PN junctions are made by ion implantation in the SOI layer as temperature sensors 2033 for monitoring the device temperature.

Figure 26A:
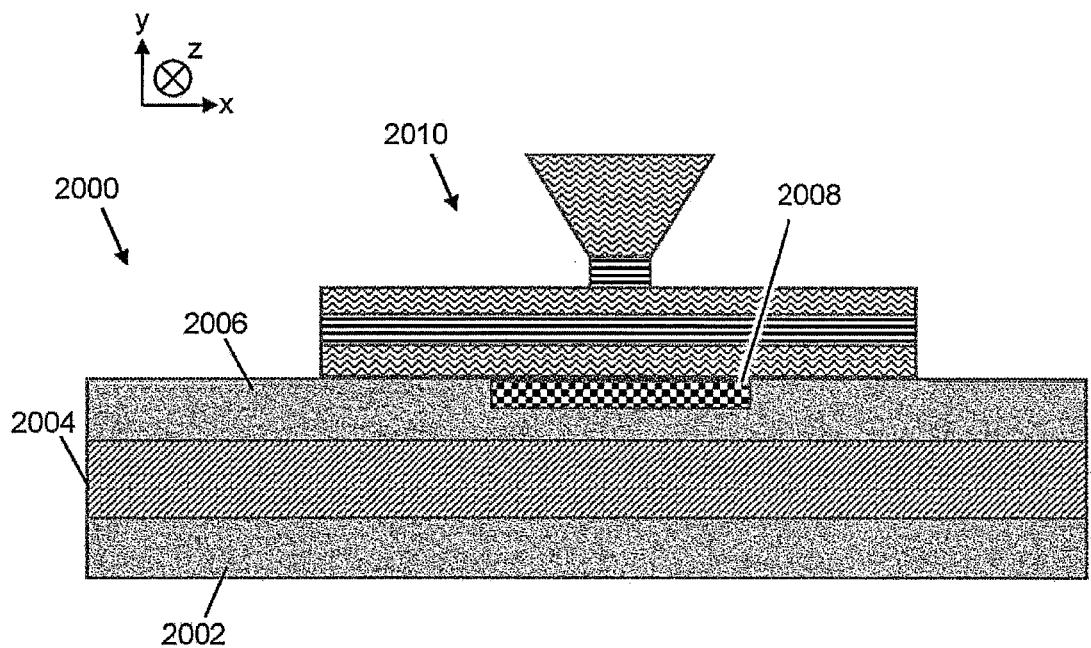
FIGS. 26A and 26B are cross-sectional views (end-on) of a variant of the silicon-on-insulator platform shown in FIGS. 22A and 22B, where the upper waveguide region is an inverted mesa.

FIG. 26A shows an end-on cross-sectional view of a variant of the silicon-on-insulator platform shown in FIGS.

Figure 26B:
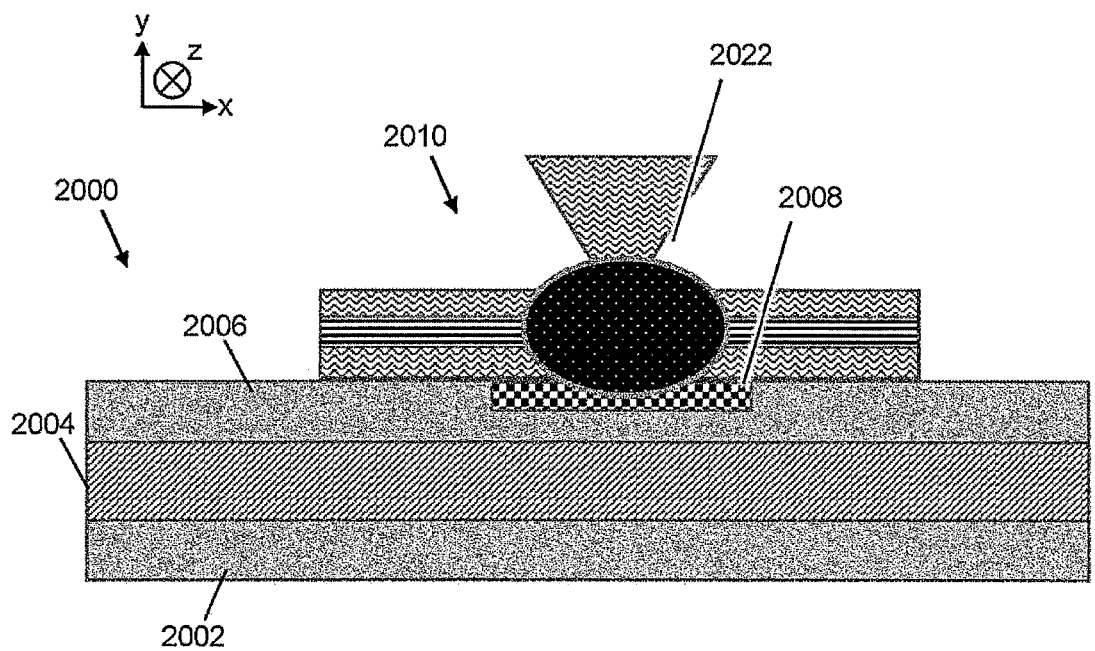

22A and 22B. Here a wet etch is used to form an inverted mesa from the upper waveguide regions. This inverted mesa can help force the optical mode down towards the substrate, as shown in FIG. 26B.

Figure 27A:
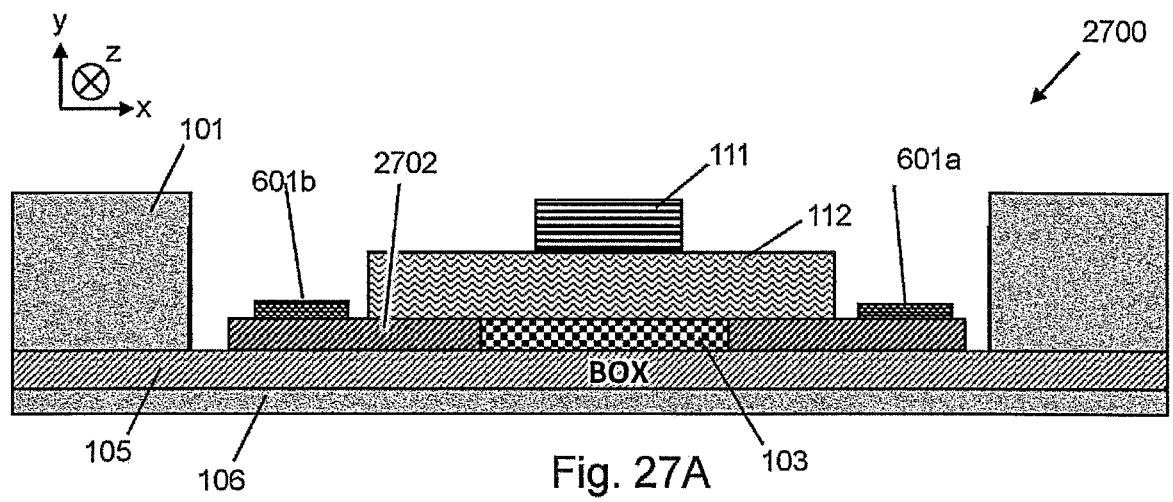
FIGS. 27A and 27B are cross-sectional views (end-on) of a variant of the silicon-on-insulator platforms shown previously, where the patterned surface is formed in a liner.
Figure 27B:
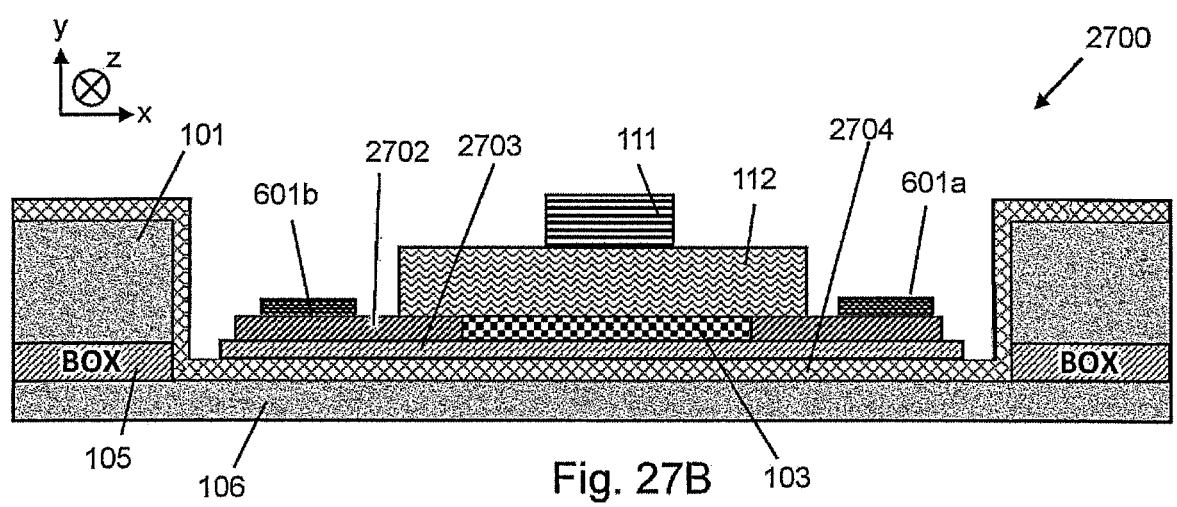

FIGS. 27A and 27B are cross-sectional views (end-on) of a variant silicon-on-insulator platform 2700, where the patterned surface is formed in a liner. Where they share features with previous embodiments, like features are indicated by like reference numerals. In contrast to the platform 600 shown in FIG. 7A, the platform 2700 includes a liner 2702 which lines the bed of the cavity with BOX layer exposed. The patterned surface 103 is formed in the liner which comprises high index silicon nitride whose index is 3.2+/−0.1 with a thickness of 250 nm+/−100 nm. The patterned surface 103 may be a Bragg grating, and heaters 601a/b may also be provided on top of the liner. FIG. 27B shows a variant of the platform 2700 in which the liner comprises three layers of dielectric thin films 2702, 2703 and 2704, and is deposited in the cavity with SOI and BOX layers removed (silicon substrate is exposed). Dielectric thin film 2702 is high index silicon nitride whose index is 3.2+/−0.1 with thickness of 250 nm+/−100 nm. Film 2703 is regular silicon oxide with thickness of 220 nm+/−100 nm, and film 2704 is silicon nitride whose index is 2.28+/−0.05 with thickness of 180 nm+/−100 nm. Silicon nitride 2704 extends up the sidewall of the cavity to serve as anti-reflection coating layer for the cavity facet. Silicon nitride 2704 further extends along an upper surface of the silicon device layer 101. The patterned surface 103 is formed in high index silicon nitride thin film layer 2702, and the patterned surface may be a Bragg grating. The total thickness of 2703 and 2704 is equal to or substantially equal to the thickness of BOX layer of the SOI platform. In other words, the top surface of 2703 levels with the top surface of BOX layer. Whilst the embodiments shown in FIGS. 27A and 27B include heaters, it will be appreciated that the liner can be applied to all embodiments shown therein (for example, to embodiments in which no heater is provided, or to embodiments in which a thermally isolating cavity is provided).

Figure 28B:
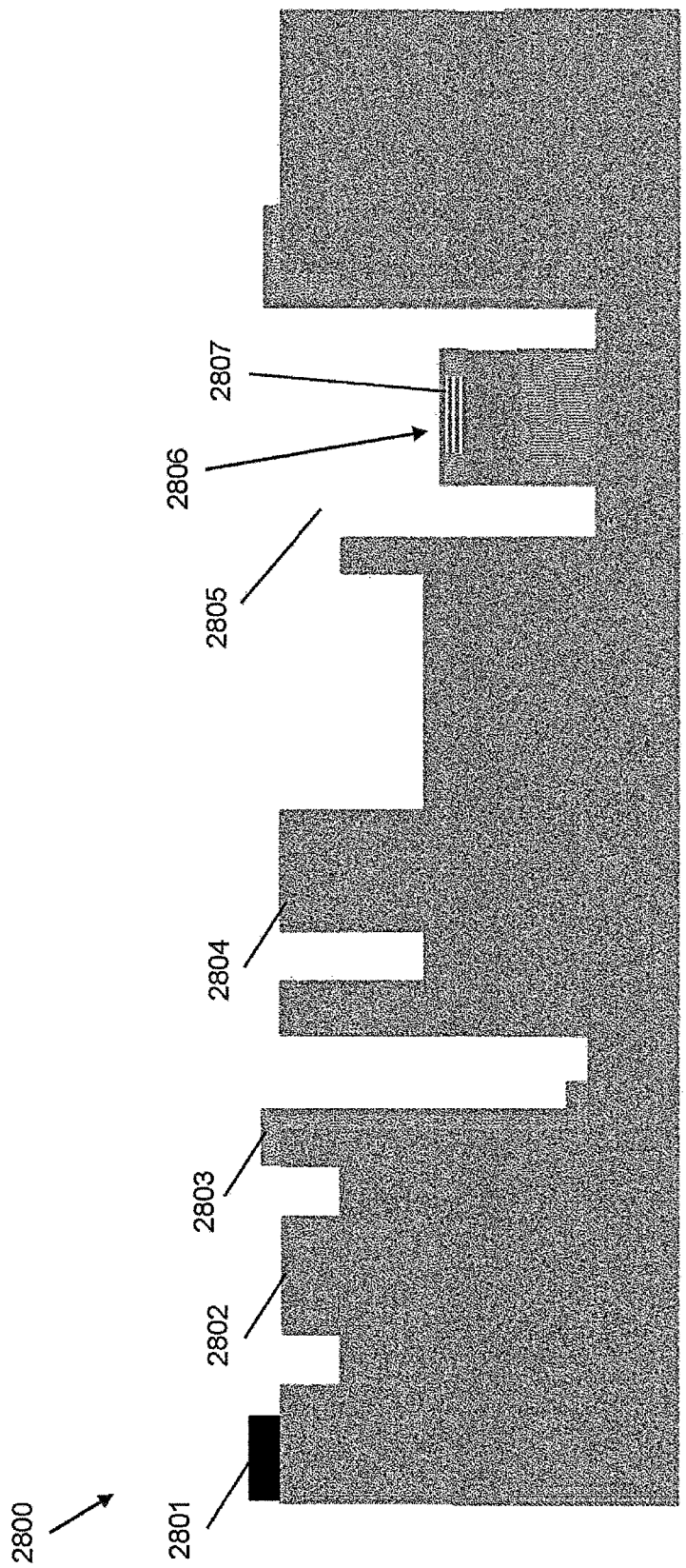
Figure 28C:
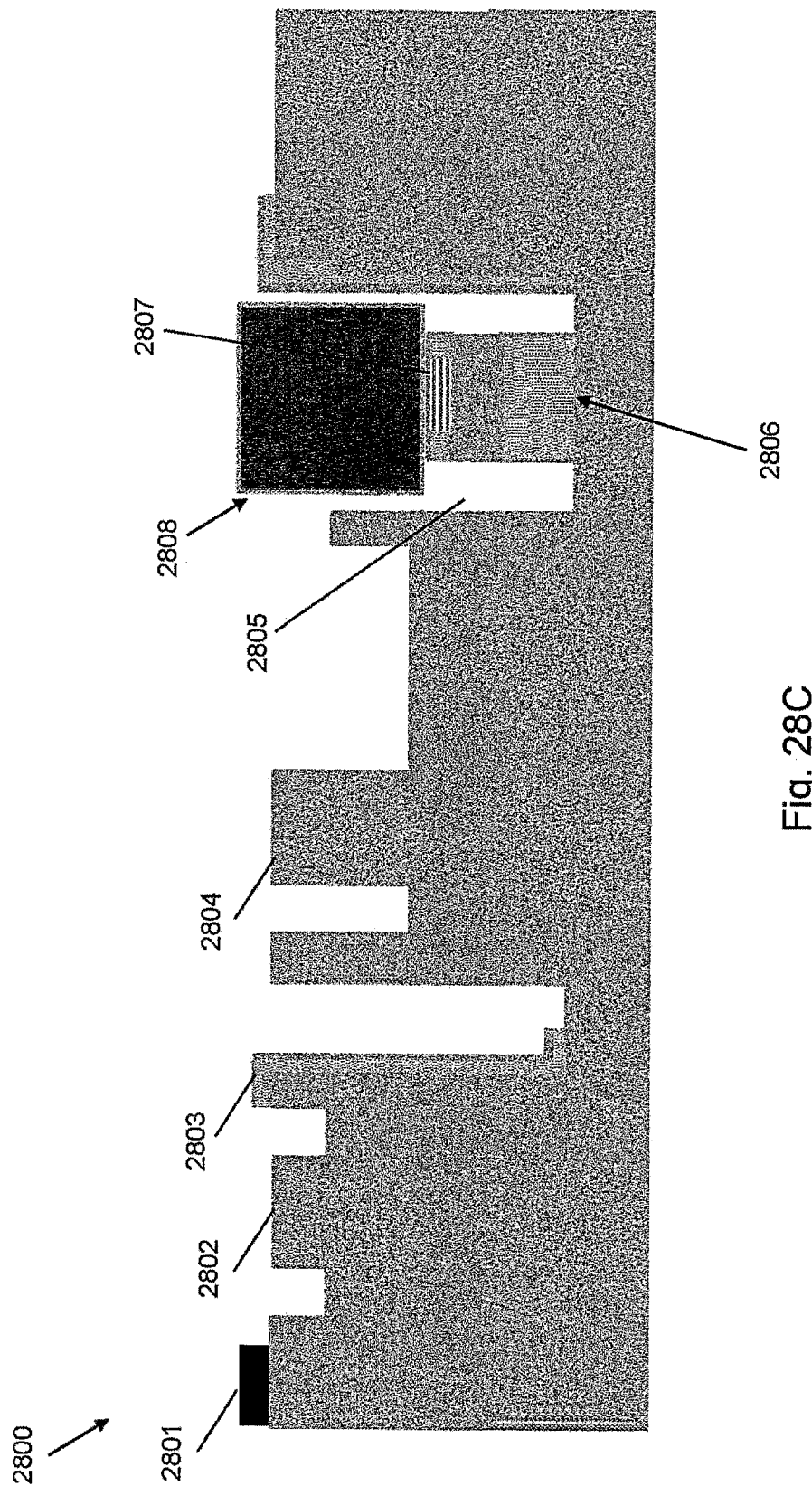

FIGS. 28A-28C are cross-sectional views of a variant method resulting in a variant silicon-on-insulator platform 2800 being integrated with a III-V device coupon 2807. As shown in FIG. 28A, a silicon-on-insulator platform 2800 is provided. The silicon-on-insulator platform 2800 includes: a micro-transfer printing mark 2801, e.g. to aid alignment during MTP processes; a waveguide rib 2802; an input/output facet 2803; a waveguide strip 2804; and a MTP cavity (which may include a T-bar facet). Next, in a step shown in FIG. 28B, an intermediate structure 2806 is deposited within the cavity. The intermediate structure includes a patterned surface 2807 of the type discussed previously. In this example, the intermediate structure is a silicon-on-insulator chip including a base silicon layer, an insulator layer, and an upper silicon layer. The patterned surface is within the upper silicon layer. In other examples, the intermediate structure may be bulk silicon or another material. Once the intermediate structure is deposited into the cavity, a III-V device coupon 2808 is deposited on top of the intermediate structure as shown in FIG. 28C. For example, the III-V device coupon may be a laser which is deposited onto and bonded to the intermediate structure. The resulting device functions in the same way as those discussed above.

Figure 29A:
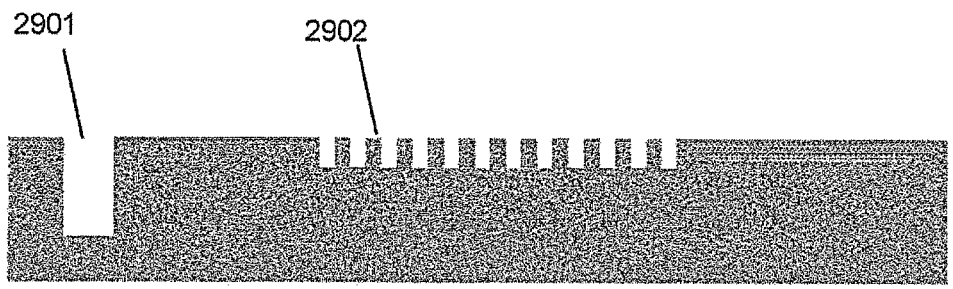
FIGS. 29A-29F are cross-sectional views of a method of preparing a silicon-on-insulator platform.
Figure 29B:
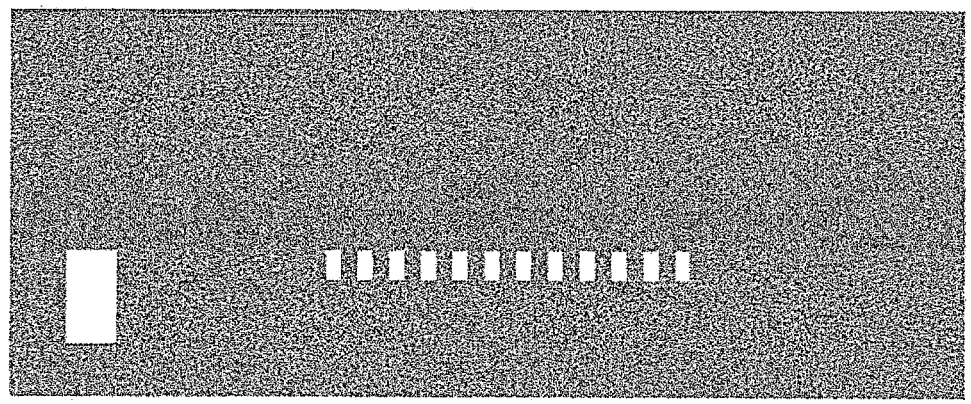
Figure 29C:
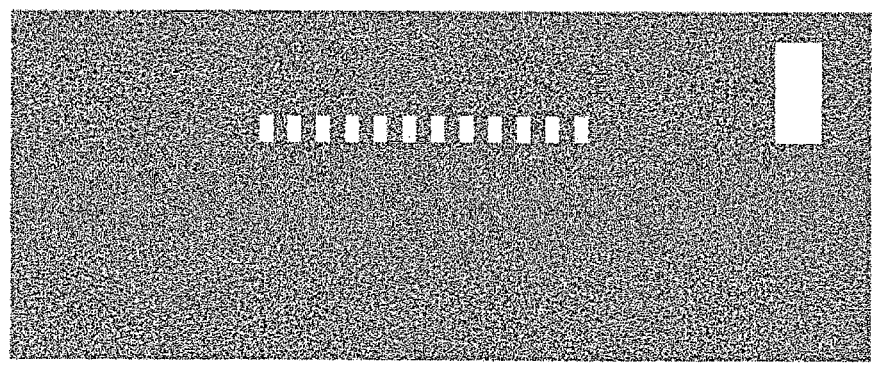
Figure 29D:
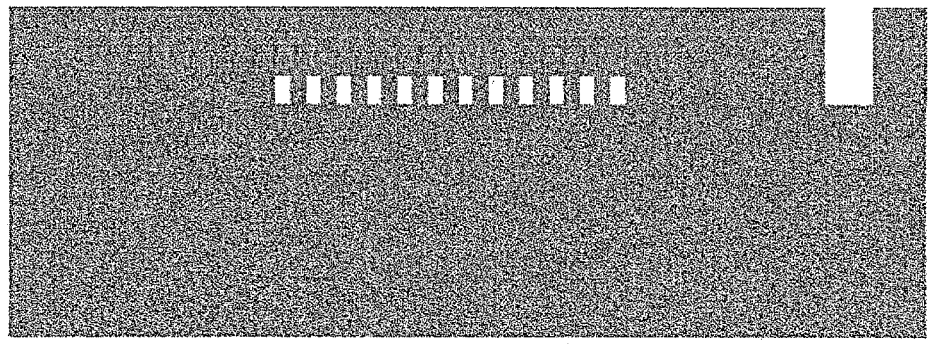
Figure 29E:
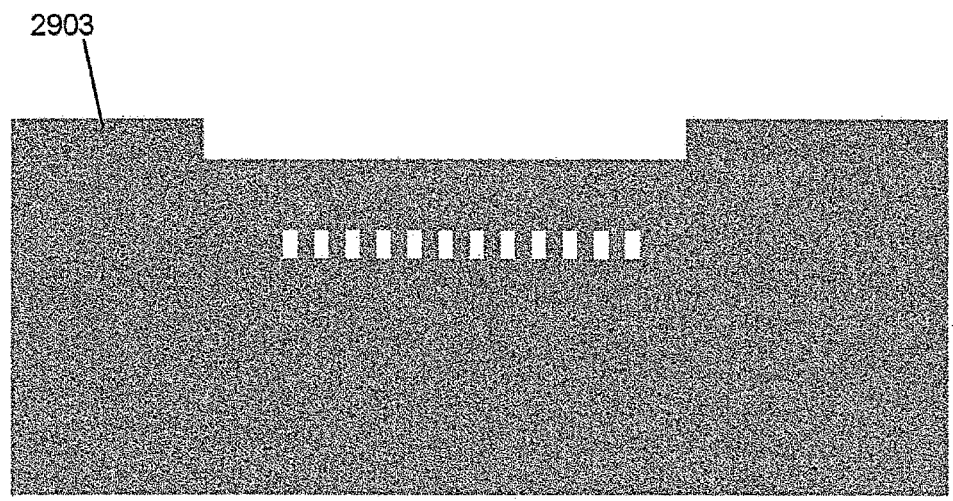
Figure 29F:
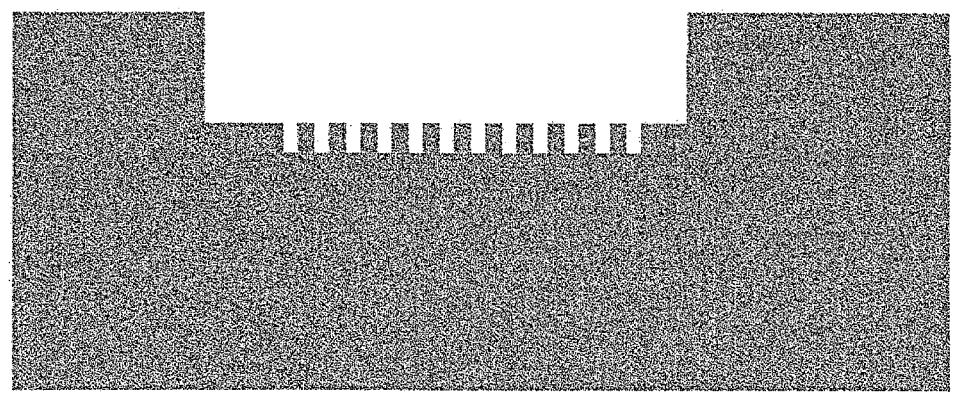

FIGS. 29A-29F are cross-sectional views of a method of preparing a silicon-on-insulator platform. A planar silicon substrate is provided, as shown in FIG. 29A. An alignment mark 2901 and patterned surface 2902 (in this example a grating) are etched into the planar silicon substrate. Next, a handle layer is bonded to the upper surface of the planar silicon substrate as shown in FIG. 29B. The resulting wafer is then flipped with the result of this being shown in FIG. 29C. After this, the handle layer is thinned (for example, by grinding or polishing) with a structure as shown in FIG. 29D as the result. After this, a cavity oxide 2903 is provided and an opening made in it to define the extent of the cavity. This is shown in FIG. 29. This allows the cavity to be etched which reveals the grating, as shown in FIG. 29F.

Figure 30A:
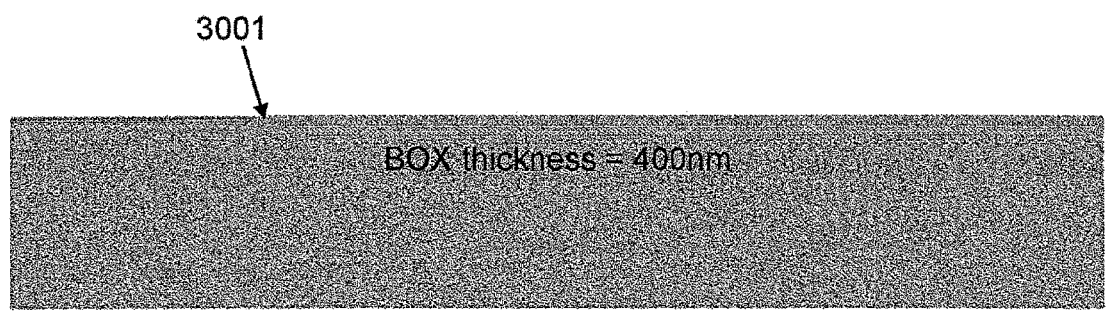
FIGS. 30A-30G are cross-sectional views of a method of preparing the silicon-on-insulator platform prior to the method of FIGS. 29A-29F.
Figure 30B:
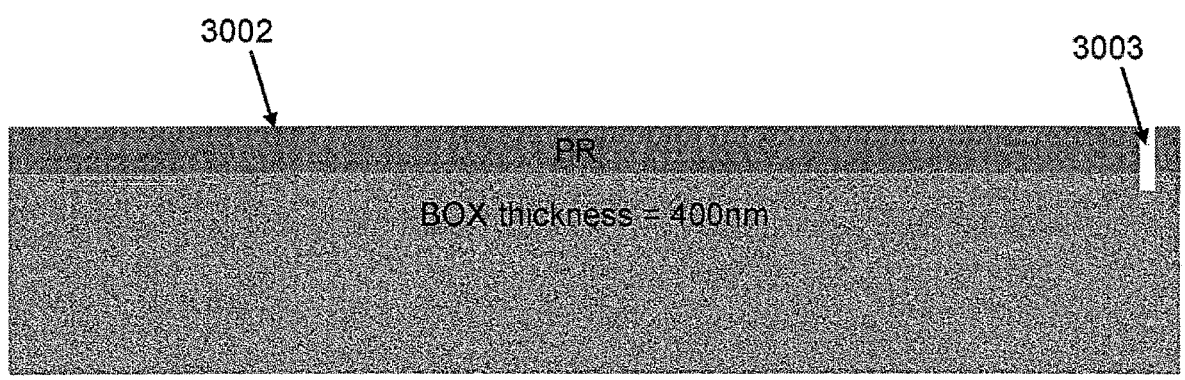
Figure 30C:
Figure 30D:
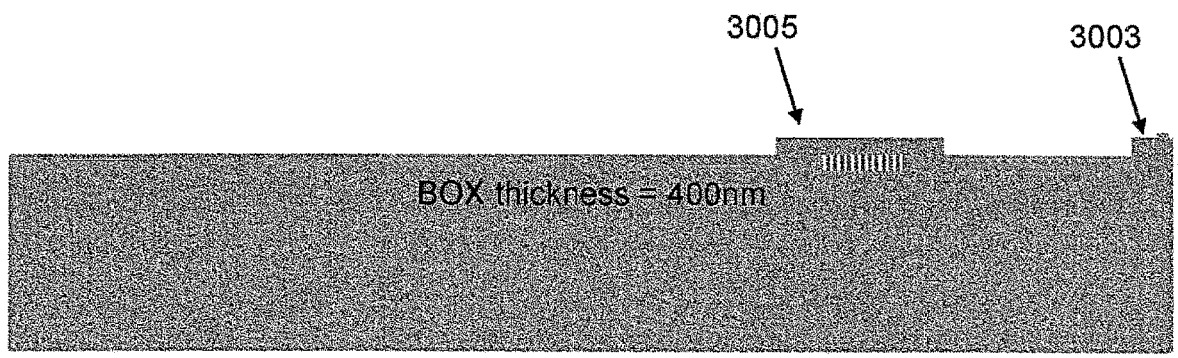
Figure 30E:
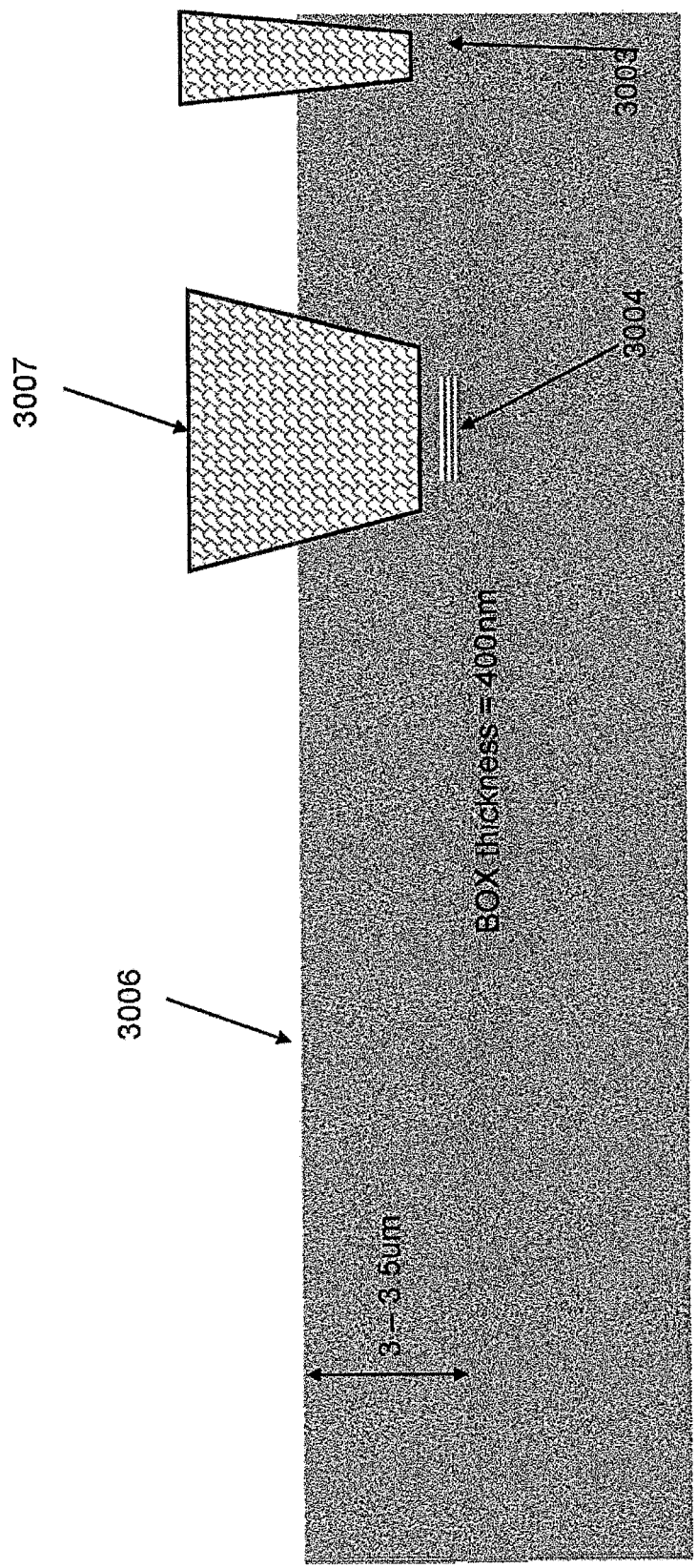
Figure 30F:
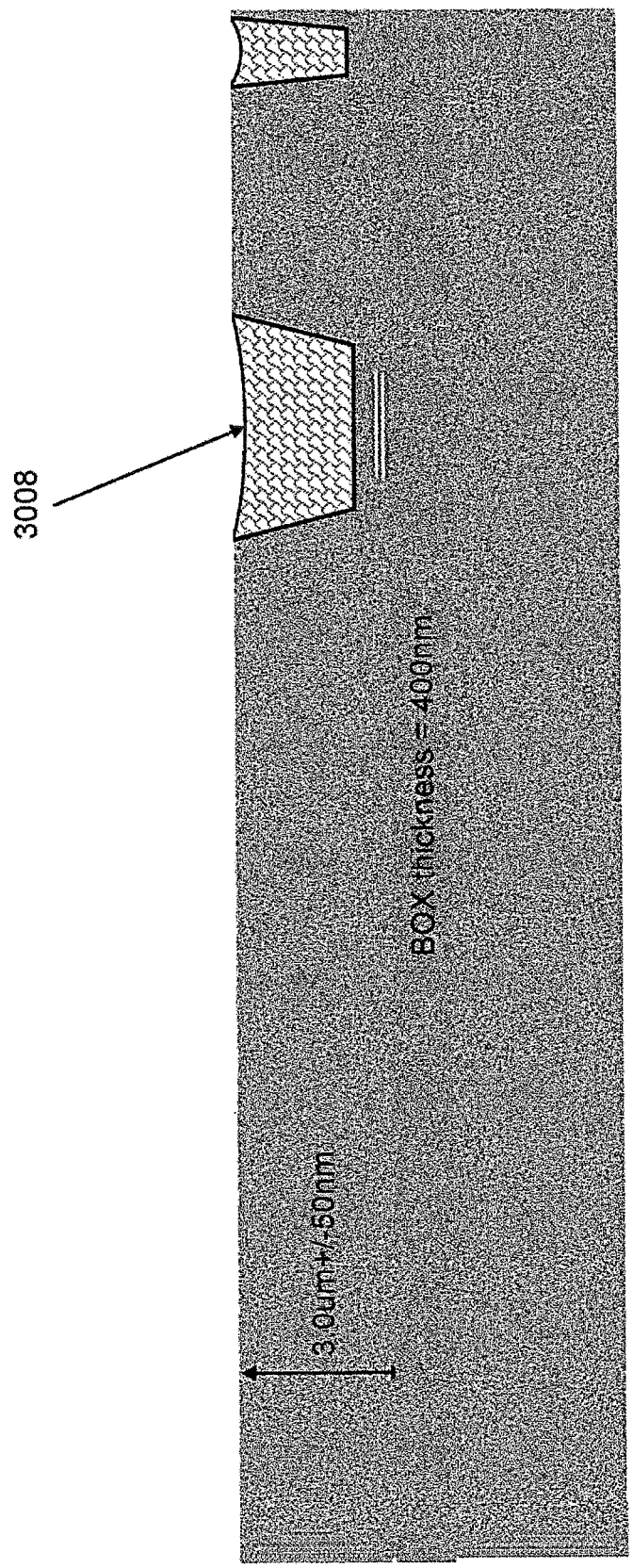
Figure 30G:
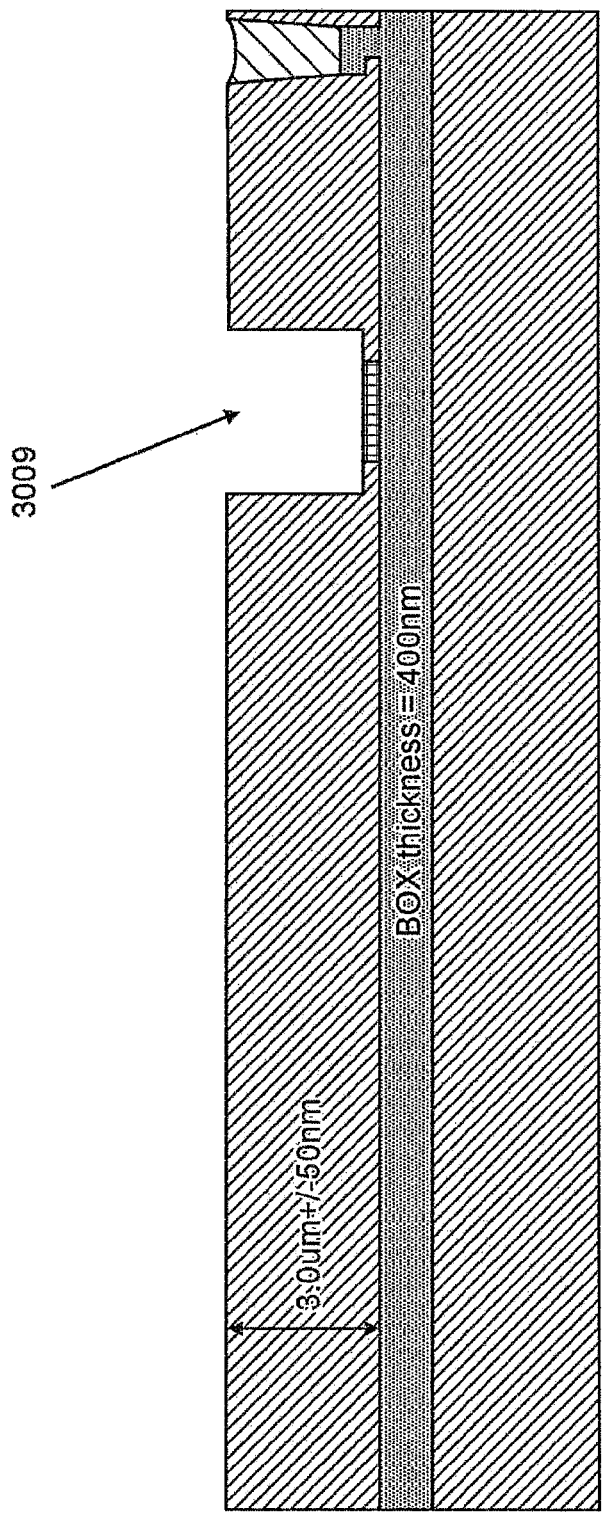

FIGS. 30A-30F are cross-sectional views of a method of preparing the silicon-on-insulator platform prior to the method of FIGS. 29A-29F. In a first step, shown in FIG. 30A, an SOI wafer is provided including a 130 nm silicon-on-insulator layer 3001 is provided on top of a BOX layer. Next, alignment marks 3003 are made for subsequent processing using a photo resist 3002. The result of this is shown in FIG. 30B. The grating 3004 is then etched into the SOI layer 3001 as shown in FIG. 30C. Advantageously, the grating can be made in a thin SOI layer whose thickness, uniformity, and tolerance can be strictly controlled (e.g. to within <10 nm). The grating can be performed by optical lithography, which is suitable for volume production. Next, in a step shown in FIG. 30D, the grating 3004 and alignment marks 3003 are covered with silicon oxide 3005 for blanket silicon epitaxial growth on the SOI layer. In subsequent step, shown in FIG. 30E, epitaxial silicon 3006 is grown to a thickness of at least 3.0 μm and no more than 3.5 μm. Meanwhile poly-silicon 3007 is grown on the silicon oxide that covers grating 3004 and alignment mark 3003. Usually the poly-silicon has a higher epitaxial growth rate. After this, in a step shown in FIG. 30F, a chemical-mechanical polishing process is performed to remove the poly-silicon and make the surface flat. Some CMP dish 3008 may be present, but is tolerable in these applications. Finally, the poly-silicon and silicon oxide are etched away to form a cavity 3009 and expose the grating. The polysilicon in the alignment mark may be etched away in some examples.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

| List of Features | | | |
| --- | --- | --- | --- |
| 100 | SOI Platform | 1220 | SOI Platform |
| 101 | Silicon device layer | 1240 | SOI platform |
| 102 | Cavity | 1600 | SOI Platform |
| 103 | Patterned surface | 1601, 1701 | Optical mode |
| 104 | Silicon waveguide | 2000 | SOI platform |
| 105 | Buried oxide layer | 2002 | Si substrate |
| 106 | Silicon substrate | 2004 | Buried oxide |

-continued

List of Features

| | | | |
|---|---|---|---|
| 107 | Heater | 2006 | Silicon device layer |
| 110 | Device Coupon | 2008 | Patterned surface |
| 111 | Waveguide rib | 2010 | Device coupon |
| 112 | Waveguide slab | 2012 | First upper waveguide region |
| 113 | Porous silicon region | 2014 | Second upper waveguide region |
| 200 | Thermally isolating trench | 2016 | Lower waveguide region |
| 300, 450 | Optical mode | 2022 | Optical mode |
| 400, 600 | SOI Platform | 2024 | Optical mode |
| 601a/b | Heater | 2030 | Bridge waveguide |
| 602 | Positive electrode | 2032 | High index guiding layer |
| 603 | Negative electrode | 2033 | PN junction temperature sensor |
| 710, 720 | SOI platform | 2702 | High index silicon nitride |
| 701a/b | Heater | 2703 | Silicon oxide |
| 702a/b | Heater | 2704 | Silicon nitride |
| 800 | SOI platform | 2800 | SOI Platform |
| 801a/b | Silicon heat sink | 2801 | MTP mark |
| 1000 | SOI platform | 2802 | WG rib |
| 1001 | Grating phase shift | 2803 | I/O Facet |
| 1100 | SOI platform | 2804 | WG Strip |
| 1101 | BCB layer | 2805 | MTP Cavity |
| 1102 | Patterned surface | 2806 | Intermediate structure |
| 1103a/b | Low refractive index region | 2807 | Patterned surface |
| 1104 | High index region | 2808 | Device coupon |
| 1200 | SOI Platform | 2901 | Alignment mark |
| 1301 | Coupon waveguide rib | 2902 | Patterned surface |
| 1401, 1402 | Optical mode | 2903 | Cavity oxide |

The invention claimed is:

1. An optoelectronic device, comprising:
a silicon-on-insulator platform, including a silicon waveguide formed in a silicon device layer, a silicon substrate, and a cavity; and
a III-V semiconductor based device, located within the cavity of the silicon-on-insulator platform and containing a III-V semiconductor based waveguide which is optically coupled to the silicon waveguide,
wherein a region of a bed of the cavity, located between the III-V semiconductor based device and the silicon substrate, includes a patterned surface, which is configured to interact with an optical signal within the III-V semiconductor based waveguide of the III-V semiconductor based device, and
wherein:
the patterned surface is a Bragg grating;
the patterned surface is a grating, and the grating and the III-V semiconductor based device form a distributed feedback or distributed Bragg reflector laser;
the patterned surface is a reflective pattern, so as to confine an optical mode of the III-V semiconductor based waveguide to the III-V semiconductor based waveguide; or
the patterned surface is a wave-guiding pattern.

2. The optoelectronic device of claim 1, wherein the patterned surface is formed within one of: the silicon device layer, which forms the bed of the cavity; the silicon substrate, which forms the bed of the cavity; or a liner, which lines the bed of the cavity.

3. The optoelectronic device of claim 2, wherein the patterned surface is formed within the liner, and wherein;
the liner is high index silicon nitride; or
the liner comprises three dielectric thin film layers in which a first bottom layer is silicon nitride, a middle second layer is silicon oxide, and a third top layer is high index silicon nitride in which the patterned surface is formed.

4. The optoelectronic device of claim 3, wherein the total thickness of the first bottom layer of silicon nitride and the middle second layer of silicon oxide is equal to or substantially equal to the thickness of a BOX layer of the silicon-on-insulator platform.

5. The optoelectronic device of claim 3, wherein the high index silicon nitride has a refractive index of 3.2+/−0.1 and thickness of 250 nm+/−100 nm.

6. An optoelectronic device, comprising:
a silicon-on-insulator platform, including a silicon waveguide formed in a silicon device layer, a silicon substrate, and a cavity; and
a III-V semiconductor based device, located within the cavity of the silicon-on-insulator platform and containing a III-V semiconductor based waveguide which is optically coupled to the silicon waveguide,
wherein a region of a bed of the cavity, located between the III-V semiconductor based device and the silicon substrate, includes a patterned surface, which is configured to interact with an optical signal within the III-V semiconductor based waveguide of the III-V semiconductor based device, and
wherein the region of the bed of the cavity includes an intermediate structure, and wherein the patterned surface is provided on the intermediate structure.

7. The optoelectronic device of claim 6, wherein the intermediate structure projects from the region of the bed of the cavity, with the patterned surface contained in a surface distal from the bed of the cavity.

8. The optoelectronic device of claim 6 wherein the intermediate structure is a silicon-on-insulator chip which is bonded to the bed of the cavity.

9. The optoelectronic device of claim 1, wherein the patterned surface is the Bragg grating.

10. An optoelectronic device, comprising:
a silicon-on-insulator platform, including a silicon waveguide formed in a silicon device layer, a silicon substrate, and a cavity; and
a III-V semiconductor based device, located within the cavity of the silicon-on-insulator platform and containing a III-V semiconductor based waveguide which is optically coupled to the silicon waveguide, wherein a region of a bed of the cavity, located between the III-V semiconductor based device and the silicon substrate, includes a patterned surface, which is configured to interact with an optical signal within the III-V semiconductor based waveguide of the III-V semiconductor based device, and wherein the bed of the cavity is formed of a dielectric, and the patterned surface is formed within the dielectric.

11. The optoelectronic device of claim 10, wherein the dielectric is benzocyclobutene.

12. The optoelectronic device of claim 1, further comprising one or more heaters, located within or on the bed of the cavity, and configured to tune an operating wavelength of the optoelectronic device.

13. The optoelectronic device of claim 12, wherein:
a heater of the one or more heaters is a doped region of the bed of the cavity; or
the heater is a metal strip disposed on the bed of the cavity.

14. The optoelectronic device of claim 1, wherein the patterned surface is the grating, and the grating and the III-V semiconductor based device form the distributed feedback or distributed Bragg reflector laser.

15. The optoelectronic device of claim 14, wherein:
the grating is a partial grating which extends only part way along the III-V semiconductor based device; or
the patterned surface comprises a first grating and a second grating region, spaced in a guiding direction of the III-V semiconductor based waveguide by a non-grating region.

16. The optoelectronic device of claim 1, wherein the patterned surface is the reflective pattern, so as to confine the optical mode of the III-V semiconductor based waveguide to the III-V semiconductor based waveguide.

17. The optoelectronic device of claim 1, wherein the patterned surface is the wave-guiding pattern.

18. The optoelectronic device of claim 17, wherein the III-V semiconductor based waveguide is wider at one end than a width in a central region of the III-V semiconductor based waveguide, such that an optical signal carried by the III-V semiconductor based waveguide towards the end of said waveguide is guided by the wave-guiding pattern.

19. A method of preparing the optoelectronic device of claim 1, wherein the method comprises the step of:
etching the patterned surface into the region of the bed of the cavity.

* * * * *